United States Patent [19]

Morton

[11] Patent Number: 4,835,729

[45] Date of Patent: May 30, 1989

[54] SINGLE INSTRUCTION MULTIPLE DATA (SIMD) CELLULAR ARRAY PROCESSING APPARATUS WITH ON-BOARD RAM AND ADDRESS GENERATOR APPARATUS

[75] Inventor: Steven G. Morton, Oxford, Conn.

[73] Assignee: Alcatel USA, Corp., New York, N.Y.

[21] Appl. No.: 808,314

[22] Filed: Dec. 12, 1985

[51] Int. Cl.[4] .............................................. G06F 12/02
[52] U.S. Cl. ................................ 364/200; 364/243.1; 364/231.9
[58] Field of Search ........................ 364/200 MS File

[56] References Cited

U.S. PATENT DOCUMENTS

| 4,276,595 | 6/1981 | Brereton et al. | 364/200 |
| 4,309,691 | 1/1982 | Castleman | 364/200 |
| 4,481,580 | 11/1984 | Martin et al. | 364/200 |
| 4,507,748 | 3/1985 | Cotton | 364/749 |
| 4,524,428 | 6/1985 | Grinberg et al. | 364/900 |
| 4,580,215 | 4/1986 | Morton | 364/200 |
| 4,593,351 | 6/1986 | Hong et al. | 364/200 |

FOREIGN PATENT DOCUMENTS 1377859 12/1974 United Kingdom .

OTHER PUBLICATIONS

B. Parkami et al., "A Study of Fault Tolerance Techniques for Associative Processors", National Computer Conference 1974, pp. 642–652.

T. Kondo et al., "An LSI Adaptive Array Processor", IEEE Journal of Solid State Circuits, Apr. 1983, pp. 147–155.

K. E. Batcher, "Design of a Massively Parallel Processor", IEEE Computer Society, 1980, pp. 80–85.

Cl Wu, "Multiprocessing Technology", IEEE Computer, Jun. 1985, pp. 6–7.

E. J. Lerner, "Parallel Processing Gets Down to Business", High Technology, Jul. 1985, pp. 20–28.

Primary Examiner—Gareth D. Shaw
Assistant Examiner—Maria Napiorkowski
Attorney, Agent, or Firm—Peter C. Van Der Sluys

[57] ABSTRACT

In a cellular array processor at least two of the plurality of processors in a row cooperate together as an address generator so that large amounts of memory external to the array chip may be addressed and in addition so that an address may be generated onboard for use by the DRAM memory associated with each processor. Based on this structure, a memory with an internal organization that is 256-bits wide may be connected to 16 16-bit processors which would require 256 bits of data. In so doing, a vast number of pins are saved, that is 256 bits of data out of the memory and 256 bits of data into the processing cells by combining the processing cells and memory on the same chip. It is significant that exactly one design of a processing cell may provide both a data processing element and an address processing element. In this way, these cells are interchangeable to maximize the yield and reliability of the device. A single address from the address generator addresses the entire onboard DRAM so as to use the number of address generators required and to reduce the amount of address decode logic required as well as minimizing power dissipation in the DRAM portion of the chip.

12 Claims, 92 Drawing Sheets

PIN SUMMARY

| SIGNAL | PINS | USAGE | NOTES |
|---|---|---|---|
| HS (HIGH SPEED) I/O | | | |
| DATA | 8 | I/O | 2 OR 4 LEVELS |
| CLK | 1 | IN | |
| MODE | 1 | IN | 4 LEVELS |
| INSTR. | | | |
|   BUFFER SELECT | 1 | IN | |
|   READ / WRITE | 1 | IN | |
|   VIRTUAL CELL SELECT | 4 | IN | |
|   STROBE | 1 | IN | FOR BUSSING CHIP |
| | 17 | | |
| 2. X/Y BUS | | | |
| INSTRUCTION / DATA | 32 | I/O | 2 OR 4 LEVELS |
| 3. I/Z BUS | | | |
| DATA | 32 | I/O | 2 OR 4 LEVELS |
| 4. MEMORY CONTROL | | | |
| MODE | 2 | IN | WRITE/READ/REFRESH/ LOAD ADDRESS |
| STROBE | 1 | IN | |
| | 3 | | |
| 5. PROGRAM I/O | | | |
| LEFT | 4 | I/O | |
| RIGHT | 4 | I/O | |
| | 8 | | |
| 6. MISCELLANEOUS | | | |
| POWER | 7 | IN | 2-GND, 1-VEE, 1-VDD, 2-VCC, 1-VBB |
| EXT. ALU CLK. | 1 | IN | |
| BUS CONFIGURATION | 1 | IN | 4 LEVELS |
| TEST | 1 | OUT | ALSO PARITY ERROR |
| RESET | 1 | IN | |
| CHIP ACTIVE | 1 | OUT | |
| CHIP SELECT | 1 | IN | |
| | 13 | | |
| TOTAL | 105 | | |

FIG. 4

INSTRUCTION BUS BIT SUMMARY

| NAME | BITS | NOTES |
|---|---|---|
| 1. READ ADDRESS (RA)<br>   also: PHYSICAL CELL SELECT - 5<br>   also: VIRTUAL CELL SELECT - 4 | 5 | |
| 2. READ / WRITE ADDRESS (RWA) | 5 | |
| 3. PROCESSOR ENABLE<br>   CONDITION SELECT - 4<br>   VIE OVERRIDE - 1 | 5 | |
| 4. SERIAL INPUT SELECT | 2 | |
| 5. OP CODE<br>   DATA PATH - 6<br>   ADDRESS / DATA SELECT - 1 | 7 | |
| 6. EXTERNAL BUS INTERFACE CONTROL | 3 | |
| 7. LOGIC CELL BUS INTF. CONTROL | 4 | |
| 8. SPARE | 1 | |
| | 32 | |

FIG. 5

1. 16 ELEMENTARY BOOLEAN FUNCTIONS OF TWO VARIABLES

2. FIXED POINT
    MULTIPLY STEP
    DIVIDE STEP

3. FLOATING POINT
    MULTIPLY STEP
    DIVIDE STEP
    NORMALIZE STEP
    DENORMALIZE STEP
    PACK
    UNPACK

4. SHIFT/ROTATE

5. CONFIGURATION

FIG. 6

A. CONVENTIONAL INTERCONNECT
(2*3-STATE)
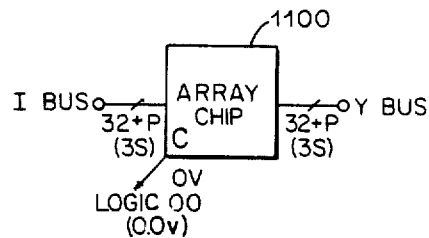
B. MEDIUM INTERCONNECT A
(1*3-STATE, 2*5 STATE)
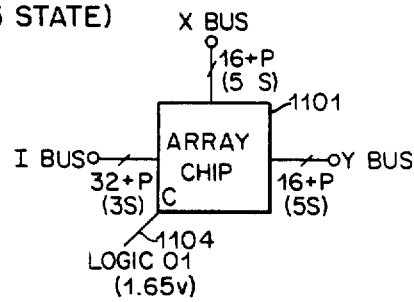
C. MEDIUM INTERCONNECT B
(1*3-STATE, 2*5 STATE)
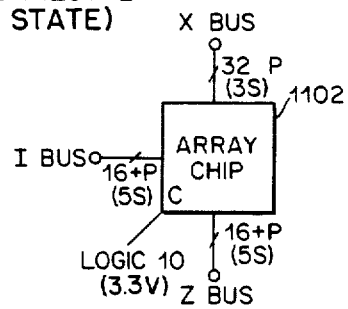
D. MAXIMUM INTERCONNECT
(4*5-STATE)
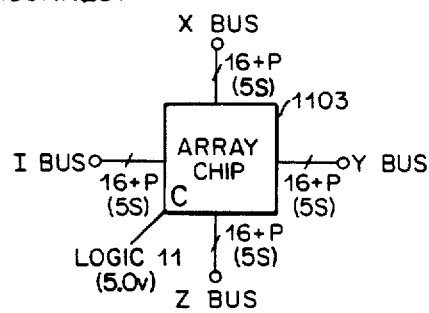
FIG. 9

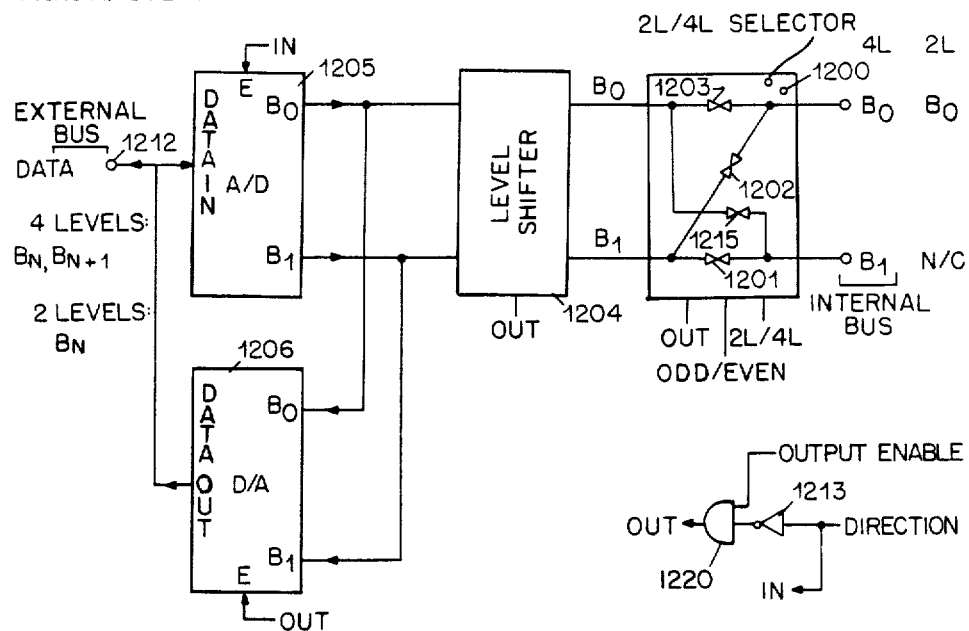
FIG. 10A. OVERVIEW
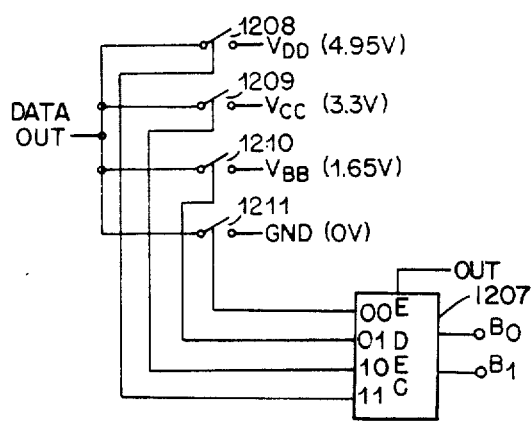
FIG. 10B. MINIMAL POWER D/A
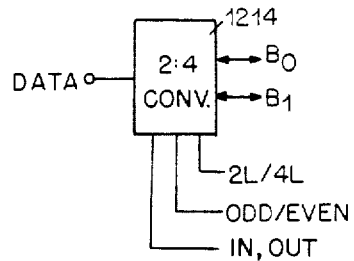
FIG. 10C. 2:4 LEVEL CONVERTER SYMBOL
FIG. 10

| PIN | 2-LEVEL | 4-LEVEL |
|---|---|---|
| 1 | $X_0$ | $X_0/X_1$ |
| 2 | $X_1$ | $Y_0/Y_1$ |
| 3 | $X_2$ | $X_2/X_3$ |
| 4 | $X_3$ | $Y_2/Y_3$ |
| ⋮ | ⋮ | ⋮ |
| 29 | $X_{28}$ | $X_{28}/X_{29}$ |
| 30 | $X_{29}$ | $Y_{28}/Y_{29}$ |
| 31 | $X_{30}$ | $X_{30}/X_{31}$ |
| 32 | $X_{31}$ | $Y_{30}/Y_{31}$ |
| 50 | $I_0$ | $I_0/I_1$ |
| 51 | $I_1$ | $Z_0/Z_1$ |
| 52 | $I_2$ | $I_2/I_3$ |
| 53 | $I_3$ | $Z_2/Z_3$ |
| ⋮ | ⋮ | ⋮ |
| 78 | $I_{28}$ | $I_{28}/I_{29}$ |
| 79 | $I_{29}$ | $Z_{28}/Z_{29}$ |
| 80 | $I_{30}$ | $I_{30}/I_{31}$ |
| 81 | $I_{31}$ | $Z_{30}/Z_{31}$ |

NOTE: PIN NUMBERS ARE EXAMPLES, PHYSICAL NUMBER IS NOT IMPORTANT

FIG. 11

FIG. 12
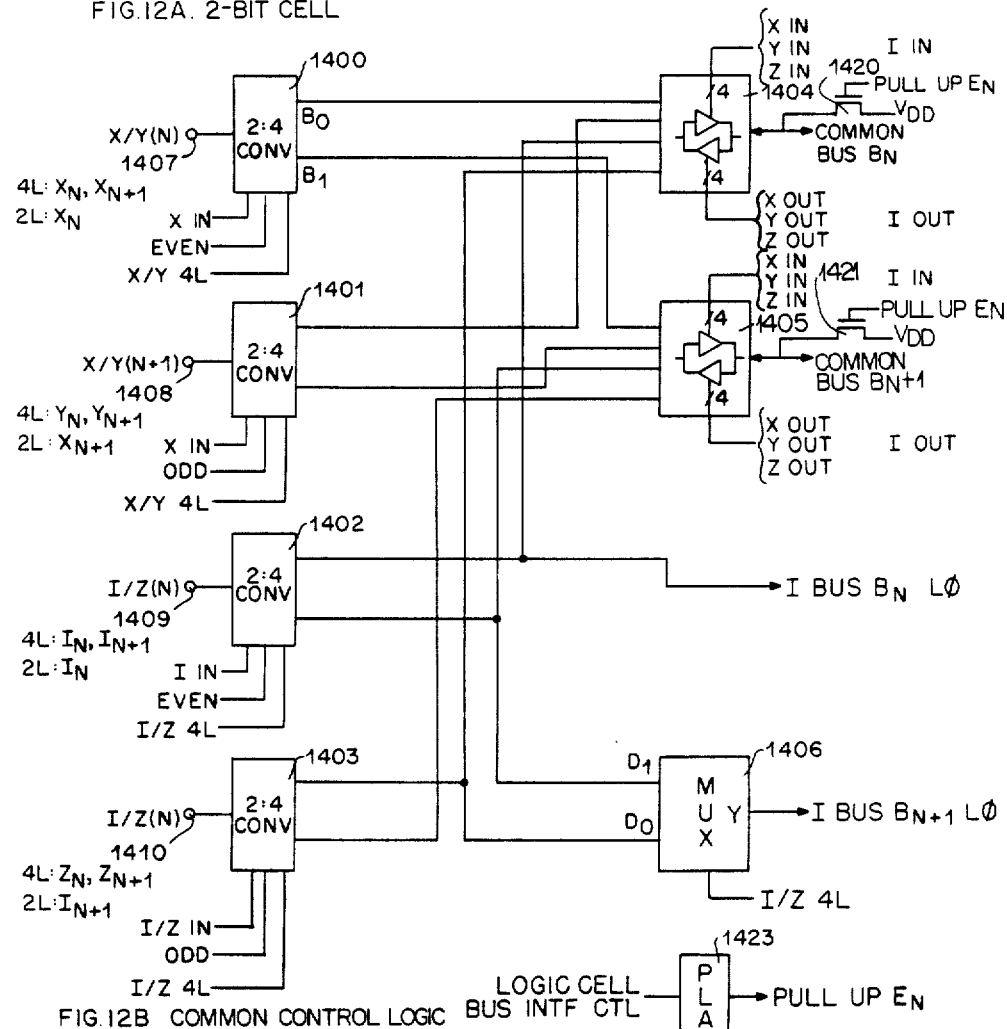
FIG.12A. 2-BIT CELL
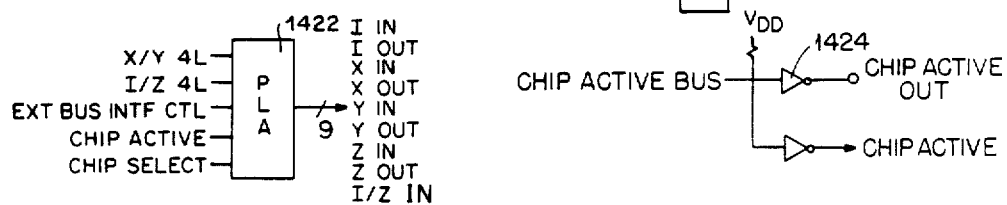
FIG.12B COMMON CONTROL LOGIC

FIG. 14A. BLOCK DIAGRAM
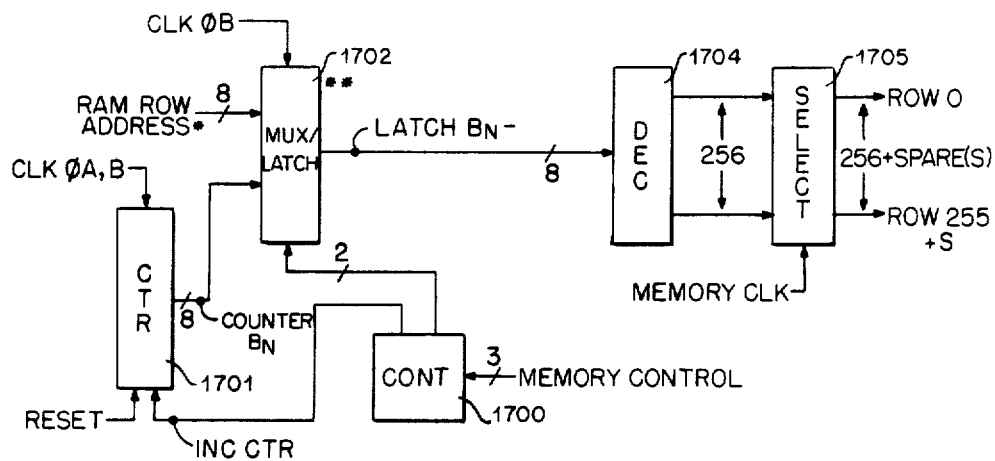
* COMMON BUS $B_{0-7}$
** SINGLE CYCLE: COMPUTE ADDR IN ADDR CELLS AND STROBE INTO MUX/LATCH
FIG. 14B. MUX/LATCH DETAIL
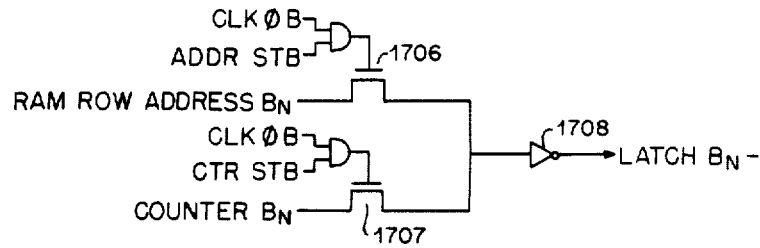
FIG. 14

NON-OPTIMIZED PLA BITS

| NAME | BITS | PATENT FIGURE |
|---|---|---|
| ALT LOAD PROCESSOR ENABLE | 1 | 12 |
| ALU OP, STATUS FF = 1 | 4 | 15 |
| ALU OP, STATUS FF = 0 | 4 | 15 |
| PROCESSOR ENABLE CONTROL | 1 | 17 |
| BUS ODD/EVEN | 1 | 18 |
| MEM WR EN | 1 | 18 |
| MPR WR EN | 1 | 19 |
| ALT LOAD MQ | 1 | 20 |
| ALT LOAD STATUS FF | 1 | 23 |
| ALT LOAD CNZO | 1 | 23 |
| CARRY OUT SELECT | 1 | 26 |
| CARRY IN SELECT | 2 | 26 |
| ZERO OUT SELECT | 1 | 26 |
| VIE OUT SELECT | 1 | 26 |
| ALU D BUS MUX SELECT | 4 | 27 |
| ALU PATH MUX SELECT | 5 | 29 |
| MQ ALT INPUT SELECT | 5 | 29 |
| STATUS PATH MUX SELECT | 6 | 30 |
| LOOP PATH MUX SELECT | 4 | 31 |
| | 51 | |

FIG. 16

MPR STATIC MEMORY CELL

FIG. 20A. MPR NO ALTERNATE INPUTS

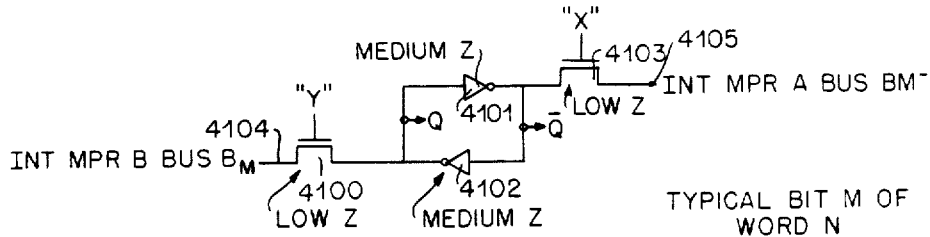

$X = (SELECT\ A_N \cdot CLK\ \emptyset A) + (SELECT\ B_N \cdot CLK\ \emptyset B)$ $Y = (SELECT\ B_N \cdot CLK\ \emptyset A) + (SELECT\ B_N \cdot CLK\ \emptyset B)$

FIG. 20B. MPR ALTERNATE INPUTS

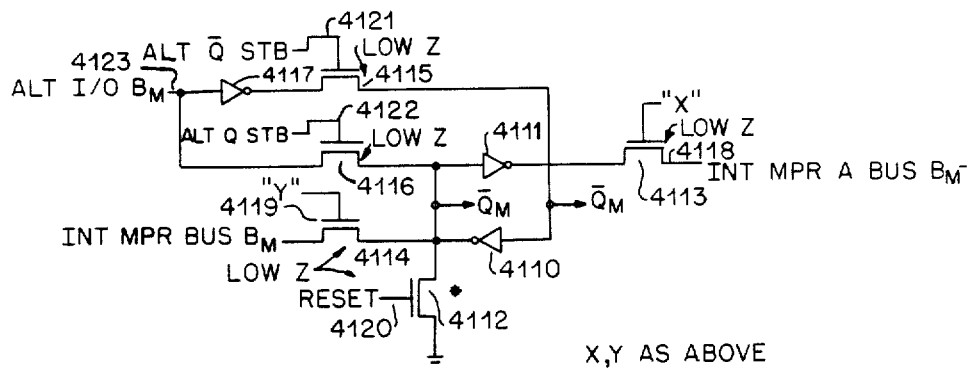

X,Y AS ABOVE

USES: MQ, PSW, PMDR

\* ON PSW ONLY

NOTE: 1. GROUPS OF BITS IN THE PSW ARE LOADED ACCORDING TO FIG.23

2. ALT Q STB MAY BE USED FOR READING "$Q_M$" ONTO ALT I/O $B_M$ PRIOR TO WRITING, IF REQUIRED

FIG. 20

C. IMDR

W = WRITE A
X = WRITE A + READ A
Y = WRITE B
Z = WRITE B + READ B

} SEE FIGURE 86

PROCESSOR STATUS WORD (PSW) BIT USAGE

| FUNCTION | BITS | ASSIGNMENT | NOTES |
|---|---|---|---|
| 1. STATUS REGISTER | | | |
|     CARRY FLIP FLOP | 1 | 0 | |
|     NEGATIVE FLIP FLOP | 1 | 1 | |
|     ZERO FLIP FLOP | 1 | 2 | |
|     OVERFLOW FLIP FLOP | 1 | 3 | |
|     STICKY OVERFLOW FLIP FLOP | 1 | 4 | |
|     STATUS FLIP FLOP | 1 | 5 | |
|     PROCESSOR VIE ENABLE | 1 | 7 | CONTROLLED BY VECTOR IF/ELSE LOGIC |
|     STICKY PARITY ERROR | $\frac{1}{8}$ | 6 | |
| 2. VIRTUAL CELL ID | 4 | 8-11 | |
| 3. HORIZONTAL CONFIGURATION MASKS | $\frac{4}{16}$ | 12-15 | |

FIG. 21

SLICE CONFIGURATION MASK STATES

| | NAME | BUS ASSIGN + | NOTES |
|---|---|---|---|
| 1. | INACTIVE | EVEN | DEACTIVATE ANY SLICE |
| 2. | DLSS/LSP | EVEN | DATA LEAST SIGNIFICANT SLICE/ LEAST SIGNIFICANT PROCESSOR |
| 3. | DLSS | EVEN | DATA LEAST SIGNIFICANT SLICE |
| 4. | MILO/LSP | ODD | DATA MOST-INTERMEDIATE-LEAST ODD/LEAST SIGNIFICANT PROCESSOR |
| 5. | MILE/LSP | EVEN | DATA MOST-INTERMEDIATE-LEAST EVEN/LEAST SIGNIFICANT PROCESSOR |
| 6. | MILO | ODD | DATA MOST-INTERMEDIATE-LEAST ODD SIGNIFICANT SLICE (16-bit word) |
| 7. | MILE | EVEN | DATA MOST INTERMEDIATE-LEAST EVEN SIGNIFICANT SLICE (16-bit word) |
| 8. | DISSO | ODD | DATA INTERMEDIATE SIGNFICIANT SLICE ODD |
| 9. | DISSE | EVEN | DATA INTERMEDIATE SIGNIFICANT EVEN SLICE |
| 10. | DMSS/SPFP | ODD | DATA MOST SIGNIFICANT SLICE/ SINGLE PRECISION FLOATING POINT- for fixed or floating point |
| 11. | DMSS/DPFP | ODD | DATA MOST SIGNIFICANT SLICE/ DOUBLE PRECISION FLOATING POINT- for fixed or floating point |
| 12. | ALSS | EVEN | ADDRESS LEAST SIGNIFICANT SLICE |
| 13. | AMSS | ODD | ADDRESS MOST SIGNIFICANT SLICE |

+ EVEN: B0-15, ODD: B16-31

FIG. 22

LOGIC DIAGRAM

MEMORY MAP

| ADDRESS | IGNORE VIE | USAGE |
|---|---|---|
| 0 | NO | PMDR |
| 1-15 | NO | USER GENERAL PURPOSE |
| 16 | NO | PSW |
| 17 | YES | VIE |
| 18 | NO | MQ |
| 19 | NO | TEMP 0 |
| 20 | NO | TEMP 1 |
| 21 | NO | TEMP 2 |

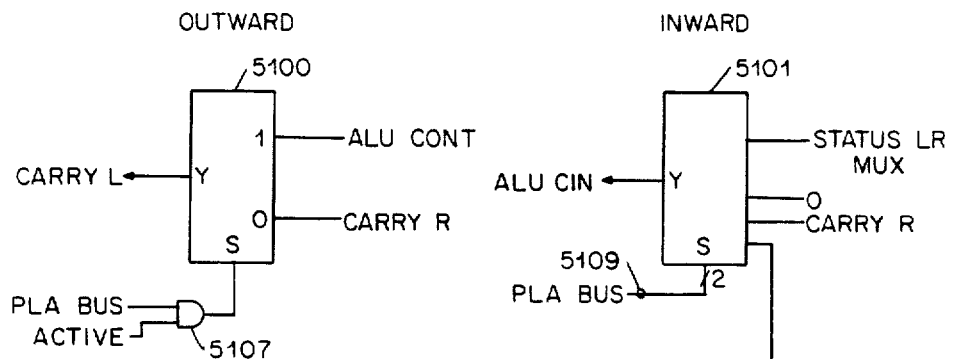
FIG. 26A
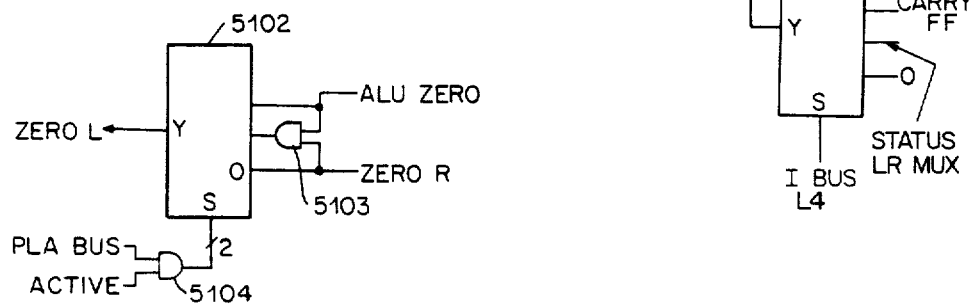
FIG. 26B.
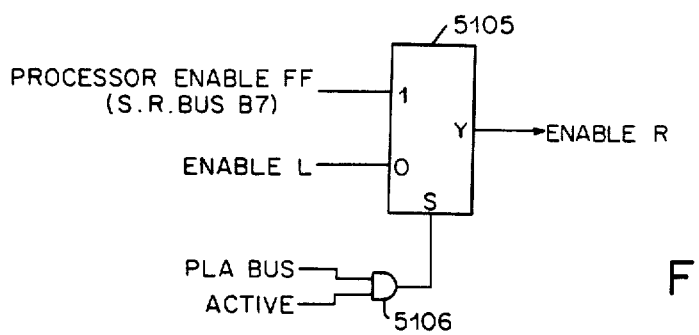
FIG. 26C.
FIG. 26

FOR N = 1 TO 14:
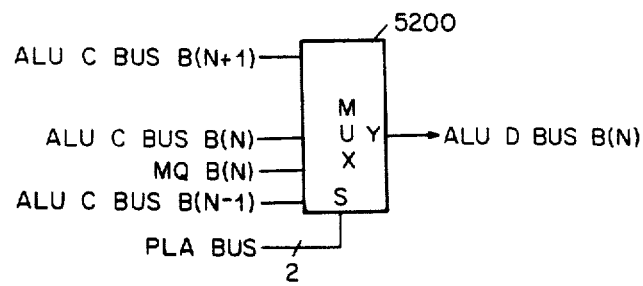
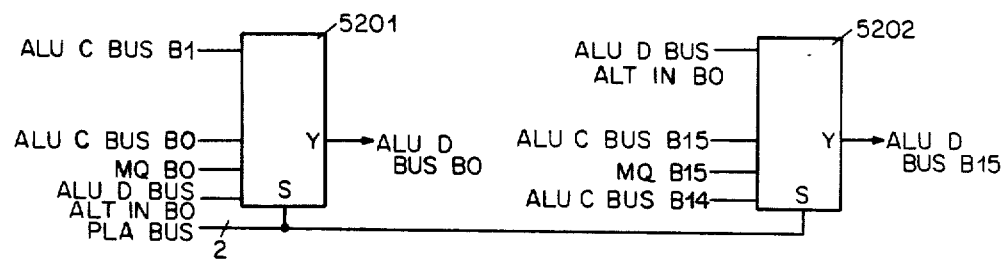
FIG. 27

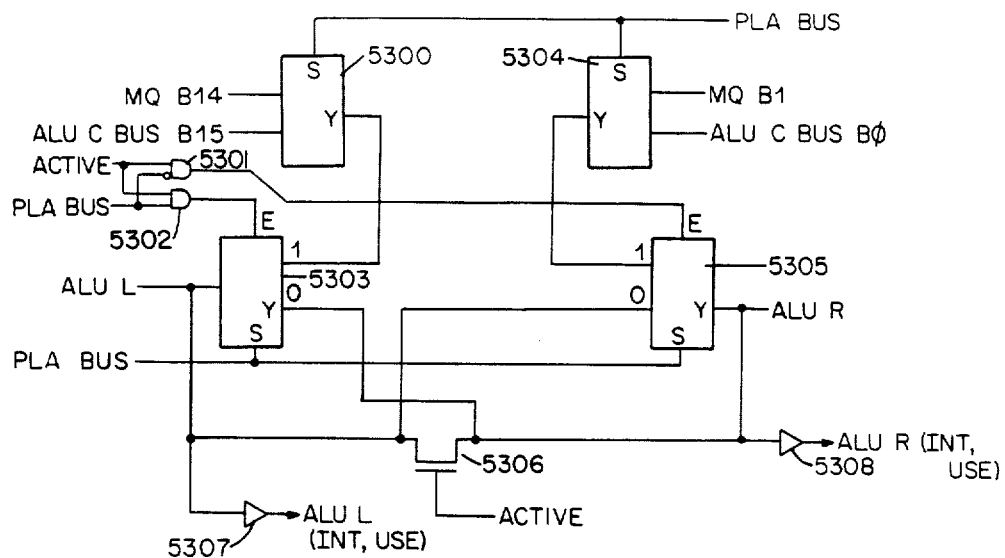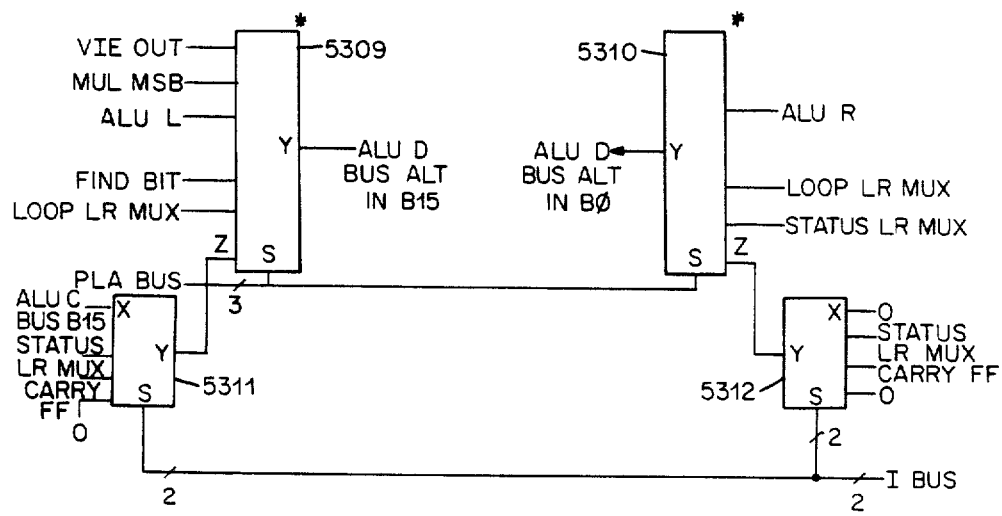
FIG. 28

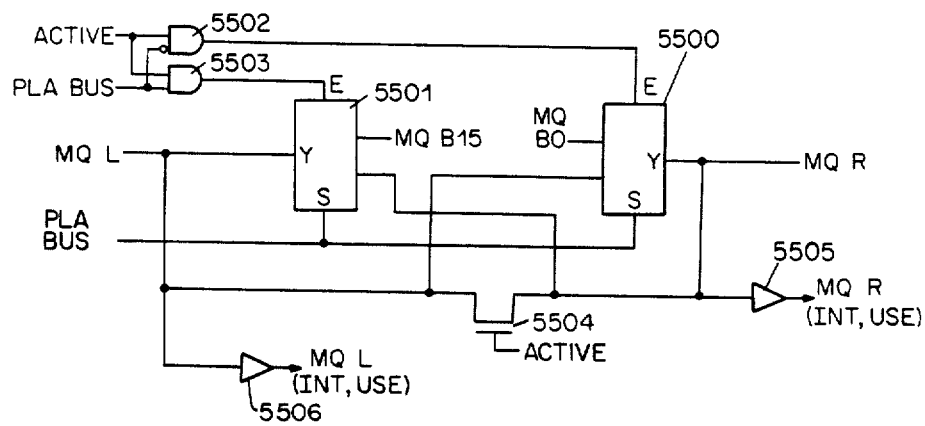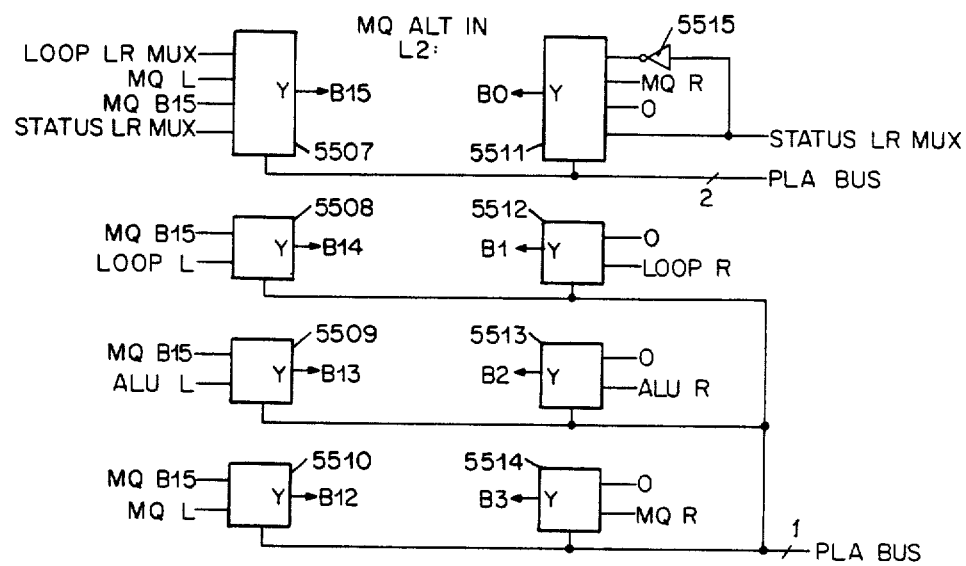
FIG. 29A

ALU FUNCTIONS AND 16 BOOLEAN INSTRUCTIONS

ALU C BUS FUNCTION

A MINUS B MINUS 1 PLUS CIN

B MINUS A MINUS 1 PLUS CIN

A MINUS 1 PLUS CIN

A PLUS CIN

A/ PLUS CIN

B PLUS CIN

A PLUS B PLUS CIN

ONE

ZERO

A/ AND B

A XNOR B

A XOR B

A OR B

A NOR B

A NAND B

A AND B $[MPR_A]$ OP $[MPR_B] \rightarrow [MPR_B]$

SHIFT AND ROTATE INSTRUCTIONS

| MNEMONIC | FUNCTION |
|---|---|
| SRL | (LOGICAL) SHIFT AND ROTATE LEFT (1) |
| ASL | ARITHMETIC SHIFT LEFT |
| ASRR | ARITHMETIC AND (LOGICAL) SHIFT AND ROTATE RIGHT |
| DSRL | DOUBLE (LOGICAL) SHIFT LEFT |
| DASL | DOUBLE ARITHMETIC SHIFT LEFT |
| DRL | DOUBLE ROTATE LEFT |
| DSRR | DOUBLE (ARITHMETIC AND LOGICAL) SHIFT AND ROTATE RIGHT |
| EXCH | EXCHANGE |
| IDPQSL | INTER DATA-PROCESSOR QUADRUPLE SHIFT LEFT |
| IDPQSR | INTER DATA PROCESSOR QUADRUPLE SHIFT RIGHT |
| QSL | QUADRUPLE SHIFT LEFT |
| QSR | QUADRUPLE SHIFT RIGHT |

NOTE:
1. LEFT: DATA FLOWS FROM LSB TOWARD MSB

FIG. 37

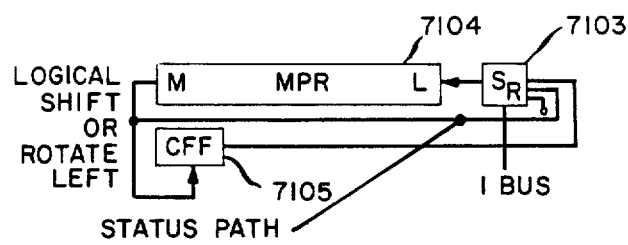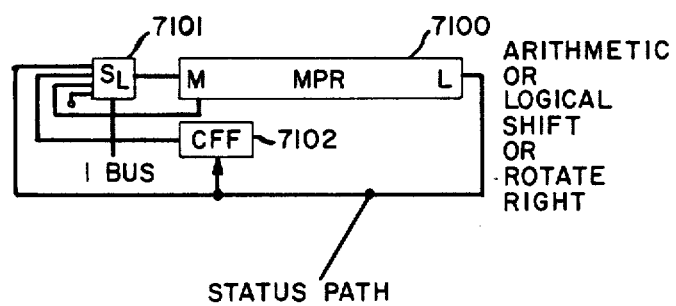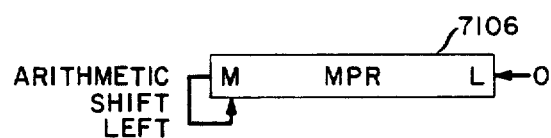
[MPR$_A$] → [MPR$_B$]
FIG. 38

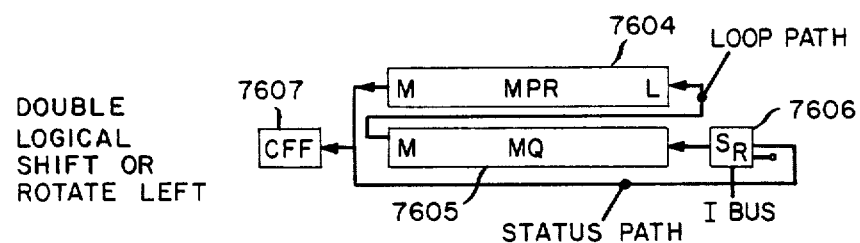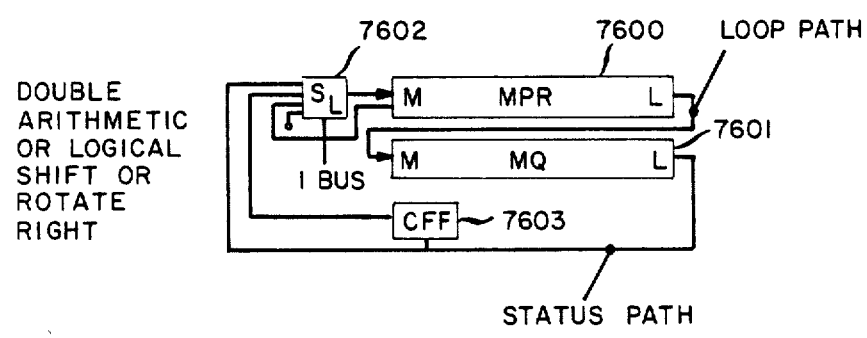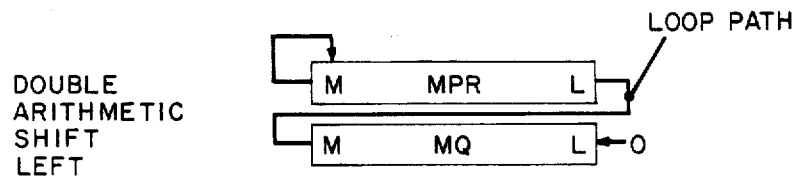
$$[MPR_A] \rightarrow [MPR_B]$$
FIG. 43

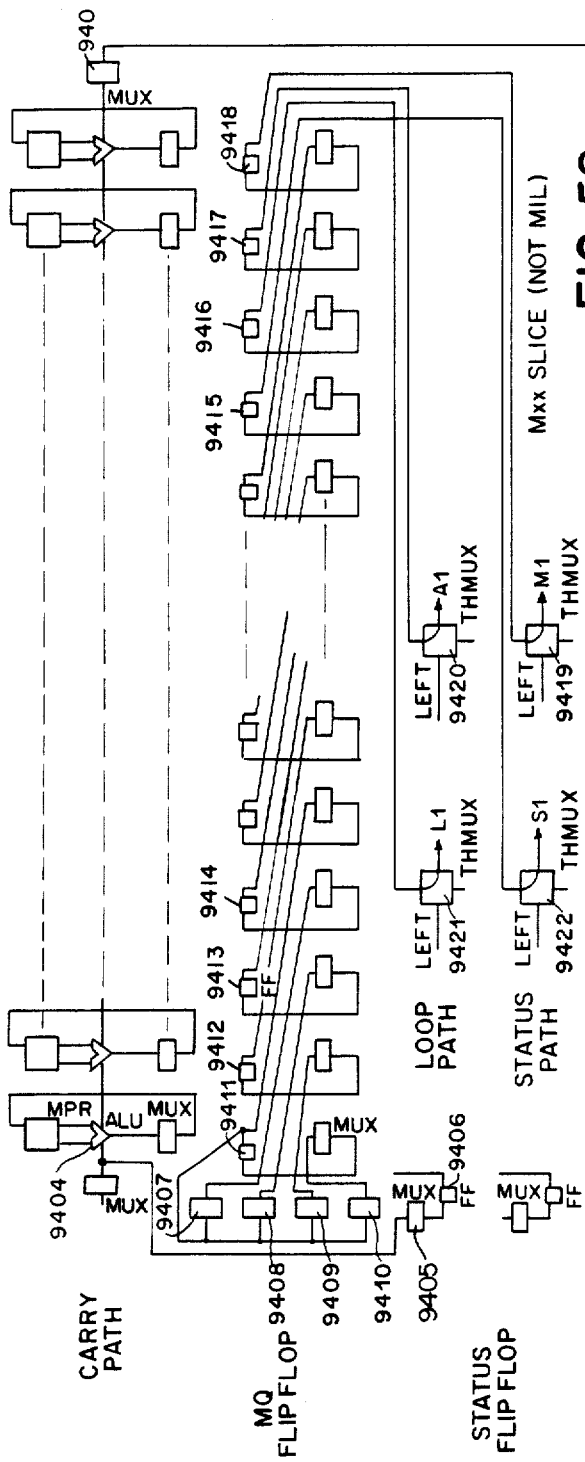
FIG. 58 SHEET 1 OF 2

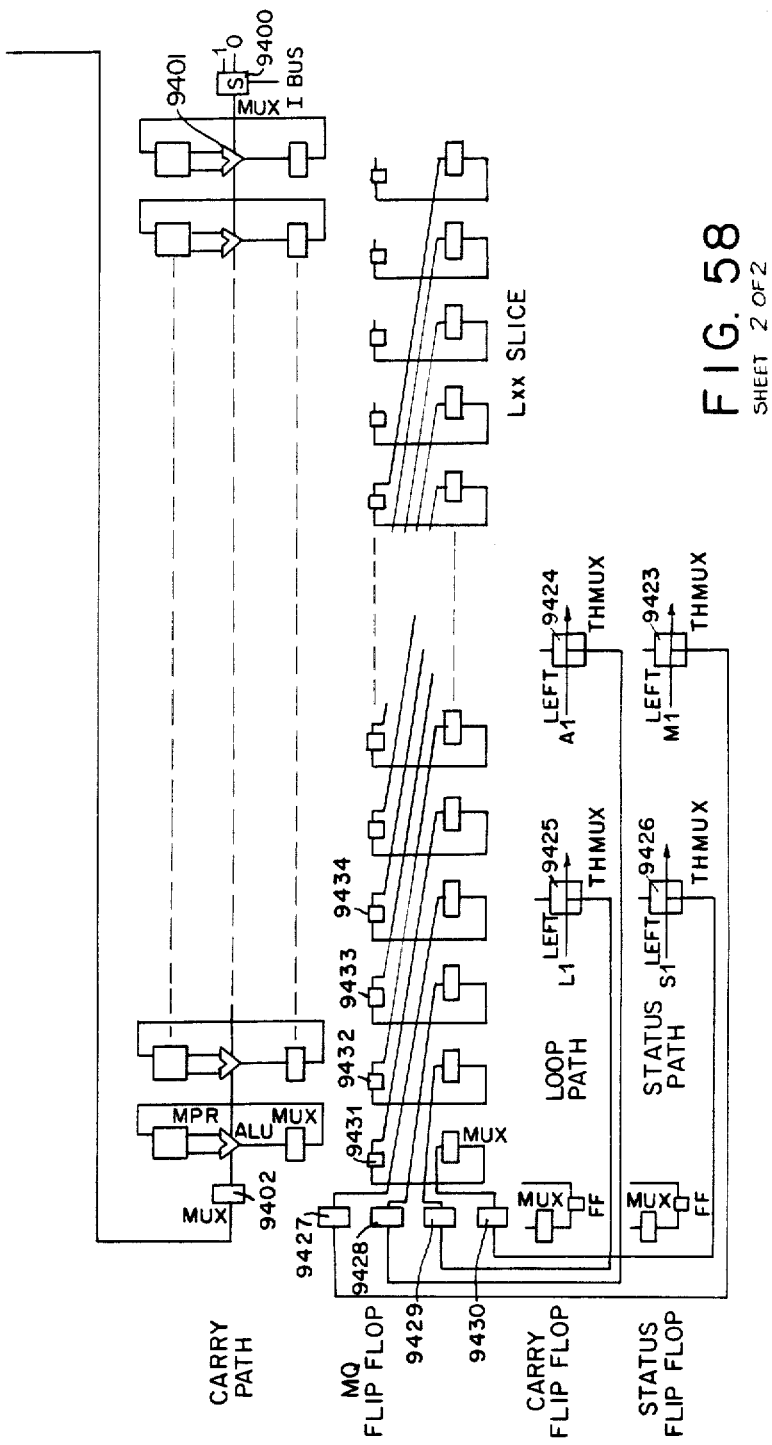
FIG. 58 SHEET 2 OF 2

ITERATIVE FIXED POINT INSTRUCTIONS

| MNEMONIC | FUNCTION |
|---|---|
| FXDMF | FIXED (POINT) MULTIPLY FIRST |
| FXDMI | FIXED (POINT) MULTIPLY INTERMEDIATE |
| FXDMLI | FIXED (POINT) MULTIPLY LAST INTEGER |
| FXDDF | FIXED (POINT) DIVIDE FIRST |
| FXDDI | FIXED (POINT) DIVIDE INTERMEDIATE |
| FXDDL | FIXED (POINT) DIVIDE LAST |

FIG. 64

SPECIAL INSTRUCTIONS

| MNEMONIC | FUNCTION |
|---|---|
| CONFIG | CONFIGURE |
| RECON | RECONFIGURE |
| FIND | INTERPROCESSOR FIND FIRST ONE |
| PUSHIF | PUSH VIE |
| POPIF | POP VIE |
| COMIF | COMPLEMENT VIE |

FIG. 85

PROCESSOR ENABLE OPERATIONS

1. PUSHIF: A bit is entered (pushed) into the VIE register by performing shift right to enter VIE Out into its msb. This operation is independent of the Processor Enable FF. The zero path checks for zero and the result is valid in the MSS where it is loaded into the Processor Enable FF. Note that it is OK to push a "don't care" in an inactive cell.

2. POPIF: The msb (top of stack) is removed by shifting the VIE register left and entering a zero into the lsb.

3. COMIF: The Read address register is XOR'ed with the contents of the VIE register, and the result is stored in the VIE register. The zero path checks for zero and the Processor Enable FF is loaded.

4. FIND: See Figure 122. The Find Bit is loaded (pushed) into the msb of the VIE register, which shifts right. The operation is a special form of "PUSHIF."

NOTES:

1. The Processor Enable FF in the MSS is passed to all cells in the word. Enable R is used by all cells as input to the Processor Enable logic which controls Write Enable to the cell's Local Memory and MPR.

2. Perform an arithmetic or logic operation to load C, N, Z, O into the Status Register prior to performing PUSHIF. This occurs only in an enabled cell.

FIG. 86

EXTERNAL BUS INTERFACE FUNCTIONS

0. I BUS → COMMON BUS

1. NOP

2. X BUS → COMMON BUS

3. COMMON BUS → X BUS IF (chip active + chip select) = TRUE

4. Y BUS → COMMON BUS IF X/Y 4L = TRUE

5. COMMON BUS → Y BUS IF ((X/Y 4L·chip active) + chip select) = TRUE

6. Z BUS → COMMON BUS IF I/Z 4L = TRUE

7. COMMON BUS → Z BUS IF ((I/Z 4L chip active) + chip select) = TRUE

FIG. 87

LOGIC CELL I/O CONTROLLER FUNCTIONS

←——— HS I/O INSTRUCTION ———→

| RD(0)/WR(1)* | A(0)/B(1) | STB. | FUNCTION |
|---|---|---|---|
| 0 |   | 0 | NOP |
| 1 | 0 | 0 | NOP |
| 0 | 1 | 0 | NOP |
| 1 | 1 | 0 | NOP |
| 0 | 0 | 1 | $IMDR_A(V)^{**} \rightarrow$ HS I/O DATA |
| 1 | 0 | 1 | HS I/O DATA $\rightarrow IMDR_A(V)$ |
| 0 | 1 | 1 | $IMDR_B(V) \rightarrow$ HS I/O DATA |
| 1 | 1 | 1 | HS I/O DATA $\rightarrow IMDR_B(V)$ |

\* DIRECTION IS RELATIVE TO IMDR

\*\* V = HS I/O VIRTUAL ADDRESS

FIG. 88

LOGIC CELL BUS INTERFACE FUNCTIONS

0. COMMON BUS → PMDR (virtual address)

1. COMMON BUS → PMDR (enabled logic cells)

2. COMMON BUS → PMDR (address cells)

3. ALU D BUS (enabled logic cells) → COMMON BUS, COMMON BUS DRIVERS ARE ONLY ACTIVE PULLDOWN 4. ALU D BUS (address cells) → COMMON BUS 5. PMDR (virtual address) → COMMON BUS → PMDR (enable logic cells)

6. ALU D BUS (enabled logic cells) → COMMON BUS → PMDR (enabled logic cells)

7. LOCAL MEMORY → PMDR (enabled logic cells)

8. LOCAL MEMORY → PMDR (address cells)

9. PMDR (enabled logic cells) → LOCAL MEMORY

10. PMDR (address cells) → LOCAL MEMORY

11. LOCAL MEMORY → $IMDR_A$ (all logic cells)

12. IMDR (cell logic cells) → LOCAL MEMORY

13. LOCAL MEMORY → $IMDR_B$ (all logic cells)

14. IMDR (cell logic cells) → LOCAL MEMORY

15. NOP

NOTE: Write Enable is set true on a cell-by-cell basis when the above conditions are satisfied to write into the local memory.

FIG. 89

SINGLE INSTRUCTION MULTIPLE DATA (SIMD) CELLULAR ARRAY PROCESSING APPARATUS WITH ON-BOARD RAM AND ADDRESS GENERATOR APPARATUS

RELATED APPLICATIONS

The following U.S. Patents and applications contain subject matter which may be pertinent to this disclosure which generally relate to associative array processors or cellular array processors.

See U.S. Pat. No. 4,546,428 entitled Associative Array with Transversal Horizontal Multiplexer issued on Oct. 8, 1985 to S. G. Morton and assigned to the assignee herein.

See U.S. Pat. No. 4,507,748 entitled Associative Processor with Variable Length Fast Multiply Capability, issued Mar. 26, 1985 and assigned to the assignee herein.

See U.S. Pat. No. 4,536,855 issued Aug. 20, 1985 to S. G. Morton and entitled Impedance Restoration for Fast Carry Propagation and assigned to the assignee herein.

See application entitled Associative Array with Dynamically Assignable Bit Functions, Ser. No. 473,365 filed on Mar. 8, 1983 by S. G. Morton et al and as signed to the Assignee herein, now abandoned.

See application entitled Associative Array with Five Arithmetic Paths, Ser. No. 473,362 filed on Mar. 8, 1983 by S. G. Morton and assigned to the assignee herein, now U.S. Pat. No. 4,580,215 issued on Apr. 1, 1986.

See application entitled Array Reorganization with Internal Cellular Control and Processing, Ser. No. 797,718 filed on Nov. 13, 1985 by S. G. Morton and assigned to the assignee herein, now abandoned.

See application entitled Address Generation for Cellular Array Processors, Ser. No. 803,364 filed on Dec. 2, 1985 by S. G. Morton and assigned to the assignee herein.

See application entitled An Array Reconfiguration Apparatus and Methods Particularly Adapted for Use with Very Large Scale Integrated Circuits, Ser. No. 782,850 filed on Oct. 2, 1985 by S. G. Morton and assigned to the assignee herein, now U.S. Pat. No. 4,722,084 issued on Jan. 26, 1988.

See application Ser. No. 808,392 entitled Single Instruction Multiple Data (SIMD) Cellular Array Processing Apparatus Employing Dynamically Reconfigurable Vector Bit Slices by S. G. Morton filed on even date herewith and assigned to the assignee herein.

See application Ser. No. 808,315 entitled Single Instruction Multiple Data (SIMD) Cellular Array Processing Apparatus Employing Multiple State Logic for Coupling to Data Buses by S. G. Morton filed on even data herewith and assigned to the assignee herein.

See application Ser. No. 808,305 entitled Single Instruction Multiple Data (SIMD) Cellular Array Processing Apparatus with Variable Nesting Depth Vector Processor Control Structure by S. G. Morton filed on even data herewith and assigned to the assignee herein, now abandoned.

See application Ser. No. 808,391 entitled Manufacturing Test Data Storage Apparatus for Dynamically Reconfigurable Cellular Array Processor Chip by S. G. Morton filed on even date herewith and assigned to the assignee herein, now U.S. Pat. No. 4,783,782 issued on Nov. 8, 1988.

See application Ser. No. 808,393 entitled Two-Wire/-Three-Port Ram for Cellular Array Processor by S. G. Morton filed on even date herewith and assigned to the assignee herein, now U.S. Pat. No. 4,783,732 issued on Nov. 8, 1988.

See application Ser. No. 808,418 entitled Test Method and Apparatus for Cellular Array Processor Chip by S. G. Morton filed on even date herewith and assigned to the assignee herein, now U.S. Pat. No. 4,733,393 issued on Mar. 22, 1988.

BACKGROUND OF THE INVENTION

This invention relates to array processors in general and more particularly to a cellular array processor having a highly parallel, highly regular design with a single instruction multiple data (SIMD) architecture.

In the present state of the technology associative processors or array processors have been widely investigated. Essentially, such a processor constitutes a plurality of individual processing cells arranged in a matrix. This combination of processing cells is able to be programmed to enable the solution of complex mathematical problems. There have been many excellent articles in the literature which relate to various forms of such processors.

For example reference is made to an article which appeared in the June 1985 issue of IEEE COMPUTER. This article is entitled "Multiprocessing Technology" by Chuan-Lian Wu. A further article appeared in HIGH TECHNOLOGY, July 1985 on pages 20–28 entitled "Parallel Processing Gets Down to Business" by E. J. Lerner.

Such processors while capable of performing and solving complicated problems are attendant with many different characteristics and requirements. Many present processors employ the single instruction, single data architecture. This particular architecture is well suited for regular applications. It is inherently highly structured and can be configured into different sizes without much additional cost.

In regard to such a structure, the SIMD architecture is highly regular, the data elements are processed in large blocks, the volume of the input data is very large and the desired response time may be very short and critical as the computation requirements per datum are relatively uniform. Within SIMD machines there are both array processors and cellular array processors. Array processors generally have a high performance pipeline of arithmetic elements, little parallelism, and operate upon an array of data.

A cellular array processor is highly parallel having an array of processors each operating upon an array of data. This multiplicity of processors benefits very well from highly structured VLSI design, especially as extended by fault tolerance techniques to be described.

As indicated, the prior art has provided numerous types of array processors. In any event, there are only a few cellular array processors. One such device is manufactured by Goodyear and designated as the MPP. See an article entitled "Design Of A Massively Parallel Processor" which appeared in the IEEE COMPUTER SOCIETY, 1980, pages 80 to 85 by K. E. Batcher. This article describes a cellular array processor.

Such processors operate on storing data streams and processing data streams. The above described processor is designed to operate on a bit serial, word parallel fashion. Each word is stored one bit after another through a succession of memory locations. In any event, this provides for increased operating time while presenting a number of problems in construction. Hence the processor to be described in this application operates in a bit parallel, word parallel manner and, therefore, has more flexibility in memory addressing and allows one to program the same in a simpler and efficient manner.

According to this invention, an array chip is provided which will be utilized as a building block in a highly parallel processor which is of the cellular array type. The processor according to the invention employs a single instruction multiple data (SIMD) architecture. In such a structure one requires a multiplicity of arithmetic logic units and memory to operate parallel on multiple data streams from a single instruction stream. Such a system requires a large number of identical processing elements.

These processing elements must be highly interconnected so that they may flexibly pass data between one another. In addition it is imperative that a high speed means of moving data into and out of the machine be provided to enable the processing elements to be fully and efficiently employed.

Thus as will be shown, the architecture utilizes the processing elements in a most efficient manner to therefore prevent the processing elements from being idle for long periods of time.

As one will ascertain, it is therefore one object of the present invention to maximize the number of processing elements that may be integrated into a single integrated circuit.

It is a further object to maximize the performance of each of these processing elements.

It is still another object to provide local memory for the processing elements on the same chip so that no delays are encountered in going off the chip to acquire the data.

As will be explained, high speed input output structure is provided to allow one to move new data into and out of the on-board memory. As will be seen, a typical system employs twenty 16-bit processor cells on a single array chip with the chip having 256K bits of DRAM (Dynamic Random Access Memory) available to the user. The number of cells and the amount of DRAM are relatively arbitrary.

The Preferred Embodiment requires at least eighteen 16-bit processors plus two spare processors on a chip. The processors are 16-bits wide in order to maximize the performance of floating point arithmetic wherein for both single precision and double precision operation, the exponent is contained within the most significant 16 bits of the word. The structure utilizes a dynamic fault tolerance technique which provides software control of the array configuration. Any number of cells in one chip may operate together to increase word size, although the typical configuration would be sixteen 16-bit processors, eight 32-bit processors, or four 64-bit processors.

In addition, two of the processors cooperate together to generate addresses. These addresses may be used to address the on-board memory or to address data that is off the array chip. When data is being addressed from off the array chip, the main memory bus of the chip operates in a time division multiplex fashion wherein a succession of memory cycles is required to provide the data to all of the cells on board the array chip. This time division multiplexing therefore dramatically increases the time required to fetch data for all of the cells, and it would be the objective in programming this machine that the number of such memory accesses would be minimized.

The provision of two spare processing elements on the chip as means of overcoming manufacturing defects dramatically increases the number of processors that may be economically placed on a chip. This provision furthermore improves the performance and reduces the size of the system by enabling a large number of processors to be co-located on a single chip rather than being contained in multiple chips.

Since many pins coming into the chip are in common to all of the processing cells on the chip then if one had a single 32-bit processor with memory on a chip, one would need to replicate bus connections and instruction connections on each chip in order to provide the same connectivity as the present chip. Therefore, one would need at least eight chips, rather than a single chip, each having roughly 100 pins in order to accomplish the same functional operation.

It is, therefore, another object of the present apparatus to provide maximum performance by having a very large number of very inexpensive processors each equipped with a modest amount of memory in the one kiloword region, although it is also arbitrary depending upon the current state of RAM fabrication capability. Static or dynamic RAM designs may be used. Hence it is a further object of this invention to minimize pin count, reduce power and radiated noise. In order to accomplish this, there will be described a 2:4 level converter. This 2:4 level converter enables one to reduce the device pin count and thus reduce the package size and cost.

In addition by employing this converter, one can now use a technique which will be designated as a 2/3/4 bus architecture which provides for multiple ways of signalling on as many as four individual buses. The strategy is to provide a means of passing a maximum amount of data on a minimum number of pins which pins are associated with chips that are closely located. That is, this is a technique that would be applicable on a single circuit board rather than across a multiplicity of circuit boards.

In this sense of having a single circuit board, it is as though these various chips were, in fact, on the same wafer in that a signalling scheme is devised which is not intended for general use. This signalling scheme places two data bits on a single pin. In conventional interface levels such as TTL one has either a logic 0 or a logic 1 placed on a particular pin. In the technique to be described, four logic levels as logic 00, logic 01, logic 10 and logic 11 are placed on a single pin. Essentially, there is in effect a 2-bit digital-to-analog converter that places information on a pin, and likewise there is a 2-bit analog-to-digital converter that receives the information from a pin. The D-to-A converter is designed in such a way that a minimum of power is consumed by providing a multiplicity of power pins, one for each voltage level, rather than having an analog circuit. The noise immunity of such a system is more than sufficient in a closely located environment where one is not contending with back plane noise.

The four level signals are intended for communication between like chips. For communication with dissimilar chips, a 2:4 level converter buffer chip is required. Another feature of providing four logic levels on a pin is that the noise generation is reduced since the average voltage transition is one half of the power supply rather than equal to the power supply as in a conventional CMOS chip. This furthermore reduces the power that is necessary to drive a line since for a highly capacitive line the energy consumed is proportional to the capacitance of the line times the voltage squared, and by halving the voltage swing, the power consumption is reduced.

There is a compatibility mechanism provided in the chip where a small number of 2-state buses or a large number of 4-state buses are provided. In addition the high speed input/output bus (I/0) which is narrower than the other buses is controlled in such a way that it may be used as either byte at a time for two levels or 16-bit word at a time for four levels. This enables one to trade off interface levels versus bus bandwidth, providing the number of transfers per second is the same.

The clock rate of these buses is minimized by providing four levels rather than providing half the number of bits at double the clock rate due to difficulties with clock skew between multiple chips at higher clock rates, plus the higher clock rate would have dramatically increased the power requirements to drive the bus. Additionally, the size of the driving elements would have to be much larger in order to provide the very fast response time that a double frequency clock would have required.

Thus in order to improve operation and in order to provide for a simple architecture in a cellular array processor, there are shown various techniques which are incorporated in the present specification. These techniques will be explained in detail which will enable one to provide the above described desirable features and hence improve operation as well as reduce cost.

One aspect of this invention is to provide processing elements on a single integrated circuit chip. These processing elements are controlled by software to overcome manufacturing defects to therefore cooperate together to form words of varying sizes and to replace cells that become defective during the lifetime of the processor thereby prolonging the effective life of the machine.

These cells communicate with external memory via a time division multiplex bus. The bus is 32-bits wide and each cell is connected to both the upper half and lower half of the bus. According to configuration bits that are loaded into the cell, the cell will communicate over the top or the bottom half of the bus according to the significance of the bit placed in the cells. Hence such cells will form words between 16 bits and 256 bits in the case where 20 such cells are implemented on a single chip with 4 of the cells being deemed to be spare parts.

A second technique employed will be described, and this involves combining substantial amounts of dynamic random access memory (DRAM) on board the same chip. It is a key point of the disclosure as will be explained that two of the 16-bit cells may cooperate together as an address generator so that large amounts of memory external to the array chip may be addressed and in addition so that an address may be generated on board for use by the DRAM.

A further aspect of the invention is a technique and apparatus that is integrated and employed with the multiplicity of dynamically reconfigurable 16-bit slices which will enable and disable arbitrary collections of processing cells to respond according to the data on which they are operating. The objective is to allow a collection of word sizes to be defined and then for certain of those processing elements to be enabled or disabled according to the data that they are operating on. As will be explained, this technique allows one to perform complicated functions while providing for a most efficient use of all processor cells located in the array.

A further aspect of the invention is the ability of each of the array chips to have programmed into it, at the time of manufacturing tests, the location of its defective elements. This data may be read out at system initialization time so that tests do not need to be performed in order to redetermine the location of defective elements. Furthermore, a technique is described wherein a collection of these chips, each presumably having a different collection of defective elements, may be combined together in a system with a simple means provided to read out the defect information from all of the chips.

A further aspect of the invention is the provision for testing multiple cells simultaneously in order to reduce the test time. On-chip test logic is provided so that the outputs of multiple cells may be monitored simultaneously on a common bus. As defective elements are located, they may be excluded under software control so that testing of the remaining elements may proceed simultaneously. Substantial reductions in test time may thus be obtained, reducing the cost of the chips.

A further aspect of the invention is the unique structure of the multiport RAM. A memory with two read ports and one write port is built from static memory cells where both read ports are used to read out two different locations, and are then used in concert to write into a single location.

BRIEF DESCRIPTION OF THE DRAWINGS

FIG. 4 is a table showing pin connections made to an array chip.

FIG. 5 is a table showing an instruction bus bit summary.

FIG. 6 is a table showing an ALU instruction set for the array chip according to this invention.

FIGS. 9A-D is a series of diagrams showing the bus configurations which can be employed according to this invention.

FIGS. 10A, 10B and 10C are block diagrams showing a 2-to-4 level converters according to this invention.

FIG. 11 is a table showing bus pin usage.

FIGS. 12A and B form a block diagram showing an external bus interface.

FIGS. 14A and B form a block diagram showing the RAM row address logic.

FIG. 16 is a table showing the non-optimized PLA bits.

FIGS. 20A, 20B and 20C are block diagrams showing static memory cells.

FIG. 21 is a table showing processor status word bit usage.

FIG. 22 is a table showing slice types employed in this invention.

FIGS. 26A, 26B and 26C are block diagrams showing the carry path multiplexers, the zero path multiplexers, and enable path multiplexers.

FIG. 27 is a block diagram showing ALU D bus multiplexers.

FIG. 28 is a block diagram showing the ALU path multiplexers.

FIG. 29-A is a block diagram showing the MQ path multiplexers.

FIG. 37 is a table showing shift and rotate instructions.

FIG. 38 is a block diagram showing single word shift instruction path overview.

FIG. 43 is a block diagram showing double word shift instruction path overview.

FIG. 58 (consisting of 2 sheets) is a block diagram showing quadruple arithmetic shift right (long) data paths.

FIG. 64 is a table showing the iterative fixed point instructions.

FIG. 85 is a table of special instructions.

FIG. 86 is a table of processor enable operations.

FIG. 87 is a table of external bus interface functions.

FIG. 88 is a table of logic cell I/O controller functions.

FIG. 89 is a table of logic cell bus interface functions.

DETAILED DESCRIPTION OF THE INVENTION

Figure 1:
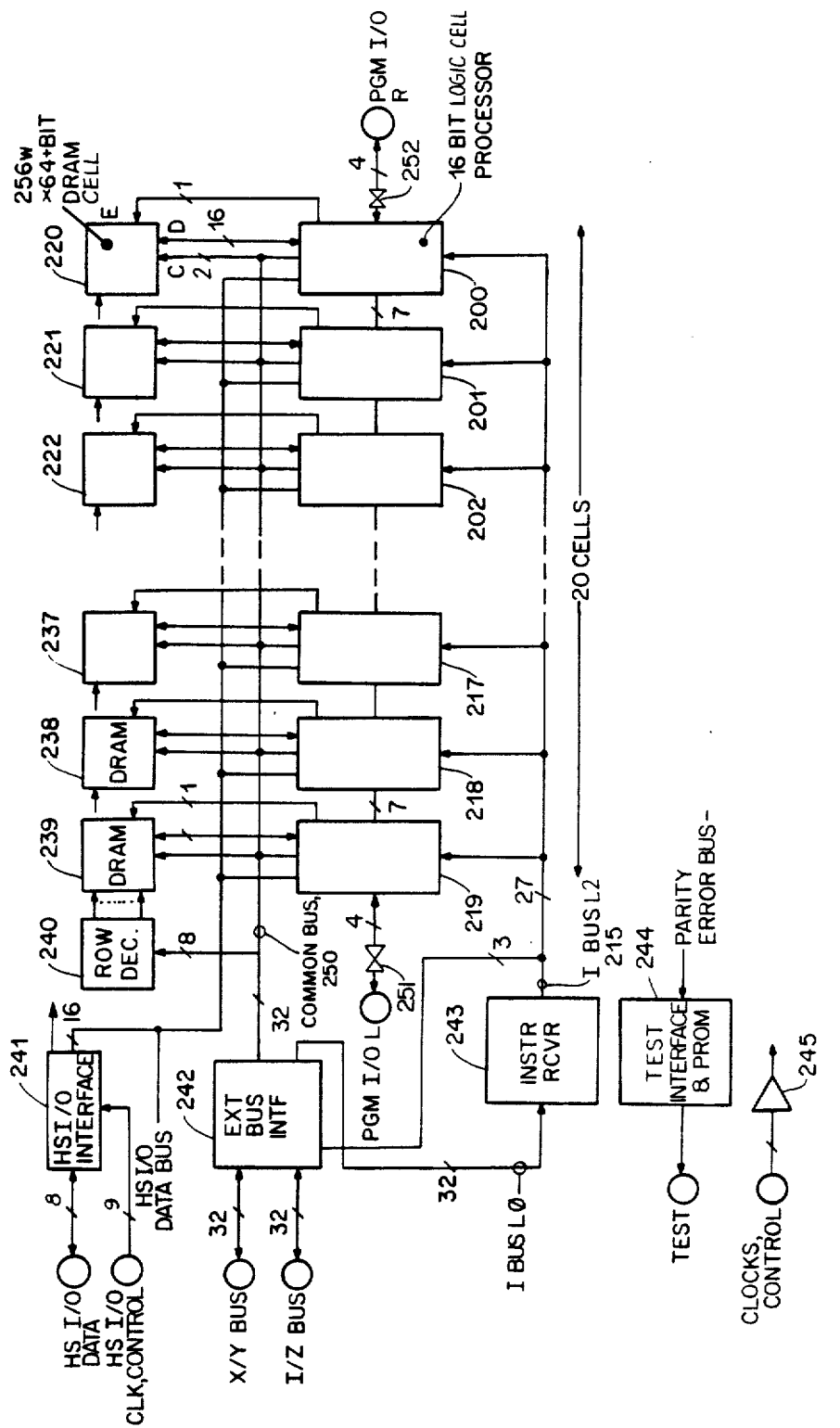
FIG. 1 is a block diagram showing an array chip according to this invention.

Referring to FIG. 1, there is shown an array chip according to this invention.

As one can ascertain from FIG. 1, located on the chip are twenty 16-bit processors designated as 200 to 219 each of which is coupled to a small dynamic random access memory or DRAM as 220 to 239. Each 16-bit processor as processor 200 is connected to an associated DRAM as 220. All of the DRAMS as 220 to 239 are addressed in parallel by a row decoder 240 plus distributed column decode for use by the 16-bit processors.

Sixteen of the 16-bit processors would receive the net 256 bits, that is 16 bits by 16 DRAM cells in one transfer. The address of such a transfer is generated by two of the 16-bit processors working together to form a 32-bit address for on chip and off chip use. The choice of which two cells generate the address is under software control, but with the restriction that no data processors may be between them. Essentially, the two cells which form the address register must exist as consecutive cells such as 201 and 202 or 217 and 218. However, a defective processor may be placed between the two cells forming the address generator.

Accordingly, if processor 218 were defective then processors 217 and 219 could be utilized for the address generator. Two of the twenty 16-bit processors may be defective according to the block diagram of FIG. 1 and the array chip would still provide full performance. A reduced performance chip may be obtained if there were more than two defective processors.

Also shown in FIG. 1 is a common bus 250. The common bus 250 is 32 bits wide. This is indicated by the slashed line designated as 32. The common bus has its full width coupled into each of the 16-bit processors. The 16-bit processor, when it is configured to have a particular significance in a word as in the least significant 16 bits or the most significant 16 bits is also assigned to the upper half or lower half of the common bus so that the bus structure is insensitive to which combinations of 16-bit processors fail.

The common bus 250 is coupled to an external bus interface circuit 242 which has an X/Y bus input and an I/Z bus input. Both inputs interface with the bus interface 242 via 32 bits and essentially are bidirectional input/output buses. As seen in FIG. 1, the address coming from the two 16-bit processors that are configured to be the address generator is directed over the common bus 250 to the row decoder and distributed column decoders inputs C as in DRAM 220.

In this manner each DRAM as 220 to 239 would simultaneously provide a word to the associated 16 bit processor according to the address as selected by the row decoder and the column decoders. The on chip DRAM may also be viewed in an aggregate fashion as off board the chip. In such a configuration, a 13-bit memory address is directed into the chip via the external bus interface 242. The lower eight bits of the address flow into the row decoder 240. The upper eight bits of the address operate the column decoder to select one of 8K 32-bit words. The global addressing as seen from off board the chip may also be used on board the chip.

A table is distributed amongst the DRAMS that are connected to the active 16-bit processors, and a 16-bit processor may access any location in this table rather than be constrained to the local DRAM. In this case, however, only 16 or 32 bits of the on board DRAM would be active at one time, and the collection of the processors would be cycled through in a time division multiplex fashion so that they each may access the table in turn if required.

The instruction receiver 243 receives the instruction bus from the external bus interface 242. The instruction bus controls the 16-bit processors. The instruction receiver 243 consists of a register to capture the instruction bus as it enters the chip and to buffer the bus as it is passed onto the 16-bit processors as well as an instruction decoder to control the drivers and receivers for the pin drivers as are required for the X/Y bus, the I/Z bus, Pgm (program) I/O left and Pgm I/O right. A set of buffers 245 is provided to receive miscellaneous clocks and control signals as required by the chip.

The external bus interface 242 receives both the X/Y bus and the I/Z bus and selects one of these four buses and passes the data to or from the common bus 250. This bus interface contains the ability to provide TTL or 4-level compatibility on the associated buses. The HS I/O Intf (interface) 241 communicates high speed I/O data with the 16-bit processors. This HS I/O Intf also operates with 2-level or 4-level logic to maximize the amount of data that may be transferred on the input-/output pins associated with the chip. It is important to note that parity is passed from the 16-bit processors to the local DRAMS in order to verify the integrity of the storage of the data by the DRAM.

The test interface and PROM 244 conveys parity error information off chip during normal chip operations, and conveys manufacturing test data during system initialization.

Figure 2:
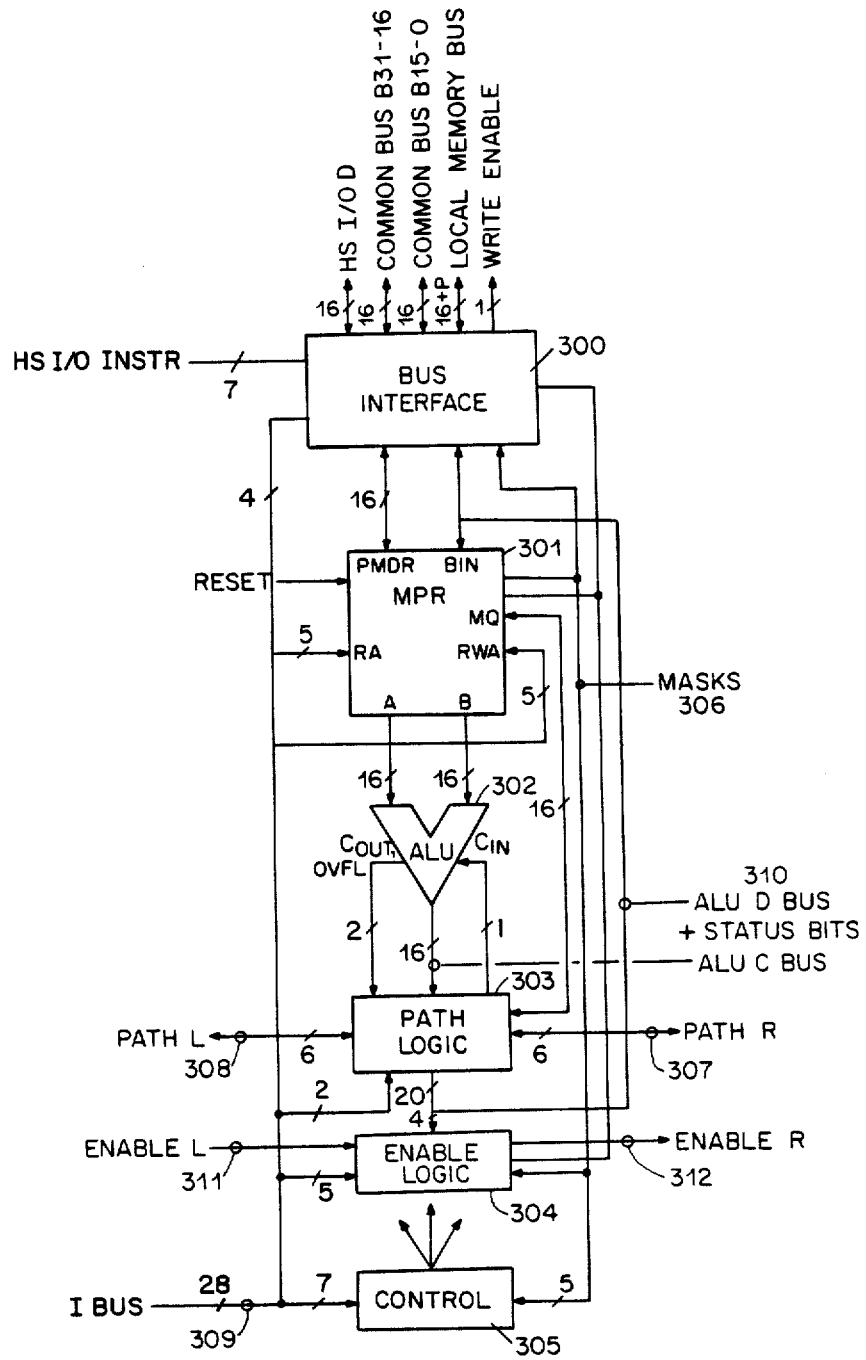
FIG. 2 is a detailed block diagram showing the logic cell employed in the array chip.

Referring to FIG. 2, there is shown the array chip logic cell block diagram. The logic cell is not sensitive to the amount of DRAM on the chip. Improved memory or logic cells may thus be installed relatively easily as the technology evolves. At the heart of the logic cell is the multiport RAM (MPR) 301. The MPR 301 stores the configuration data that is loaded by software control to select whether a cell is active or inactive. If a cell is inactive, it appears invisible, and its state does not change except possibly to change the configuration. The slice configuration or mask determines whether a cell operates to compute memory addresses or to compute data. It also determines what 16-bit slices are required as in the lower or upper half of the 32-bit address or the lower or upper half of the 32-bit single precision floating point word. The slice configuration or mask also chooses whether the bus interface 300 ties the 16 bits of the cell into the lower half as bits 15 to 0 or the upper half as bits 31 to 16 of the common bus. In addition, the masks provide a means for breaking serial connections of processors.

In a parallel processor it is often necessary to interrogate the collection of processors so that a single external control means may communicate with a single processor. In the case where an operation is performed wherein a subset of the parallel processors that compute a result is of interest to the external common control, the common control requires a means to then select one processor after another in turn to perform the operation. A so-called "find mechanism" is provided wherein the first processor satisfying a condition is found. Computation is then performed with that processor. The processor is then lost or released at which point the next processor satisfying the condition may be found.

In such a case it is necessary to predetermine a sequence of processors and a configuration state is provided for this purpose. The path logic 303 and enable logic 304 provide this find/lose mechanism as well as to provide the basic conditional operation mechanism wherein the collection of processors will compute some operation and only those processors satisfying some condition should continue computation.

There is a means called a VECTOR IF/ELSE function that provides the nesting structure for a collection of conditional operations, and this is the structure that ties into the find/lose mechanism as well. Furthermore, the activity state of a cell as determined by the enable logic is communicated via the bus interface 300 on the write enable line to the local memory connected to this cell so that only if a cell is active or a high speed I/O transfer is being made, will data be written into its local DRAM.

Furthermore, since a collection of cells may cooperate together to form words of arbitrary size, the enable logic, which is driven by the most significant slice passes its activity status to all processors of lesser significance in the word so that they may be slaved to the most significant slice. The slaving condition is obtained via the Enable L and Enable R signals.

The MPR 301 in addition to containing the processor status word (PSW) which contains the configuration bits and status register also contains 15 general purpose registers which are available to the programmer. The 15 general purpose registers plus a program memory data register (PMDR) which transfers data into and out of the logic cell may be addressed by the four least significant bits of the RA and RWA lines which are part of the I Bus 309. The MPR 301 also contains four general purpose registers for use by the instruction set microprogrammers. The MPR 301 can simultaneously access two locations, the A address as chosen by the RA or Read/Address inputs or the B address as chosen by the RWA or Read/Write Address inputs.

These two outputs are then operated on in concert by the ALU 302 according to the instruction from the I Bus 309 and the result is written in the same cycle back into the MPR 301 over the ALU D bus 310. The path logic 303 contains the mechanism for connecting cells together within a block to form words longer than 16 bits and for performing functions such as shift and rotate. The path logic of cell N is connected to the path logic on the left cell, cell (N plus 1), via the path L (left) signals 308.

There are six path L signals: ALU L, MQ L, Loop L, Status L, Carry L and Zero L, although only four of these ALU L, Loop L, Status L, and MQ L exit the chip. On the right (R) hand 307 side of the path logic connecting to cell (N-1), likewise are six signals, ALU R, MQ R, Loop R, Status R, Carry R and Zero R. Here again only four of these ALU R, MQ R, Loop R, and Status R exit the chip. There are also the Enable L and Enable R path signals from the enable logic 304.

The four left and right signals that exit the chip provide the means of shifting data rapidly between processors on different chips. It is not intended that words be configured across multiple chips and that is why the most time critical signals such as Carry and Zero do not traverse chip boundaries. It is a significant feature of the design that a sufficient number of 16-bit processors may be implemented on a single chip as to provide a large number of relatively long words, as in eight 32-bit words or four 64-bit words or one very long 256-bit word.

Path logic 303 also contains bidirectional means wherein the left and right paths such as ALU L and ALU R may be bidirectionally connected together in the event that the cell is deemed to have failed and the masks in the MPR 301 are set accordingly. Since the direction of information flow on four of the paths, ALU, MQ, Loop and Status depends upon the instruction, and the instruction control 305 is relatively defect prone due to its relatively large size, a bare minimum of logic is necessary to simply provide bidirectional transfer of information across the path logic 303 in the event of failure.

Furthermore, in order to minimize the amount of logic that must be functional for a cell to become invisible. When the system is initialized, a reset line directly into the MPR is activated so that the mask bits may be directly cleared forcing the inactive state which is directly decoded without going through the control logic 305 to set the path logic into a by-pass mode for use when the cell is defective. The good cells are then set active with the required slice types.

The enable logic 304 also contains the physical ID of a cell within a chip so that upon system initialization each of the cells may be addressed in turn and its configuration set accordingly. There is thus a physical address built into the enable logic of each cell. This physical address 0–19 in the case of a 20-cell chip and a decoder for the physical address is the only difference between cells. The cells are otherwise identical.

Following initialization, a programmer may address a cell by its virtual address which is stored in the Processor Status Word (PSW) along with the configuration mask. The programmer is thus not sensitive to the locations of the defective cells.

The control logic 305 provides the means for decoding an instruction which is impressed upon bus 309. This instruction is decoded in conjunction with the slice configuration masks 306 to control the operation of each cell for each slice configuration for each instruction. The control logic 305 is implemented as a PLA, programmable logic array, in such as way as to control the data flow as will be described subsequently. The control logic 305 controls the various multiplexers as will be described to enable data to move about according to the particular type of instruction as impressed on the instruction bus 309. It is noted that the instruction bus 309 is also coupled to the enable logic 304, to the path logic 303 as well as to the MPR 301 and bus interface 300. The bus interface 300 provides the connection to the high speed input/output bus, the upper half and the lower half of the common bus designated as bit 31 to 16 and bit 15 to 0, and to the local memory.

The bus interface 300 contains the parity generation and checking means to verify the integrity of the various data transfers between a cell and its memory. The bus interface 300 also contains a column decoder for use in the global memory map mode wherein the virtual identification of a cell which is in the range 0 to 15 may be matched against the four most significant bits of an address in order to choose two of the 16-bit DRAMS in the case of 32 bit communications.

Figure 3:
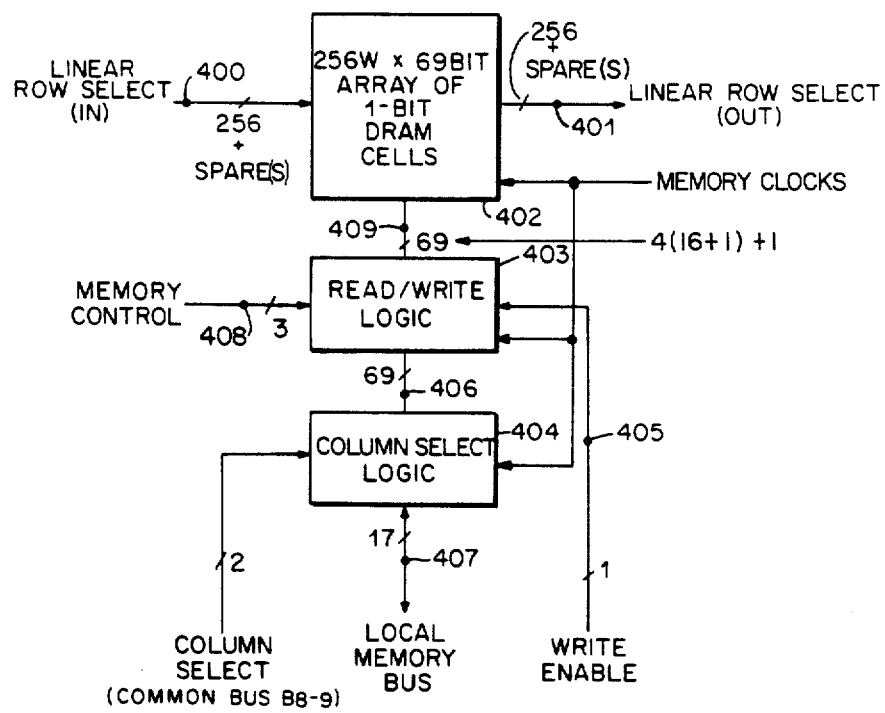
FIG. 3 is a block diagram showing a memory cell block according to this invention.

Referring to FIG. 3, there is shown a memory cell block diagram which is the memory 402 incorporated in each cell and designated in FIG. 1 as reference numerals 220 to 239. The Preferred Embodiment of the local memory consists of a conventional array of one transistor per bit DRAM cells. The four word wide memory 402 is selected according to the linear row select in 400 which is passed to the linear row select out 401.

It is assumed that using conventional means, both spare rows and spare columns are provided to increase the yield of the memory associated with each logic cell. This is shown as the provision of spare lines in the linear row select and spare column lines at the output 409. The number of spares is not of consequence and basically is chosen to minimize the cost of the device.

The provision of spare rows and columns in the DRAM is implemented in a static select fashion at the time of manufacturing test. It is not thought to be cost effective to provide software configuration of the rows and columns in the DRAM. The Read/Write logic 403 contains the sense amplifiers, buffers and spare column logic as are found in a conventional DRAM. The four word wide bus is passed onto the column select logic 404 which chooses one of four blocks of 16 data bits plus 1 parity bit according to the two column select bits. A latch for the column select lines is also provided. The resulting 17 lines, 16 bits for data and one bit for parity are passed on to the local memory bus 407 to the logic cell. The total number of columns in this memory is thus 20 cells times ((4 times 16 data+1 parity)+1 spare) per cell equals 1380.

The Read/Write logic 403, DRAM cell array 402, and Column select logic 404 are under control of the control lines 408 which are designated as memory control and provide for reading or writing operations as well as refresh. The write enable line 405 from the logic cell determines whether or not a particular memory stores information. This write enable is used in three cases. In the vector case where some subset of the 16 processors are active, the second in the global memory case where either one or two of the memory cells is to be active, and the third when High Speed I/O data is loaded into the memory of all logic cells.

Referring to FIG. 4, there is shown a summary of the pin connections on the array chip as for example depicted in FIG. 1. A total of 105 pins is broken into six categories. There is high speed I/O, X/Y bus, I/Z bus, memory control, program I/O and miscellaneous. It is seen that regarding these pins there are certain notations on the Figure which for example indicate that the high speed (H/S) I/O bus has eight data pins which are used for input/output information or data and are capable of operating at two or four levels as will be explained. These notes indicate that many of the pins such as the pins on the X/Y bus as well as the I/Z bus also operate at two or four levels. This particular mode of operation will be described subsequently.

Referring to FIG. 5, there is shown the instruction bus bits utilized by the array. The bits are broken into eight categories: Read Address, Read/Write Address, Processor Enable, Serial Input Select, OP Code, External Bus Interface Control, Logic Cell Bus Interface Control, and Spare Instruction Bits. As one can see, there are a total of 32 bits indicative of the instruction bits.

Referring to FIG. 6, there is a summary of the data path instruction set. The usual elementary Boolean functions of two variables, as in A+B, A−B, A OR B, is provided as well as iterative fixed point operations as in multiply or the divide steps. It is important to note that in order to minimize the size and thereby maximize the yield of each processor cell as well as to provide for variable word size, multiply and divide operations are performed as a step and repeat operation rather than using parallel combinatorial logic as for example a 16 by 16 multiplier.

Floating point is likewise provided as a sequence of operations, building upon the fixed point instructions. In addition a collection of shift and rotate operations is provided. These will all be described in detail subsequently.

Figure 7:
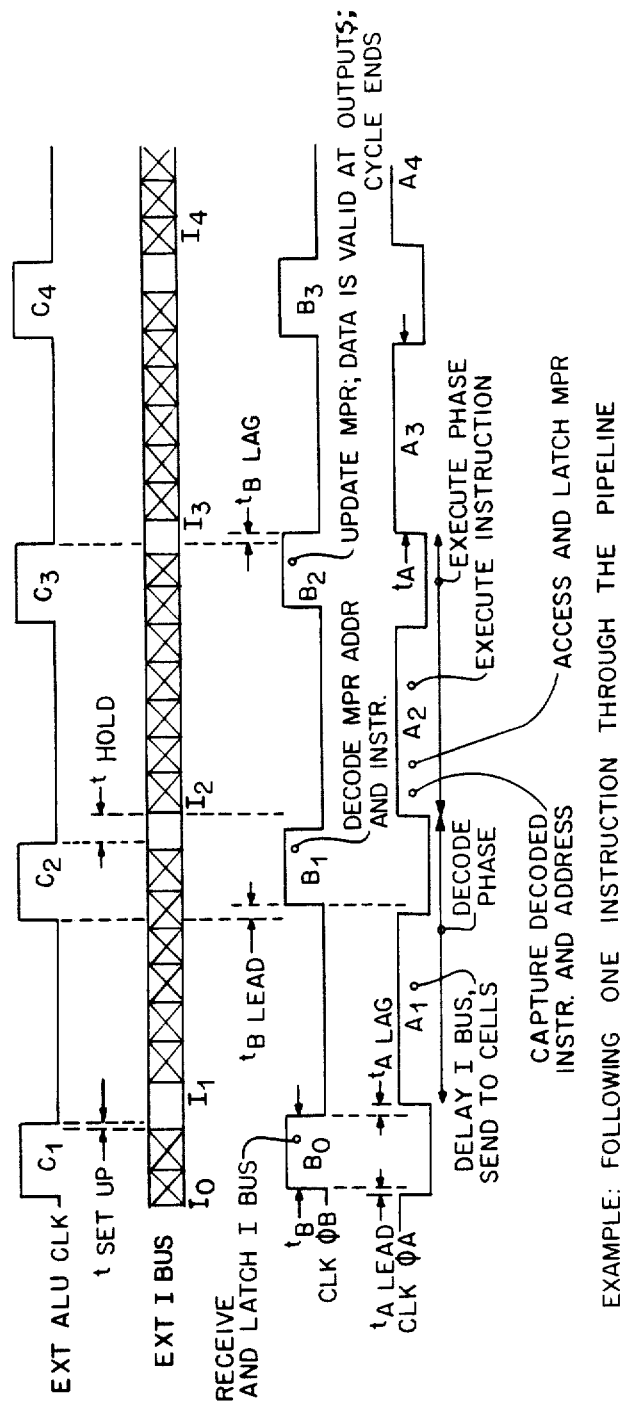
FIG. 7 is a series of timing diagrams showing the instruction bus timing.

Referring to FIG. 7, there is shown a particular example of instruction bus timing. Timing is referenced to the Ext (external) ALU Clk (clock) which is received by buffer 245 in FIG. 1. This example follows the timing of a single instruction, I0 through the entire logic of the chip. A setup time prior to the falling edge of clock pulse C1 finds I0 on the Ext I bus stable. The Ext I bus must remain stable for a hold time following a falling edge of the external ALU clock.

Clock phase B internal to the chip is a slightly delayed version of the external clock. The Ext I bus is received and latched by clock pulse B0. Following the falling edge of clock pulse C1, clock pulse B0 also falls and shortly thereafter tA Lag, clock phase A rises. Clock pulse A1 delays the received I bus and sends it to the cells. Note that at this point, timing internal to the chip is fully synchronous, with all randomness in reception of the I bus being removed by the buffer sampled by the clock pulse B0. The beginning of clock pulse A1 through the end of clock pulse B2 represents the decode phase of the instruction execution.

With the rising edge of clock pulse B1, the register in each cell receives the instruction bus and presents the instruction bus either to the instruction PLA for instruction decoding or the address decoder for the multiport RAM Read/Address and Read/Write Address decoding. A register is placed in each cell rather than in the common logic so that the transmission time from the common logic to the cells has no bearing on the decode time, beginning with the rising edge of clock pulse B2.

The B clock and inversely the C clock are sufficiently wide so that the PLA function and the address decode function may be performed prior to entry to the execute phase marked by clock pulses A2 and B2. The output of the PLA and MPR address decoders are latched at the beginning of clock pulse A2 where they are held through the end of the execute phase. At the beginning of clock pulse A2, the multiport RAM may be accessed and thus ALU operation is chosen based on the status flip flop. When the output of the multiport RAM and the ALU operation are chosen, the arithmetic logical operation begins. The outputs from the multiport RAM are stabilized during clock pulse A2 so that they will not be changed at the inputs of the ALU during the write phase clock using pulse B2.

Data from the arithmetic or logical operation becomes valid at the end of clock pulse B2 at which time it is latched into the Read/Write Address location of the multiport RAM, and the outputs from the chip as the left and right paths become valid. At this point, execution of the next instruction may occur since the decode phase was occurring concurrently with the execute phase of the I0 instruction.

Figure 8:
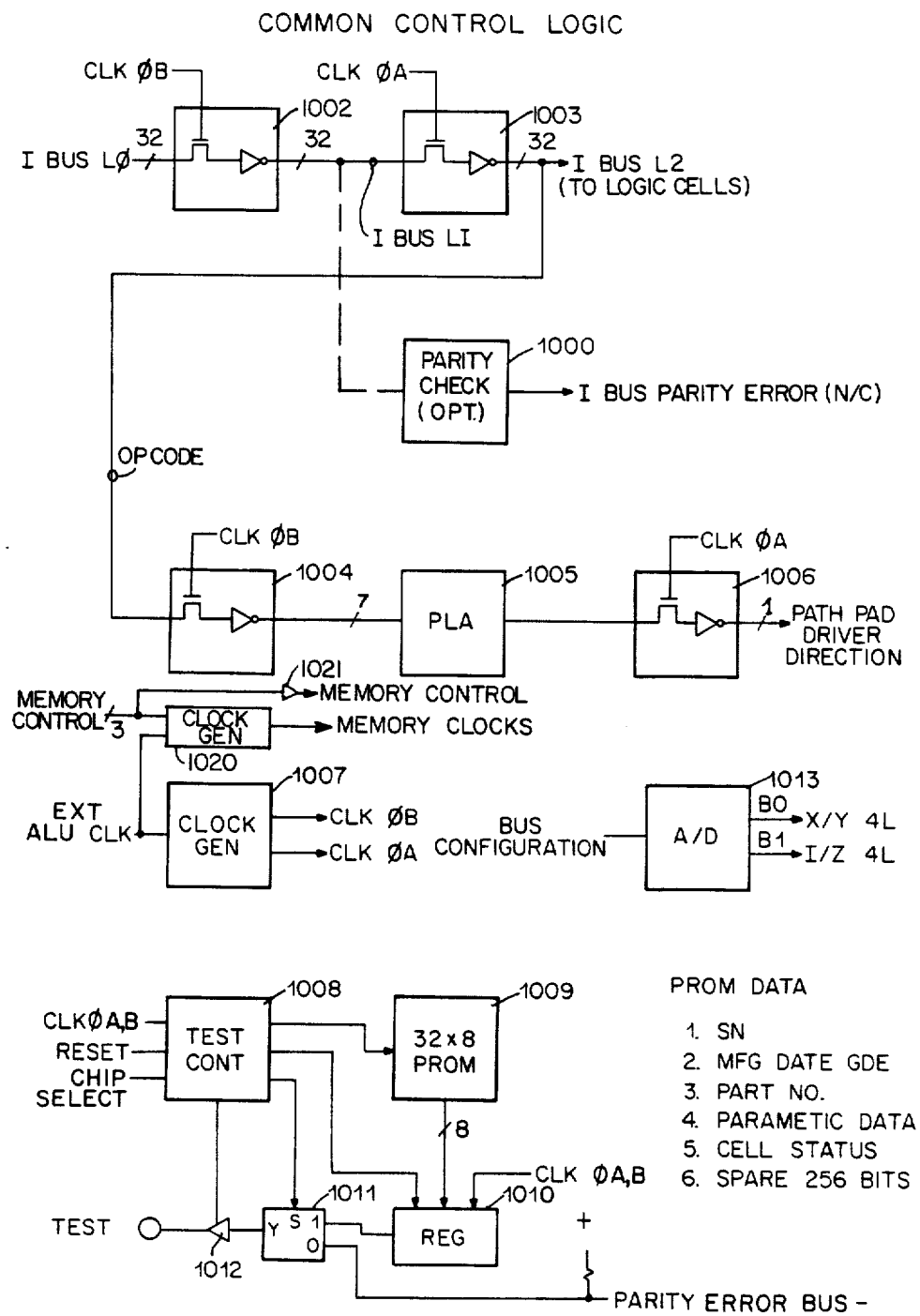
FIG. 8 is a block diagram showing the common control logic according to this invention.

Referring to FIG. 8, there is shown the common control logic block diagram. The clock generator 1,007 generates clock phase A and clock phase B as shown in FIG. 7. Circuits for generating such clock phases are well known in the art, and as can be ascertained from FIG. 7, there are many circuits including multivibrators which can operate to produce the clock pulses shown in FIG. 7.

The I bus is latched by circuit 1002. As one can see, each bit of this circuit consists of a field effect transistor having clock phase B applied to its gate electrode with one bit of the I bus connected to the source or drain electrode. The field effect transistor is a switching device which exhibits a low resistance between the source and drain upon receipt of an applicable voltage on its gate electrode and exhibits an extremely high resistance between these electrodes when a opposite polarity of voltage is applied to the gate electrode.

The output electrode of the FET in module 1002 is connected to an inverter. The output of the inverter is connected to the input electrode of a second FET in module 1003. The second FET receives the clock phase A at its gate electrode and consists of the same circuit as 1002 with the output of the inverter of circuit 1003 connected to a further switch 1004 which receives clock phase B at the gate electrode of the FET. The output of the switch 1004 is directed to a programmable logic array or PLA 1005 having its output connected to a further switch device 1006 which operates during clock phase A.

The I bus as indicated is latched by 1002. The bus is latched again by 1003 and is then directed to the cells. Latch 1004 matches the delay in the cells and PLA 1005 provides the path pad driver direction lines which are latched by 1006.

A programmable read only memory 1009 is shown. This memory is loaded at the time of chip testing and is provided to aid in the configuration of a collection of array chips into an operational system. A total of approximately 256 bits of storage in the PROM 1009 provides sufficient storage for the data outlined as well as some number of spare bits. The PROM 1009 is of conventional implementation being either laser programmed or electrically programmed as is most economical. The contents of the PROM 1009 are typically organized as 8 bits wide times 32 locations and is loaded a byte at a time into register 1010 and shifted out at which time the next byte is provided under control of the test control logic 1008.

The test control logic 1008 is initialized and the output sequence begins under the case where the chip select signal is true and the falling edge of reset occurs. In as much as each array chip may have different combinations of defective cells, the external control logic must know which cells are defective so that it may configure the working cells. This PROM 1009 may be read out via the register 1010 and test control logic 1008 at system initialization and would typically contain the following data:

1. The serial number of the device.
2. The manufacturing date code.
3. The part number.
4. The parametric data as in clock rate.
5. The cell status, that is where are the defects in logic cells and the memory cells.
6. Spare.

FIG. 8 shows an abbreviated table of such data written under the heading of PROM DATA.

The PROM 1009 is shifted out by clock phase B when reset drops while CS is high. See FIG. 7. The parity error bus is output when the reset is low and there is no shifting at which time the buffer 1012 pullup transistor is disabled to provide a wired or connection.

It is noted that the chip can be used even if there are a number of defects.

For example if there was a major flaw in the memory, one could employ the chip for use only without the on-board memory. In this case 16 of the 20 cells would be available for data operations. Alternatively, one may have applications where the address generators do not require on board DRAM. In this case if at least 16 of the memory cells were operational, then those would be potentially available for use by the 16 data processors, and the address processors are configured from logic cells that did not have corresponding good memory cells. As indicated, the two cells that comprise the address generator must be adjacent, although intervening inactive cells my be present. The third possibility is that the chip may be used at half capacity, wherein the objective is to provide eight 16 bit processors plus two address processing cells. In this case one may have a total of ten defective cells rather than two or four.

Referring to FIG. 9, there is shown the bus configurations. In case A there is shown a conventional interconnect which employs full TTL compatibility wherein the I bus and the Y bus are the only buses beyond the high speed I/O bus, (which will be ignored for the moment) that are provided.

In case B a medium interconnect A is shown. The control line 1104 assumes a logic 01 state of approximately 1.65 volts. In this case the instruction bus remains TTL compatible whereas the X bus and the Y bus are four levels, five states, each containing 16 wires plus a parity wire providing 32 data bits plus two parity bits each.

In case C which is a medium interconnect B, the control line is driven by a logic 10 state of approximately 3.3 volts leaving the X bus a conventional 3-state bus whereas the I bus and the Z bus are 5-state buses each containing 17 wires providing 32 data bits plus two parity bits each.

In case D there is shown a maximum interconnect each of the I, X, Y, and Z buses is configured for five levels, according to a logic 11 level of approximately five (4.95) volts on the C line. This maximum interconnect site is the preferred usage of the chip in order to maximize connectivity while minimizing power dissipation at the interconnects. It is important to note that the four-level logic is restricted to the I/O pins so that the internal logic as the BIMUXES to be described and the internal buses may be conventional two-level logic.

Referring to FIG. 10A, there is shown the two- to four-level converter in detail. There is shown a two-level to four-level selector 1200. The selector 1200 has two inputs designated as B0 and B1. B0 and B1 are utilized during a four-level logic control while B0 is utilized during a two-level logic control. The internal bits, B0 and B1, may be a zero or a one and are directed to the input of the four-level selector 1200 which operates under control of the direction signal. This is shown underneath the module whereby the direction signal is applied to the input of an inverter 1213 which through AND gate 1220 provides the output signal (OUT) shown coupled to module 1200 and the IN signal applied to the A/D convertor 1205.

Data is transferred between B0 and B1 and the level shifter 1204 or vice versa, as will be explained. Under control of the two-level to four-level select line (2L/4L), the three bidirectional elements as 1201, 1202 and 1203 move data as follows.

For two-level operation with ODD/EVEN set EVEN, bit B0 is passed through bidirectional gates 1203 and 1202 to the two inputs of the level shifter 1204. When ODD/EVEN is set ODD, bit B1 is passed through 1201 and 1215 to the level shifter. Thus for two-level logic B0 and B1 of level shifter 1204 are identical. For four-level logic B0 is passed through path element 1203 to bit B0 of level shifter 1204 and B1 internal is passed through path element 1201 to the B1 input of the level shifter 1204. For data coming into the level shifter 1204, these paths are reversed.

For four-level operation B0 from level shifter 1204 is passed via gate 1203 to B0 internal to path element 1203 and B1 from the level shifter 1204 is passed through element 1201 to B1 internal path element 1202.

In two-level operation the voltage level seen at the external pin 1212 is a conventional CMOS signal such as 0 or 5 volts. This type of signal is widely employed and as indicated is used in CMOS systems. The particular choice of the four-levels is arbitrary. For simplicity it is assumed that 5 volts is the high level operating voltage and that four states are uniformly spaced between ground and 5 volts. For data flowing into the terminal 1212, data passes to the level shifter 1204 to convert from potentially different operating voltages internal to the chip which may be relatively low for small technology devices to a potentially high level operating voltage to be developed for the output devices. If the input and output operating voltages are the same, then the level shifter 1204 is not required.

In any event, level shifters are well known components, and many examples of such level shifting devices exist in the prior art. Such devices are constantly used to interface various digital logic systems with various other digital logic systems of a different type.

The outputs from the level shifter 1204 are directed to the inputs of a digital-to-analog converter D/A 1206 which, if enabled, places a voltage on the output pin 1212. The D/A converter can be enabled or disabled depending upon the input signal to the enable terminal (E).

For data coming into the chip, the A to D converter 1205 receives the two-level or four-level voltage from the pin 1212 and produces outputs on B0 and B1. The A/D converter 1205 may be implemented in a number of ways which are known to those skilled in the art. A flash converter, as is well known in the art, can be typically employed for rapid operation. The B0 and B1 outputs of the A/D converter 1205 are active if the enable input E signifies that the data is being received. As one can see, the enable inputs to both the A/D converter 1205 and to the digital-to-analog converter 1206 are derived from gate 1213 which has at its input the direction signal. In any event, the A/D converter 1205 produces a B0 and B1 output which are active if the enable input signifies that data is being received. In this case, the B0 and B1 are directed to the level shifter 1204 and are then passed through the two to four level selector 1200 and then directed to the internal bus. Hence the internal bus in the case of signals incoming on pin 1212 would receive the same logic levels as it develops.

Referring to FIG. 10B, there is shown a minimal power digital-to-analog converter as D/A converter 1206 of FIG. 10A. The converter is employed to minimize on-chip power dissipation. It is considered desirable to increase the number of pins slightly in order that the optimum voltage may be supplied for driving the output pins rather than generating voltages through analog means on board the chip.

For example, ground is shown conventionally as 0 volts, VBB as 1.65 volts, VCC being twice VBB as 3.3 volts and VDD being 3 times VBB at 4.95 volts which is approximately 5 volts as shown elsewhere. The decoder 1207 of FIG. 10B receives B0 and B1 and, when enabled, produces a 1 out of 4 select to turn on one of the low voltage drop switches as switches 1208 to 1211. This places a voltage output on the output terminal (DATA OUT) which is connected to pin 1212. None of the 00 to 11 outputs will be active if the enable to the decoder is not true.

Referring to FIG. 10C, there is shown the symbol for the two-to-four level converter 1214 as will be employed in other Figures. It is noted that in regard to the above, the two-level to four-level selector consists of a plurality of bidirectional switches as 1202 and 1203. These switches can be implemented by FET devices in CMOS configurations or otherwise. The use and implementation as well as control of bidirectional switches is well known in the art, and essentially the above noted selector circuit 1200 operates as described.

Referring to FIG. 11, there is shown the two-to-four level bus pin usages which correspond to the levels as generated by the structure of FIG. 10. In order to provide for the usage of one set of pins to be configured as one or two buses, it is necessary to connect the data bits as shown in the table. So, for example, for two-level logic, pins 1 to 32 would contain X 0 to X 31, whereas for four-level logic, the same pins would contain both the X and Y buses. The table shows a means of minimizing the complexity of the chip wiring so that either one or two buses may be connected to a single set of pins.

For example, in four-level logic, pin 1 would contain both X 0 and X 1, whereas pin 2, which formerly contained X 1 in two-level logic, would now contain Y 0 and Y 1. The pins may therefore be taken in pairs where a pair of pins has either X 0 and X 1 or the pair of pairs X (N)/X (N+1) and Y (N)/Y (N+1). The connection of the I and Z buses is shown in pins 50 to 81 and operates in an analogous fashion. Notice that the pin numbers are examples, the specific pin numbers being arbitrary, but the pairing of the pins is extremely important.

FIG. 12 shows the external bus interface. The 2-bit cell in FIG. 12A is repeated 16 times to form the bus interface logic. Four, two-to-four level converters as 1400 to 1403 connect to four I/O pins, 1407 through 1410. These I/O pins are in two groups: The X/Y pair 1407 and 1408 and the I/Z pair 1409 and 1410. The X/Y pair may be used in two modes. In the two level mode, X is carried, in which case pin 1407 carries bit X (N) and pin 1408 carries bit X (N+1). In the four-level mode, 1407 carries both bits, X(N) and X(N+1) while pin 1408 serves the Y bus providing bits Y(N) and Y(N+1).

The I/Z pair works in an analogous manner. In the two-level case, pin 1409 carries bit I(N) and pin 1410 carries bit I(N+1). The choice of two-level or four-level operation is made by the A/D converter 1013 in FIG. 8 which receives the bus configuration signal. The bus configuration signal results in the signals X/Y 4L which is received by two-to-four level converters 1400 to 1401 and I/Z 4L which is received by two-to-four level converters 1402 and 1403.

All four buses as X, Y, Z, I may be multiplexed into the common bus through bidirectional transceivers 1404 and 1405.

Since there are four sources of B0 in the four-level case, bidirectional transceiver 1404 has four inputs to receive B0 from each of those buses. These signals in turn become common bus bit N. Which one of the four signals is passed on to the common bus is selected by the four signals X IN, Y IN, Z IN and I IN from the common logic. Similarly, there are four sources of B1 which are being selected.

The I bus is unidirectional. There is a single source of I bus bit N which is two-to-four level converter 1402. There are however two sources of I bus bit 2 depending upon whether the external I bus is in the two-level or four-level mode. Multiplexer 1406 therefore receives outputs from both two-to-four level converters 1402 and 1403 where the I/Z 4L signal selects the appropriate source to pass on to the I bus B (N+1) L 0 (level zero it is further buffered in each cell).

The transmission of signals from inside the chip to outside the chip as from the common bus to the transceiver 1404 through a two-to-four level converter 1400 and out to pin X/Y (N) 1407 occurs as follows: The active output is selected by one of X OUT, Y OUT, Z OUT and I OUT during which time none of the input signals are active. Even numbered bits are transmitted from the common bus to the pins via the bit 0 input of the two-to-four level converter 1400 whereas odd numbered bits as common bus B (N+1) pass through transceiver 1405 and is received by the bit 1 input of the two-to-four level converter 1401, in the case where the X/Y bus is operating in the two-level mode. The provision of odd and even in the two-to-four level converters facilitates the regular connection between the edge pins and the internal bus.

This regular 2-bit cell with bus multiplexing and a minimum of interconnect facilitates the placement of a multiplicity of buses on a chip. The four I/O pins 1407 through 1410 are adjacent to each other and are replicated in blocks of four around the perimeter of the chip.

Pull-up transistors 1420 and 1421 are used during manufacturing testup of the device. They are turned on by PLA 1422 in response to an External Bus Interface Control instruction as will be explained later. In order to reduce the test time of the chip, and thereby the cost, all cells may be tested simultaneously by initializing them to the same state and using the common bus to verify their outputs. In this case the cells would drive the common bus with active pull-down transistors and the tester would monitor the common bus through one of the external buses. If an unexpected result occurs, signifying a defective cell, the test may interrogate each cell in turn until the bad cell is located. At that point the cell would be turned off, and the simultaneous testup of the remaining cells would resume.

The PLA 1422 generates the buffer control signals as described in FIG. 85.

The buffer 1424 reviews the chip active bus, which is used by external logic to determine whether or not a chip is driving an external bus.

Figure 13:
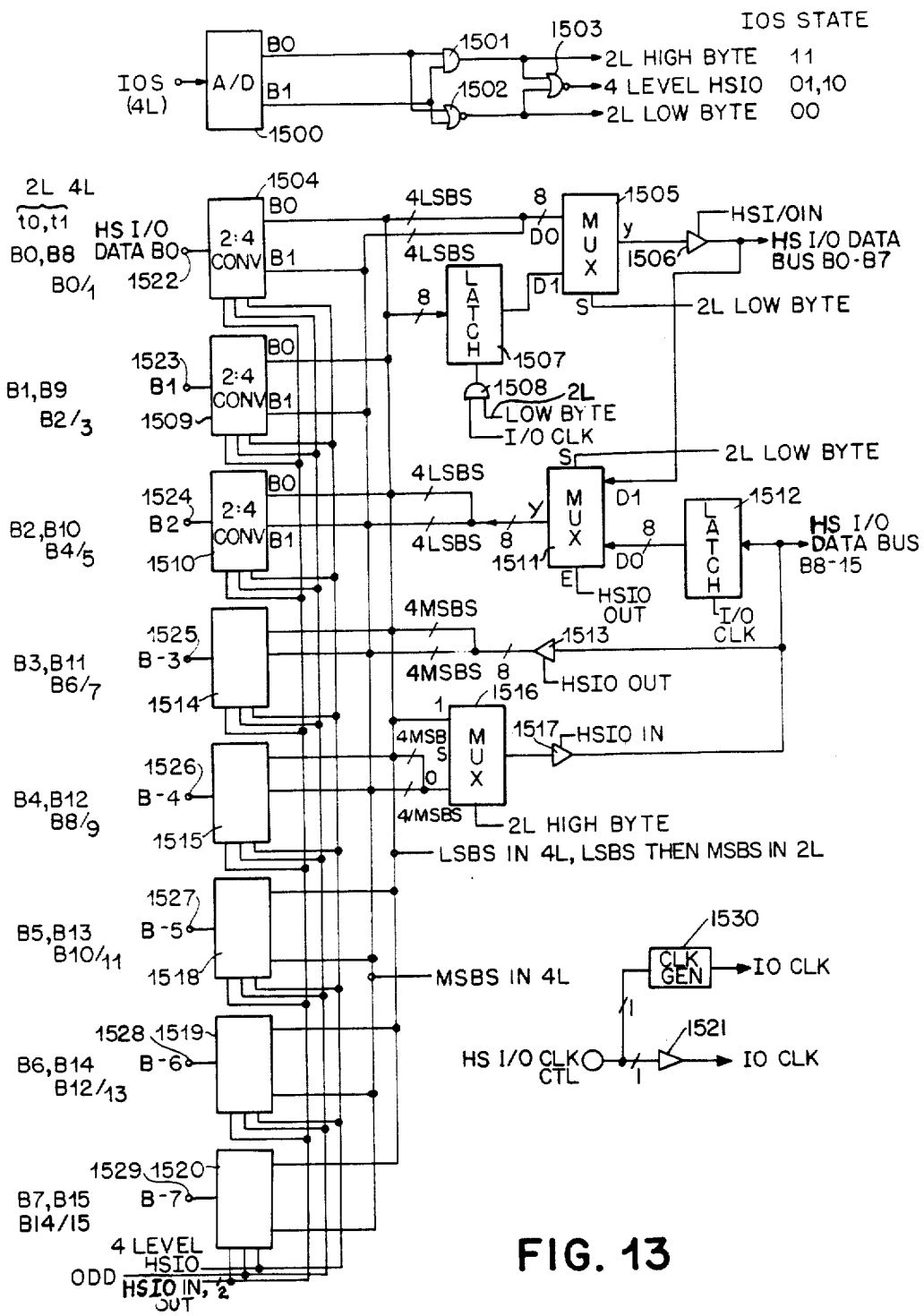
FIG. 13 is a block diagram showing a high speed input/output interface block diagram.

FIG. 13 shows the high speed I/O Interface block diagram and illustrates another use of the two-to-four level converters. In this case a single set of eight pins as 1522 through 1529 receives the high speed I/O bus. Rather than providing the possibility of two diverse buses sharing the same set of pins as X and Y in FIG. 12, this circuit allows data to be transferred either 16 bits at a time, in four-level mode or 8 bits at a time at successive low bytes and high bytes in two-level mode.

The bit assignment to the pins is as follows: In four-level mode, pin 1522 receives bits 0 and 1; pin 1523 receives bits 2 and 3 and so on where successive pairs of bits are received by successive pins. In two-level mode, one pin after the other receives the successively higher bit as in pin 1522 receiving bit 0 and pin 1523 receiving bit 1, both in the case where the least significant byte is being transmitted. In the case where the most significant byte is being transmitted then pin 1522 would have bit 8 and pin 1523 would have bit 9 and so on.

Analog-to-digital converter 1500 receives HS I/O Mode, the I/O select signal which is a four-level signal. The signal selects three modes of operation: In two-level operation this pin selects the low byte which would be a logic 00 on the pin or the high byte which would be the highest logic level, 11, on the pin. For four-level, 16-bit, operations, the pin would assume an intermediate value. The states of the A/D converter 1500 are decoded by the gates 1501 through 1503 providing the signals 2 L high byte, 2 L low byte and 4 Level HS I/O. In four-level operation where the chip receives data from the HS I/O Data pin operation is as follows: The two-to-four level converters 1504 through 1509, 1510, 1514, 1515, 1518, 1519 and 1520 activate both of their B0 and B1 outputs. Multiplexer 1505 receives the eight outputs from the two-to-four level converters associated with pins 1522 through 1525 and these are passed through buffer 1506 under control of the HS/IO IN signal onto the HS I/O Data bus bits 0 to 7. Multiplexer 1516 passes the 8 bits associated with pins 1526 through 1529 through buffer 1517 onto HS I/O Data bus bits 8 to 15. Inversely, for the transmission of data from the chip to the pins, multiplexer 1511 receives the 8 bits from HS I/O Data bus B0 to B7 and passes them to the two-to-four level converters 1504, 1509, 1510, and 1514. HS I/O Data bus bits 8 to 15 are passed through the buffers 1513 onto the four most significant converters 1515, 1518, 1519 and 1520.

In two-level operations, the least significant byte is transmitted first. The 8 bits are taken from the eight two-to-four level converters and stored in the latch 1507 under control of AND gate 1508 which is activated when the HS I/O low byte is transmitted and the I/O clock is received by CLK GEN 1530 which generates non-overlopping clocks as explained for Ext ALU CLK.

When the high byte is transmitted, multiplexer 1516 receives the 8 bits from the two-to-four level converters and passes the bits onto the HS I/O Data bus bits 8 to 15 while the latch 1507 is enabled to the multiplexer 1505 onto HS I/O Data bus bits 0–7. For transmission in two-level mode, the least significant byte is passed directly through multiplexer 1511 out to the eight pins while the latch 1512 stores the state of the most significant bits from HS I/O Data bus B8 to 15.

When the high byte is transmitted, latch 1512 is passed through.

FIG. 14A shows a block diagram of the RAM row address logic. The RAM address which in this case is shown as being 10 bits wide, under the assumption that 1,024 locations are provided per cell, although the number is arbitrary. This address enters MUX/LATCH 1702. Each RAM row address bit which comes from common bus bits 0 to 7 is passed onto the decoder 1704. The decoder 1704 and spare row select block 1705 are well known in the art for DRAM designs and operates to select one row out of 256 plus spares in the DRAM array.

The spare row selector 1705 assumes that some relatively small number of spare rows is provided so that as a manufacturing option defective rows may be eliminated.

To facilitate refresh a counter 1701 is provided. The counter 1701 output is passed through the MUX/LATCH 1702 in place of the RAM row address during the refresh operation. The control logic 1700 under control of the memory control lines passes data through the MUX/LATCH 1702 and increments the counter for refresh operations.

Referring to FIG. 14B, there is shown the MUX/LATCH detail. An address bit may be passed through pass element 1706 if an address strobe is present. The state being stored at the input to inverter 1708 produces the inverted latch output. The decoder 1704 in this case operates off an inverted level, but this is irrelevant to the general description.

Alternatively, the counter output passes through element 1707 under control of the counter strobe and is stored at the input to inverter 1708 during a time when neither pass element 1707 or 1706 is true.

Figure 15:
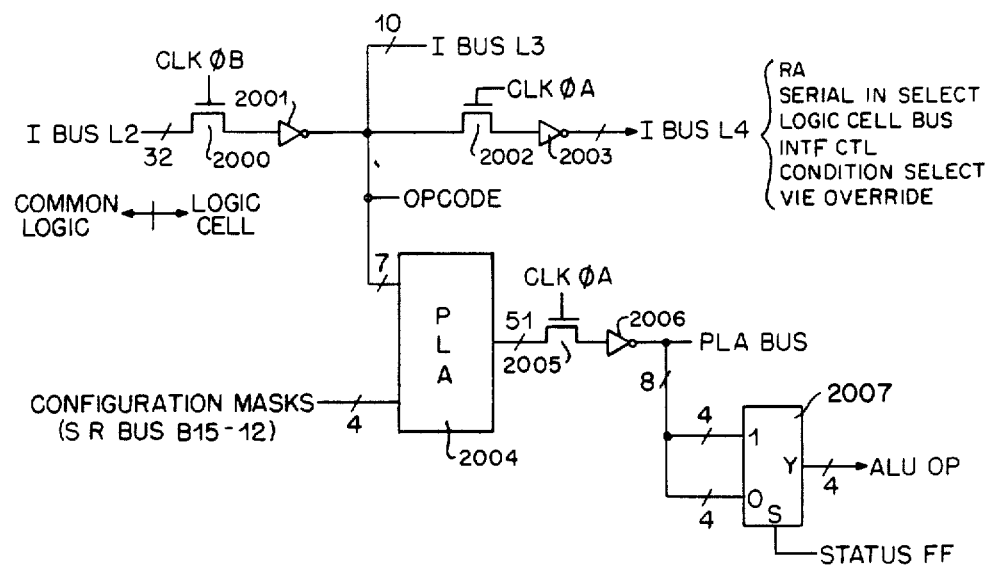
FIG. 15 is a block diagram showing a logic cell control logic block diagram.

Referring to FIG. 15, there is shown the logic cell control logic block diagram. I bus L2 from the common logic is received by a latch typified by a pass transistor 2000 and an inverter 2001 to produce I bus L3. I bus L3 goes to the multiport RAM address decoders of FIG. 24 as well as the PLA 2004 which receives the slice configuration masks and OP code bits. The many outputs of the PLA as listed in the table shown in FIG. 16 are latched as typified by pass transistor 2005 and inverter 2006 to produce the PLA bus. Eight of the bits of the PLA bus go into the multiplexer 2007 to produce ALU OP under control of the status flip flop.

For the instructions that are not sensitive to this status flip flop as simple Boolean operations, the status flip flop is a don't care in which case the inputs to the multiplexer 2007 contains two sets of four identical bits. If the status flip flop is important then input 0 has the case for status flip flop false and input 1 has the case for the status flip flop true.

The ALU OP goes to the ALU 302 in FIG. 2. Some of the I bus L3 bits contain neither the OP code nor the multiport RAM address and pass through latch comprised of 2002 and inverter 2003 so that they are delayed by the same amount as those bits passing through the PLA 2004 and the MPR address decoders.

Figure 17:
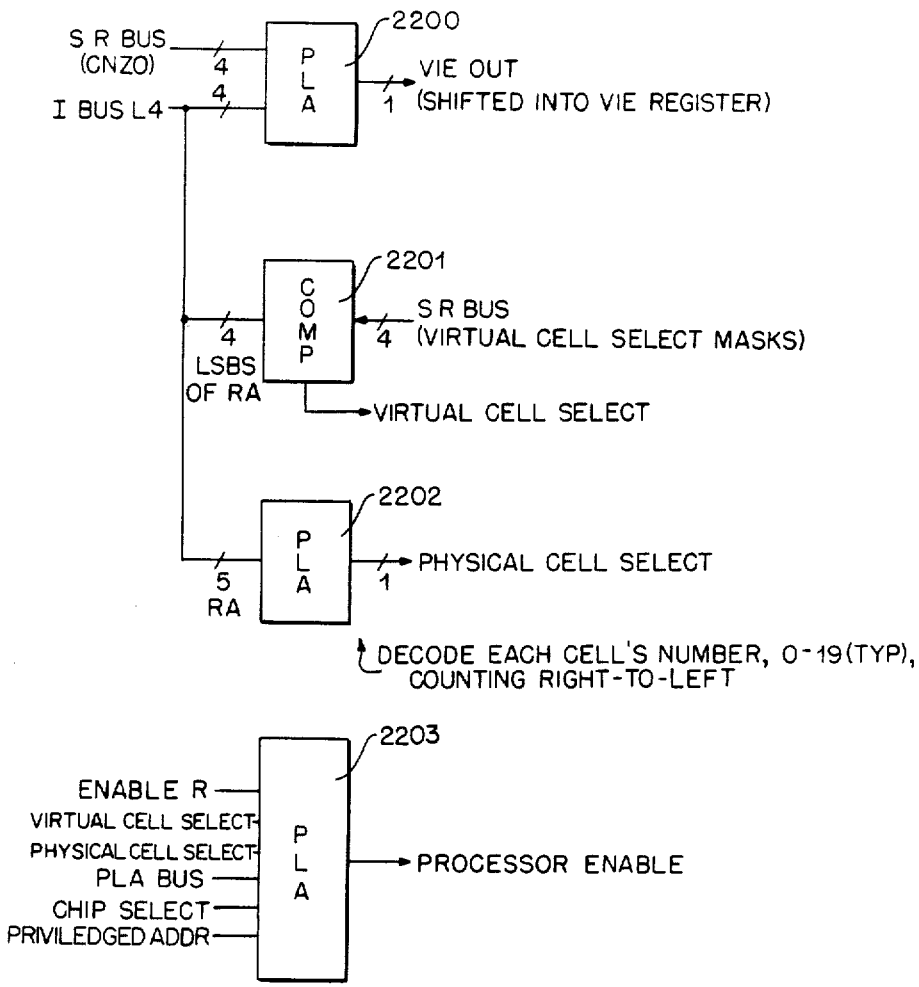
FIG. 17 is a block diagram showing logic cell enable logic.

FIG. 17 shows the processor enable logic. The PLA 2200 receives the status register bus conveying the carry, negative, zero and overflow bits (C, N, Z, O) as well as I bus L4 conveying the four least significant bits of the Read Address. This PLA 2200 produces the single bit VIE output where the condition select bits are used to choose any one of the 16 conditions defined by the status register bits. When the condition is true, the VIE output is false since the VIE logic maintains a processor active when the VIE register contains all zeros as detected by the ALU zero logic.

The VIE out signal is received by multiplexer 5309 in the ALU path MUXES as will be shown in detail in FIG. 28. The comparator 2201 produces the virtual cell select signal matching the four least significant bits of RA against the four status register bus bits that convey the virtual cell select mask. This signal is used variously as by the write enable logic. The PLA 2202 receives the five RA bits and produces the physical cell select signal which is also used by the write enable logic. This PLA 2202 is the only circuit that differs from cell to cell and produces a linear cell decoding where the right most cell is decoded as zero and ascending cell by cell through 1, 2, 3 and so on. This function is used for chip initialization using the reconfiguration instruction so that a particular cell may be configured to a particular slice.

The PLA 2203 produces the Processor Enable signal. It controls writing into the cell's local memory and MPR. Its truth table is shown is the figure.

Figure 18:
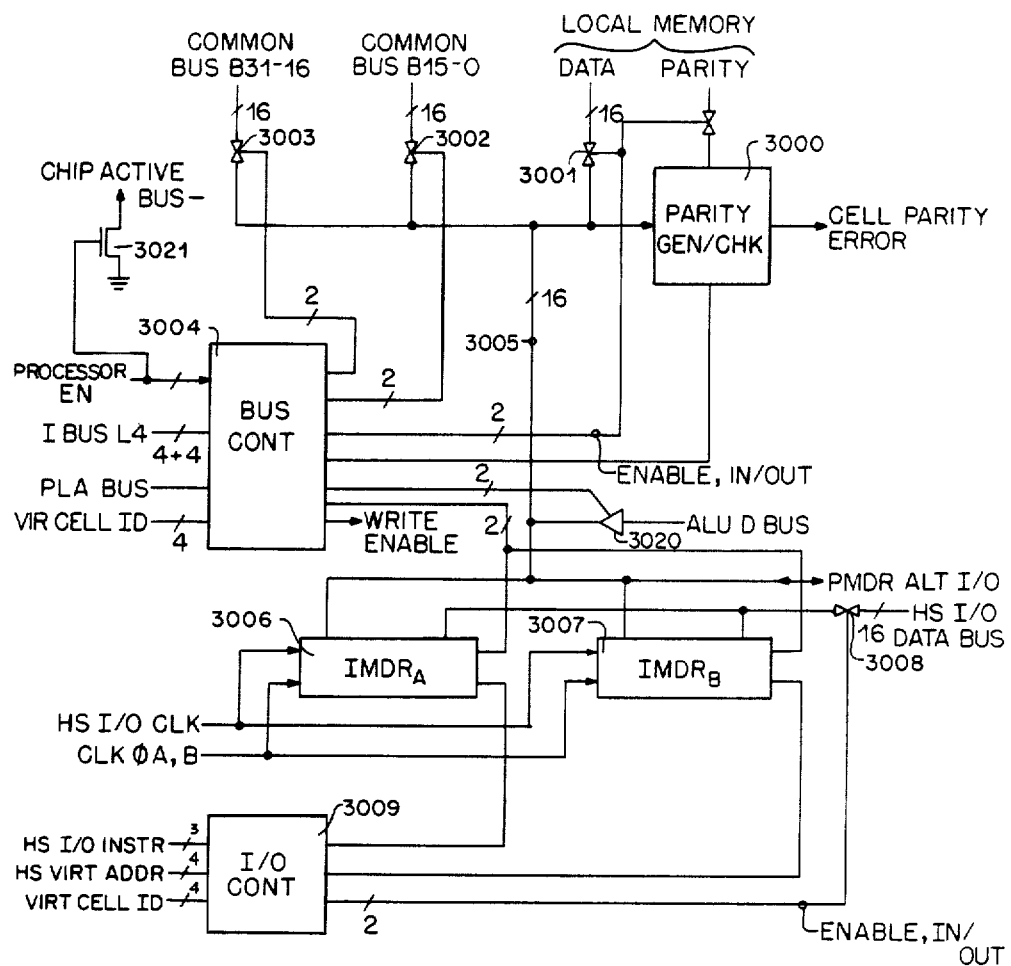
FIG. 18 is a block diagram showing a logic cell bus interface.

Referring to FIG. 18, there is shown a block diagram of the logic cell bus interface. This logic connects the cell to the 32 bit common bus, the 16-bit local memory bus and the 16-bit high speed I/O Data bus. The cell memory bus 3005, which is the PMDR alternate I/O bus, is connected to the common bus bits 31 to 16 through transceiver 3003 or common bus bits 15 to 0 through transceiver 3002. The selection of which transceiver to use is made by the bus control 3004 under control of the horizontal masks as reflected in the PLA bus. An even slice as bit 0 to 15 in a 32 bit word is connected to the 16 least significant bits of the common bus through transceiver 3002. An odd slice as bit 16 to 31 is connected to common bus bits 31 to 16 through transceiver 3003. Sixteen bit even slices MILE connect to common bus bits 15 to 0, and 16 bit odd slices as MILO connect to common bus bits 31 to 16.

Figure 23:
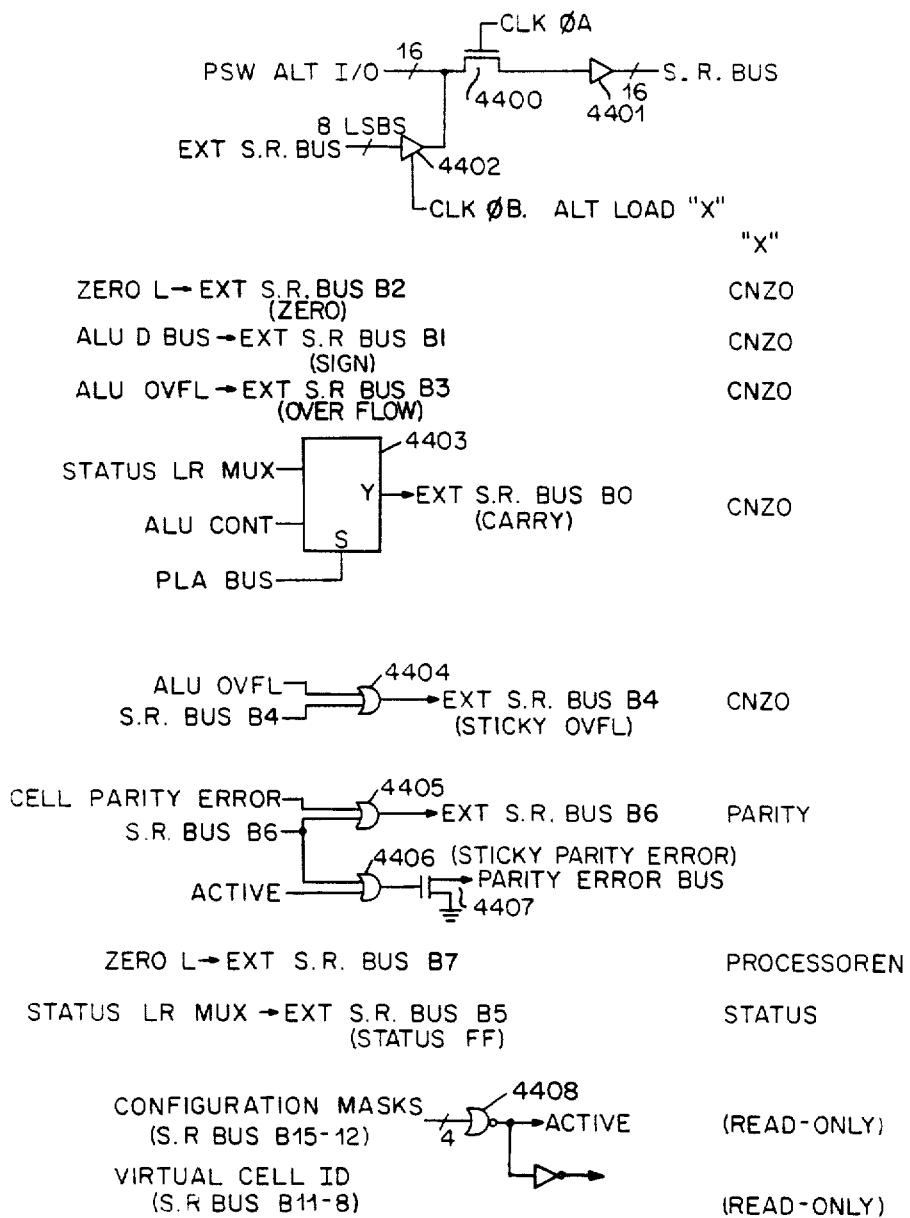
FIG. 23 is a block diagram showing status register alternate inputs.

The local memory data is connected to the bus 3005 through transceiver 3001. Data being received from the local memory is checked for parity by the parity generator/checker 3000. In the event a parity error is detected, the cell parity error signal is asserted, being captured by the sticky parity error flip flop which is shown in FIG. 23. The parity generator checker is of a conventional design as having a tree of exclusive OR gates to check for odd parity. The interface to the high speed I/O data bus through transceiver 3008 is double buffered. Registers IMDRA 3006 and IMDRB 3007 are under control of the I/O controller 3009.

The double buffer allows for reception of one vector of I/O data while the previous vector is being sent to or received from the local memory. In addition, since the I/O MDR's 3006 and 3007 have access to the PMDR alternate I/O bus 3005, which may be connected to the common bus, data is loaded into these registers from external memory when it is being referenced in a shared bus (time division multiplex) fashion.

The functions of the Bus Control 300 Fare are shown in FIG. 87. The functions of the I/O controller 3009 are shown in FIG. 86.

Buffer 3020 is used to pass the ALU D Bus directly to the common bus via buffer 3002 on 3003, avoiding the PMDR. This is useful in address operations where in a single cycle, an address may be computed by the address cells and be passed to the local memory being stored in the new address and column address registers.

The external memory is connected to any of the X, Y or Z buses and addressing is provided by the two cells that cooperate together to form the address generator.

Figure 19:
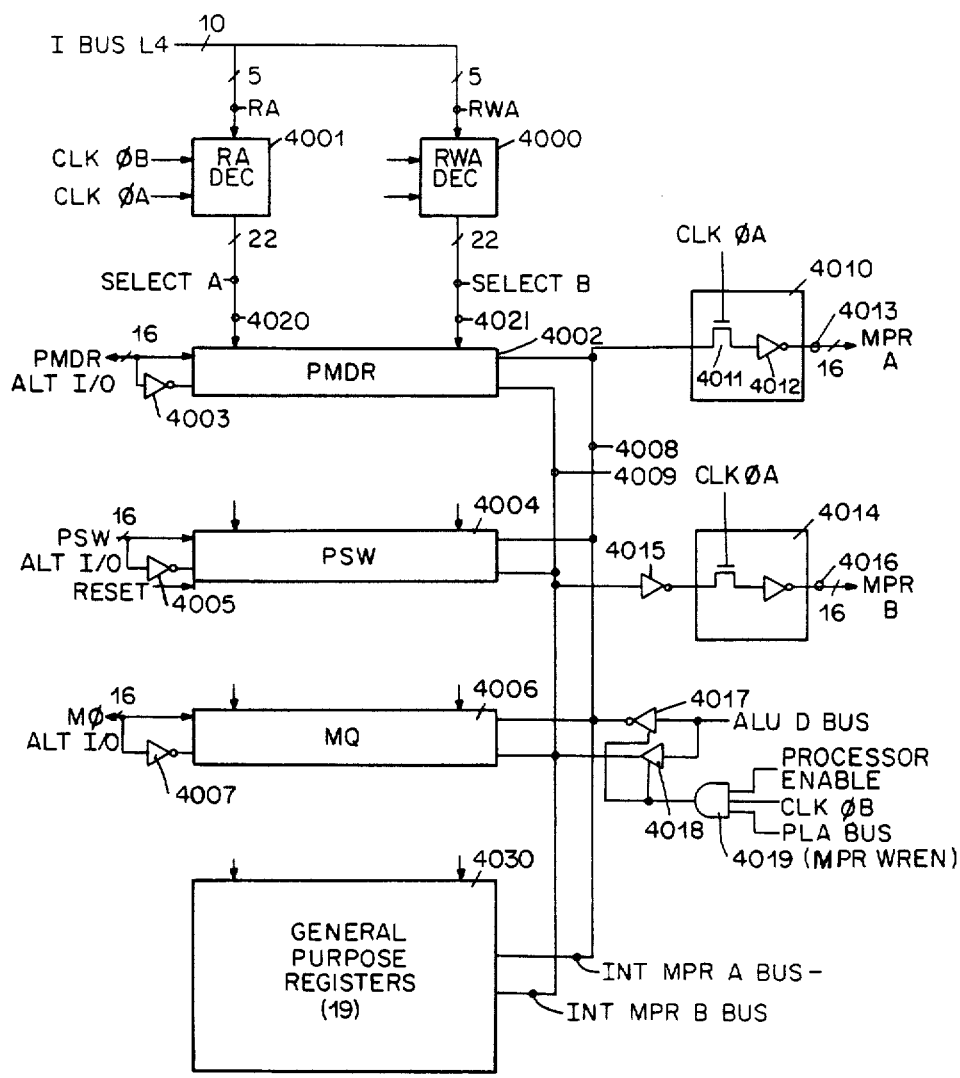
FIG. 19 is a block diagram showing a multiport RAM.

Referring to FIG. 19 there is shown a block diagram of the multiport RAM. The I bus L3 is received by decoders 4001 and 4000. The Read Address (RA) is received by the RA decoder 4001 producing the 22 select A lines at 4020. The Read/Write Address (RWA) is decoded by RWA decoder 4000 producing the 22 select B lines at 4021. These lines are received by the PMDR 4002, the PSW 4004, MQ 4006 and the general purpose registers 4030.

The select A lines choose a single row of the memory, one of the 22 locations, to drive the INT MPRA-bus 4008. Select B lines select one of the 22 rows to drive the INT MPRB bus 4009. The location is latched by the inverting latch 4010 to produce the MPRA output 4013 and the read/write location is latched by the inverting latch 4014 to produce MPRB at 4016.

Each inverting latch consists of a pass transistor 4011 and inverter 4012 as in latch 4014. The latch 4014 latches the data in the early portion of the cycle under the control of clock phase A since during the later portion of the cycle the data will be modified by buffer 4018 and inverting buffer 4017 under control of AND gate 4019.

The storage cell for the memory as will be explained further is static requiring both a true and false input and inversely providing a true and false output. Inverter 4015 complements the true output on 4009 so that the output of the latch 4014 is true. The PMDR has PMDR ALT (Alternate) I/O signals, each bit utilizing an inverter as 4003 in addition to the operation under control of the Read Address and the Read/Write Address. Similarly, the PSW has the PSW ALT I/O received by inverter 4005 for writing.

MQ has an external input, MQ ALT I/O using inverter 4007 for writing. In addition, the PSW may be directly reset so that the slice configuration bits assume the inactive state at initialization time.

FIG. 20 is a diagram of the static memory cells with FIG. 20A pertaining to the MPR case wherein no alternate inputs are applied. FIG. 20A applies for the 15 general purpose registers and the four system general purpose registers. A conventional six transistor static memory cell design is employed in order to minimize power dissipation and provide for clockless storage. A pair of cross connected inverters 4101 and 4102 provide the basic cell.

Inverter 4102 provides the Q or true output and inverter 4101 provides the Q bar or false output. The pullups on each of these inverters are of medium impedance so that an output may be pulled down by the relatively low impedance series input transistors 4100 and 4103 in order to write data into the cell. It is important to note that the provision of a static cell wherein both data in 4104 and data bar on 4105 must be presented to the cell for writing and provides an ideal means of implementing an MPR since in such an MPR two different outputs are required. Therefore, during clock phase A, one of the lines as 4104 is used in conjunction with the Read/Write Address decoder to provide the MPR B output and the signal line 4105 is used in conjunction with the read/address decoder to provide the MPR A. These outputs are stored in a latch during clock phase A. During clock phase B, the two signal lines 4104 and 4105 are used with the Read/Write Address decoder and clock phase B to write data and data bar into the selected cell. Thus only two signals are required for both reading and writing the MPR in contrast to other designs where two lines are used for outputting and a third line is used for inputting which further increases the amount of memory decoding logic that is required to implement an MPR.

The pass transistors 4100 and 4103 are of relatively low impedance compared to the pullup transistors in 4100 and 4102 so that a logic zero may be passed into the cell.

FIG. 20B shows a typical storage bit for use with the MQ register, the PSW register and the PMDR. In these three cases, not only must the register be accessible according to the Read Address and the Read/Write Address but additional inputs must be accepted while other locations are being accessed in the MPR. The basic storage cell is composed of cross coupled inverters 4110 and 4111 with pass transistors 4113 and 4114 connecting to the MPR A bar and MPR B buses on 4118 and 4119.

In addition, a direct reset by a transistor 4112 and the reset signal 4120 is provided for use only with the processor status word which contains the configuration bits which must be set to zero for an inactive slice. In this way the reset signal forces all cells into the inactive state which disconnects them from all buses so they will not interfere with each other. Alternate inputs to the bit cell are provided through transistors 4115 and 4116 according to the ALT I/O input 4123. The flip flop operation is provided with conjunction inverter 4117 so that when the ALT strobe lines 4122 and 4121 are both asserted, the data from signal pin 4123 will be written into the cell. Data may also be read out of the cell nondestructively by asserting 4122 wherein data will flow out of the cell and unto the ALT I/O line 4123.

This minimizes the number of wires going to the cell, that is one wire for a bidirectional bus rather than one wire for input and a separate wire for output. Thus in both cases shown in FIGS. 20A and 20B, use is made for the pair of wires going to the cell so that one could either obtain outputs from two diverse locations or write into a single location using both lines in the case of FIG. 20A or in the case of FIG. 20B using a single line to both send and receive data to a particular location instead of a multiplicity of locations.

Figure 20C:
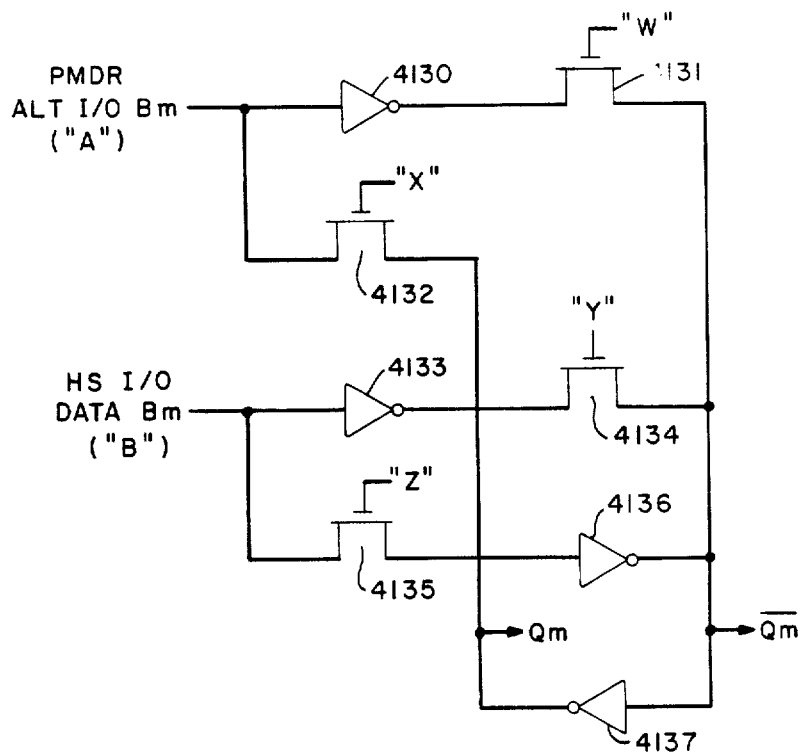

FIG. 20C shows the structure of the IMDR. A static flipflop is composed of inverters 4136 and 4137. Data may be entered or read by two sources PMDR Alt I/O and HS I/O Data. The instruction sequencer must ensure that only a single write operation is performed at a time. FIG. 86 describes the functions controlling the read/write transistors 4132 and 4135, and the write transistors 4131 and 4134.

Referring to FIG. 21, there is shown a list of the processor status word bit usage. The status register occupies five bits. There is a carry flip flop which typically stores the carry output from the ALU in the most significant bit in the most significant slice of the ALU. The negative flip flop stores the most significant bit of the ALU output in the slice. The zero flip flop determines whether or not the accumulated result is zero. The overflow flip flop receives the overflow output from the most significant bit in the most significant slice. The sticky overflow flip flop stores the OR of itself and the overflow output from the most significant bit of the slice. The Carry, Negative, Zero and Overflow flip flops may be changed with every arithmetic instruction, but the sticky overflow flip flop is only cleared by loading the bit with zero on the software control, in which case a sequence of calculations may be done and then the sticky overflow flip flop may be interrogated to see if any of them had an output that overflowed rather than having to check the overflow flip flop after every instruction.

These five status bits are only valid in the most significant slice of the word. They are generated in all slices which store the accumulated result across the slices of the word up to that point and therefore should be ignored. The 4-bit virtual cell identification is loaded along with the configuration masks at system initialization so that the application program may communicate directly with any one of the sixteen active data processors. Since there is only a single 32-bit address generator composed of two 16-bit processors on a chip, there is no ambiguity within a chip as to which address cells are being communicated with. There are four configuration masks whose states will be described in regard to the next Figure.

In addition there is a processor enable which is controlled by the vector IF/ELSE logic. If this bit is true, then storage in the cell may be updated during an instruction, although the storage associated with the vector IF/ELSE logic is updated regardless of the state of this bit. The sticky parity error bit is set whenever data is received by the cell that contains a parity error, and this bit is the OR of itself and the parity error bit so that once set, it will remain stuck until cleared by the program or loading the PSW. While any sticky parity error bit is set, the parity error flag at the output of the chip will be set.

Referring to FIG. 22, there is a listing of the slice types and their assignments to the common bus. There are eleven data masks and two address mask states. It will be noted that the virtual cell ID, configuration masks and processor enable bit of the processor enable word are independent of the state of the processor enable so that they can be modified regardless of the activity of the processor. The usage of the configuration states is as follows:

1. Inactive Slice—The initial state of the configuration masks is inactive. This state is set as a consequence of asserting the reset input to the chip and results in the processor cell disconnecting from the common bus 250 of FIG. 1 as well as being invisible to the horizontal flow of information on the paths (308, 307, 311, and 312 in FIG. 2).

2. Data Least Significant Slice/Least Significant Processor—The DLSS/LSP state configures a slice to contain bit zero of a word regardless of whether the word will be used with either fixed point or floating point arithmetic. In addition, the processor breaks the status path to begin the find operation.

3. Data Least Significant Slice (DLSS)—The DLSS state configures the slice to contain bit zero of the word regardless of whether the word will be used with either fixed point or floating point arithmetic. In addition, the processor breaks the status path to begin the find operation. The DISSO slice contains those bits as 32 to 47 for words greater than 32 bits. Any number of intermediate significant slice odd and even states may be configured between a least significant slice and a most significant slice.

4. Most-Intermediate-Least Odd/Least Significant Processors Slice (MILO/LSP)—The MILO/LSP state provides a 16-bit processor containing the most significant, the intermediate significant, and the least significant portions of a word. Common bus bits 16 to 31 are used. In addition, the processor breaks the status path to begin the find operation.

5. Most-Intermediate-Least Even/Least Significant Processor Slice (MILE/LSP)—This state provides a 16-bit processor containing the most significant, the intermediate significant, and the least significant portions of a word, common bus bits zero to 15 are used. In addition the processor breaks the status path to begin the find operation.

6. Most-Intermediate/Least Odd Slice (MILO)—This state provides a 16-bit processor containing the most significant, the intermediate significant and the least significant portions of a word. Common bus bits 16 to 31 are used.

7. Most/Intermediate/Least Even Slice (MILE)—This state provides a 16-bit processor containing the most significant, the intermediate significant and the least significant portions of a word. Common bus bits zero to 15 are used.

8. Data Intermediate Significant Slice Odd (DISSO)—The DISSO slice contains those bits as 32 to 47 for words greater than 32 bits. Both fixed point and floating point operations are supported.

9. Data Intermediate Significant Slice Even (DISSE)—The DISSE contains those bits as 48 to 63 for words greater than 32 bits. Any number of intermediate significant slice odd/even states may be configured in a data least significant slice and a data most significant slice. Both fixed point and floating point operations are supported.

10. Data Most Significant Slice Single Precision Floating Point (DMSS/SPFP)—The DMSS/SPFP slice provides the most significant slice for fixed operations as well the most significant slice for single point floating operations. A single precision floating point for the form described according to the IEEE convention whereas there is a single word having an 8-bit exponent and a 23-bit mantissa.

11. Most Significant Slice-Fixed and Double Precision Floating (MSS/DPFP)—The MSS/DPFP state provides the most significant slice for fixed point or the most significant slice for double precision floating point. Double precision floating point is also defined according to the IEEE convention providing a sign/magnitude mantissa sign bit plus a 15-bit exponent as well as a 48-bit mantissa. Fixed point arithmetic may be done with either of the most significant slice status, but only two floating point formats are specifically defined. In principle, greater precision floating point arithmetic may be obtained by using more than four slices although the largest number of exponent bits that may be obtained is according to the format for double precision floating point.

12. Address Least Significant Slice (ALSS)—The previous five states apply only to the data processors. The ALSS or address least significant slice configures a slice to be the lower half of the address generator.

13. Address Most Significant Slice (AMSS)—The AMSS slice configures a slice to be the upper half of the 32-bit address generator. Slices configured to be address generators also support single precision floating point arithmetic although it is considered unlikely that they would need it since addresses go out to memory in fixed point representation.

Referring to FIG. 23, there is shown the status register alternate inputs. Each of the bits of the status register ALT I/O is received by a latch. Each latch contains a pass transistor 4400 clocked by clock phase A and a buffer as 4401 to produce the shift register bus (SR bus) output. Tri-state buffer 4402 clocked by clock phase B and alternate load X receives the external shift register bus and passes the data back to the status register via the I/O lines. X varies with the bit as shown since the bits are written in several groups. Multiplexer 4403 under control of the PLA bus select one of two inputs to be passed back to the carry flip flop. OR gate 4404 computes the sticky overflow bit. Or gate 4405 computes the cell sticky parity error. In addition, the sticky parity bit is gated with Active by AND gate 4406 to drive pull-down transistor 4407. This transistor drives the parity bus which is common to all of the cells to indicate a parity error off chip. NOR gate 4408 receives the four slice configuration mask bits to produce the not-active output which is used throughout the path logic.

FIG. 23 also shows the assignments for the other bits of the status register.

Figures 24, 24B:
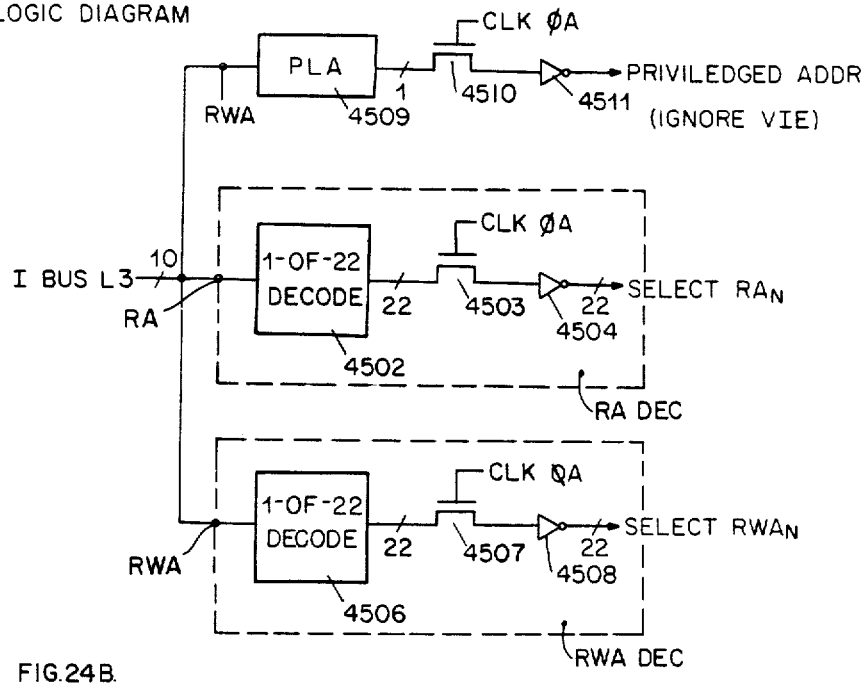
FIGS. 24A and B form a block diagram showing a multiport RAM address decoder.

Referring to FIG. 24-A, there is shown the multiport RAM address decoder. In FIG. 24-A, the logic block diagram is depicted. The I bus L3 is passed to a 1 of 22 decoder 4502 to decode the Read Address and to decoder 4506 to decode the Read/Write Address. The PLA 4509 decodes the privileged addresses which are loaded independently of processor enable. The decoders are of conventional design, each taking a 5-bit input and selecting 1 of 22 outputs. Each of the outputs is passed to a pass transistor 4503 followed by an inverter 4504 to produce the select signal so that it is available immediately at the beginning of the cycle. The multiport RAM may therefore be quickly accessed and its output processed by the ALU. This address decoding occurs concurrently with PLA operation as shown in FIG. 7 and the pipe lining of the address matches the pipe lining of the PLA operation so that they stay in phase.

In FIG. 24-B there is shown a memory map. The memory map indicates that there are 15 general purpose registers at addresses 1 to 15 plus the PMDR, PSW, the VIE and the MQ. The last three locations 19, 20 and 21 are temporaries which are used during instruction execution as floating point unpacking and are not considered available to the user. Only the PMDR and the 15 user general locations for a total of 16 registers are considered directly available to the user. The VIE register and one of the temporaries are typically allowed to be written into in the event that the processor is not active since the VIE register is updated independently from the processor activity state. One of 22 decoder 4506 decodes the Read/Write Address whose outputs are latched by pass transistors and inverters typified by 4507 and 4508 produce a select RWAN outputs. PLA 4509 also decodes the Read/Write Address with a single output being latched by transistor 4510 and inverter 4511 to produce the privileged address output. This PLA groups the locations of the multiport RAM into those that should not be written into if the processor is not active and those that may be written into if the processor is not active. No special hardware is required by the VIE register.

Figure 25:
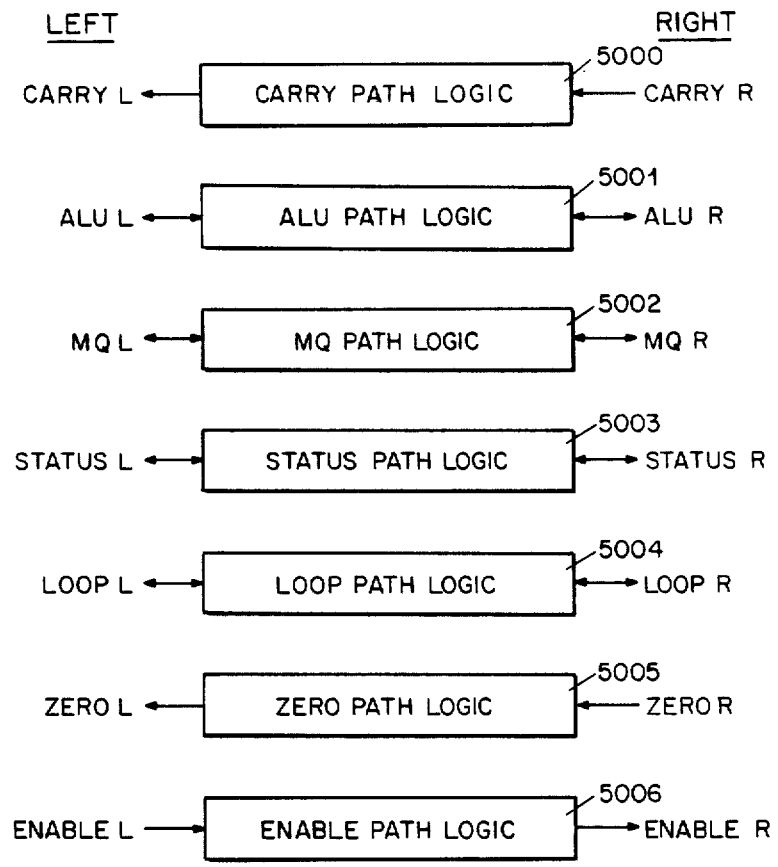
FIG. 25 is a series of block diagrams showing path logic overview.

FIG. 25 is a block diagram showing the path logic overview. There are seven paths implemented from the carry path logic 5000, the ALU path logic 5001, the MQ path logic 5002, the status path logic 5003, the loop path logic 5004, the zero path logic 5005, and the enable path logic 5006. Three of these paths, the carry, zero and enable are unidirectional. The other four are bidirectional with the direction of each being determined by each instruction. Each of these paths is controlled indirectly by the configuration bits, so that when a slice is inactive, the flow of information across these paths occurs as though the cell were not there. The cell thus becomes invisible to this data flow although a slight time delay is introduced.

FIG. 26A shows the multiplexers or MUXES for the unidirectional paths. In FIG. 26-A the carry path MUXES, the outward MUX is comprised of multiplexer 5100. This multiplexer 5100 has only two sources, carry right and ALU carry out to produce the carry left signal. The multiplexer is forced to transmit the carry right signal in the event the cell is inactive as determined by AND gate 5107. The inward MUX 5101 produces the ALU carry in input which emanates from a multiplicity of sources as shown in the figure. In addition the choice of those sources is under the control of the instruction bus in the case of the least significant slices as determined by the control logic which provides the PLA 5109. The bits of the PLA bus used throughout these descriptions is shown in FIG. 16.

In FIG. 26-B there is shown multiplexer 5102. It either passes the zero right signal, the zero right AND (5103) ALU zero or ALU zero to the zero left signal. The multiplexer is forced to pass zero right to zero left by AND gate 5104 in the event the cell is not active. The ALU zero signal is passed to zero left for least significant slice whereas the output of AND gate 5103 is passed to zero left if the slice is not the least significant slice.

FIG. 26-C shows the enable path MUX 5105 which passes enable left to enable right if a slice is inactive or if the slice is not the most significant slice. If the slice is active and is the most significant slice, then the processor enable flip flop is passed to enable right. AND gate 5106 forces the connection of enable left to enable right whenever the slice is not active.

FIG. 27 shows the ALU D-bus Muxes in the case where no floating point accelerator is implemented. MUX 5200 is typical for bits 1-14 in a slice. This multiplexer passes ALU C bus bit N to become ALU D bus bit N or passes the ALU C bus inputs to the immediate left or the immediate right of that bit to the ALU D bus. In addition, MQ bit N can be passed to the ALU D bus bit N. Multiplexer 5201 provides ALU D bus bit 0 and multiplexer 5202 provides ALU D bus bit 15. These last two multiplexers differ from the multiplexers typified by 5200 in that they are on the end of a word and therefore have special cases as inputs since the next bit to the right of a slice would be outside of a cell and the next bit beyond bit 15 would be to the left and therefore also outside of the cell.

FIG. 28 is a block diagram showing the ALU path MUXES. The collection of MUXES 5300 through 5307 may conceptually be represented as a single vertical input from the top, plus a left and right connection and vertical output. This concept is shown in the flow diagram as FIG. 36, reference 6404. At any given time, either multiplexer 5300 may provide an input to the multiplexer 5303 in order to drive the ALU left path or multiplexer 5304 may provide an input to provide multiplexer 5305 to drive the ALU right path. However, under no circumstances will both multiplexers 5303 and 5305 will be active, in which case there is in principle a single input either driving to the left or driving to the right. If the cell is active, then the PLA bus as received by AND gates 5301 and 5302 will choose one of the multiplexer outputs 5303 and 5305 to be active. If the cell is not active, then pass transistor 5306 will be turned on connecting the ALU left and the ALU right signals in bidirectional fashion so that data may be transmitted across the cell either from the left to the right or from the right to the left without having to have the control logic in a presumably defective cell operational to choose whether the information should flow from left to right or right to left.

Multiplexer 5303 may pass the left signal to the right signal in a non-modified fashion and likewise multiplexer 5303 will pass the right signal through to the left signal in an unmodified fashion. Buffers 5307 and 5308 provide the signals from left and right connections into the cell for internal use. These outputs are conceptually represented by signal output since they would not both be used simultaneously.

Multiplexer 5309, under control of the PLA bus, provides an input to the most significant bit of the ALU path. This input is used in various shift right operations as well as arithmetic shift lefts. Multiplexer 5311, under control of the I bus, allows a user to select one of four inputs to the most significant bit of the ALU paths for those instructions such as shift right that require it. Accordingly, multiplexer 5310, under control of the PLA bus provides the input to the least significant bit of the ALU path for those instructions where the user has control of the least significant bit. Multiplexer 5312, under the control of the I bus is selected by the PLA bus for transmission to the least significant bit of the ALU path.

Figure 29:
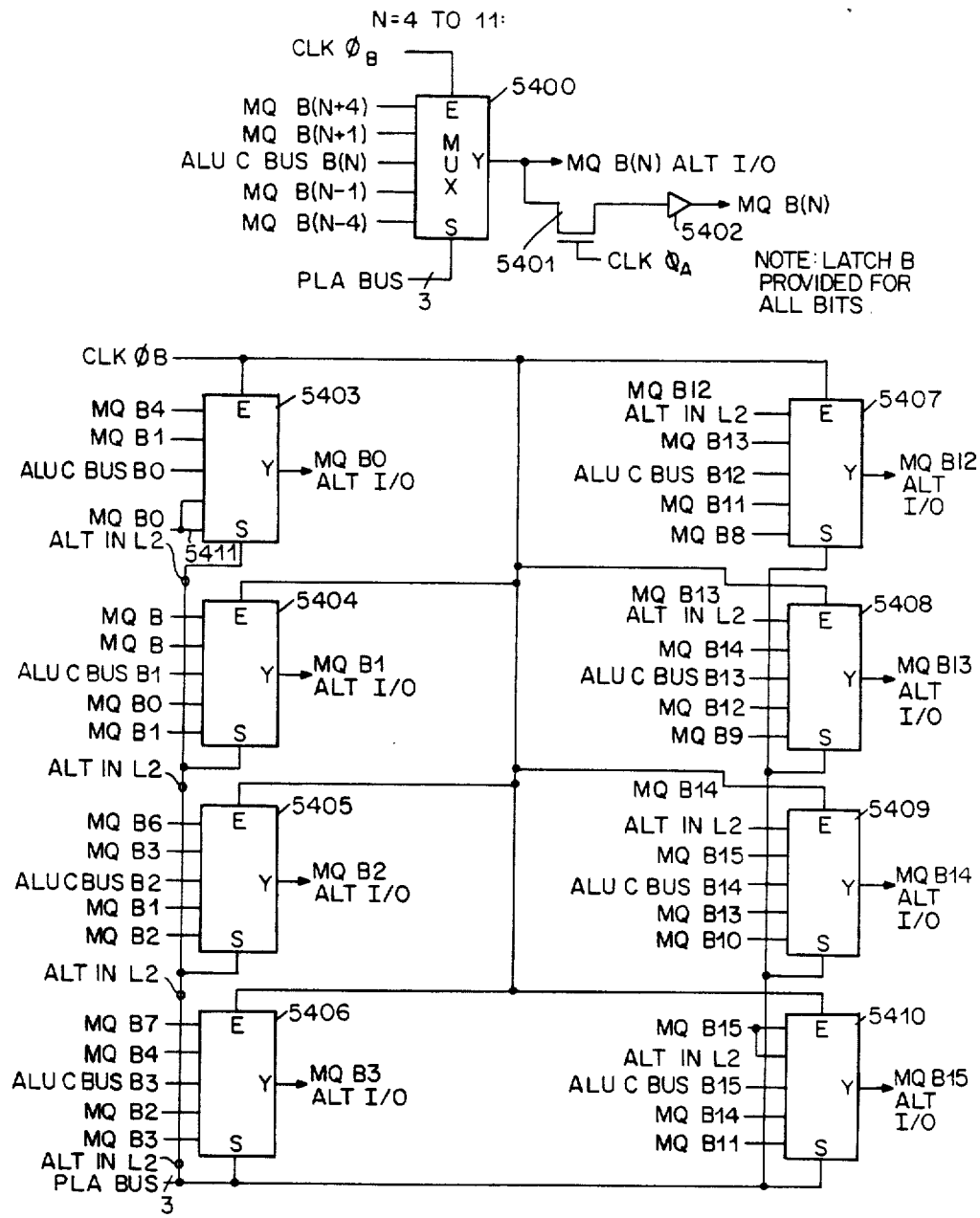
FIG. 29 is a block diagram showing the MQ alternate input multiplexers.

FIG. 29 shows the MQ alternate input Muxes for no floating point accelerator. MUX 5400 is typical for bits 4 to 11 and passes any one of four MQ bits to the output. In addition, ALT C bus bit N may be passed to MQ bit N. This multiplexer is tri-state in that there is a single bidirectional alternate input bus going to the MQ flip flops. The output of this multiplexer is enabled during the clock B phase of the cycle. The pass transistor 5401 and buffer 5402 sample the state of the MQ flip flop during the first phase, that is during the clock A phase of the cycle and the output of the buffer 5402 is used throughout the following multiplexers.

The purpose of multiplexer 5400 is to provide 1-bit left and right and 4-bit left and right shifts in the MQ paths. This is useful for interdata processor bit transfer as well as for normalization and denormalization in floating points. Multiplexers 5403 through 5410 show the handling of the four least significant bits and four most significant bits in a slice since these involve exceptional cases for obtaining bits even to the left or to the right of the cell. These exceptional bits such as the MQ bit 0 alternate input L2, as in 5411, come from the next Figure. It is also important to note that the latch is typified by 5401 and 5402 is provided at the output of all eight multiplexers as 5403 to 5410.

FIG. 29-A shows the MQ path multiplexers. The circuitry composed of elements 5500 through 5506 are considered to constitute to MQ multiplexer as 7802 in FIG. 45. The MQ path is relatively simple in that only MQ bit 15 may be passed to MQ left by multiplexer 5501 and only MQ bit 0 may be passed by multiplexer 5500 to MQ right. These multiplexers are enabled if the cell is active and one of them will be chosen by the PLA bus via AND gates 5502 and 55035. If the cell is not active, these multiplexer outputs will be disabled and pass transistor 5504 will connect MQ left and MQ right in a bidirectional fashion analogous to the ALU path logic. The MQ right and MQ left signals are buffered by buffers 5505 and 5506 for use internal to the cell. Inputs to the four most and four least significant bits of MQ are controlled by multiplexers 5507 through 5514 whose outputs pass through multiplexers 5403 through 5410 in FIG. 28.

Multiplexers 5507 through 5514 provide the usual end conditions to the MQ register. Inverter 5515 is used in certain of the divide instructions as will be explained.

Figure 30:
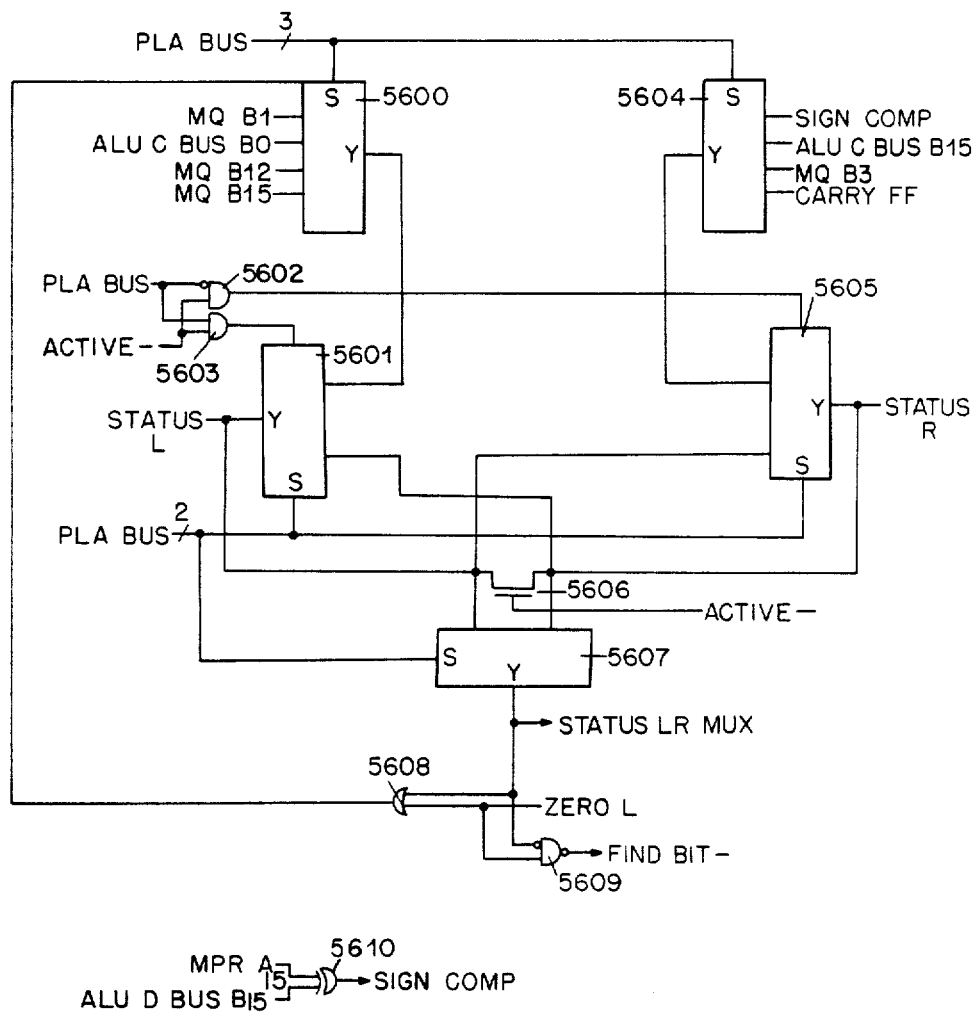
FIG. 30 is a block diagram showing the status path multiplexers.

Referring to FIG. 30, there is shown the status path Muxes or multiplexers. Multiplexer 5600 provides the signal that flows through multiplexers 5601 to be transmitted by status left and multiplexer 5604 provides a single as passed through multiplexer 5605 to be transmitted by status right. Either multiplexers 5601 or 5605 is enabled if the cell is active. The choice of which is active is determined by the PLA bus to AND gates 5602 and 5603. If the cell is inactive, these multiplexers are disabled and pass transistor 5606 is turned on via the ALU and MQ path. Multiplexer 5607 chooses either the status left or the status right signal to be passed on to the status LR MUX output which is connected to the input of the status flip flop among other destinations. The status path has a diversity of uses typically carrying the carry bit, multiplier bit or the sign compare for divide operation.

Figure 31:
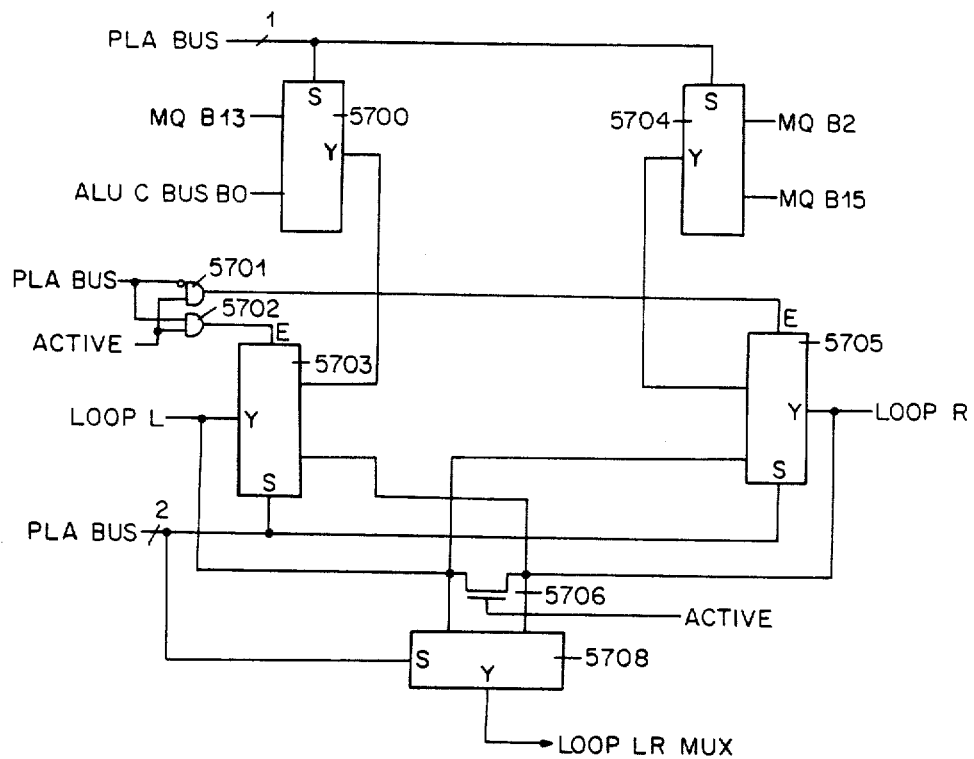
FIG. 31 is a block diagram showing the loop path multiplexers.

FIG. 31 shows the loop path Muxes. The operation of this circuit is analogous to the status path Muxes but there are fewer inputs that are to be passed onto the loop left and loop right paths. The loop path is generally used for connecting the extreme ends of the words together as in bits 0 and bit 31 and is therefore said to close the loop between the two sides. This is unlike the ALU path and MQ path which generally connect the near sides of two cells as between bits 15 and 16. Element 5700 through 5708 represent the loop path multiplexer 10806 in FIG. 72 where again multiplexers 5700 and 5704 may be construed to constitute the one out of four selector which is fed into both multiplexers 5703 and 5705 for transmission for either the loop left or loop right paths when, in fact, FIG. 31 has been optimized since two of the signals, MQ bit 13 and ALU C bus bit 0, only flow to the left and MQ bit 2 and MQ bit 15 only flow to the right. Therefore, a single bit from the PLA bus is sufficient to select one of two sources since only the left or the right will be active at one time rather than requiring two bits to select one out of four.

Figures 32, 33:
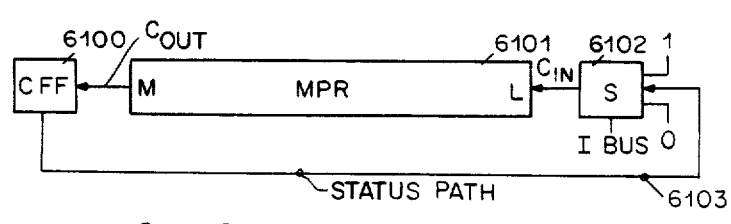
FIG. 32 is a table showing the ALU functions.
FIG. 33 is a block diagram showing a Boolean instruction path overview.

FIG. 32 shows the ALU functions in 16 Boolean instructions. These are the elementary functions of 0, 1 or 2 variables A and B which may be read simultaneously from the MPR.

FIG. 33 shows the 16 Boolean instruction path overview. The A and B operands are read from the MPR as chosen by the Read/Address and Read/Write Address. These operands are operated upon according to the ALU operation chosen and the carry-out is loaded into the carry flip flop 6100. The current state of the carry flip flop is passed via the loop path 6103 into the multiplexer 6102 as shown by S which is used to mean selector throughout the following Figures. This selector provides the carry in to the ALU, the destination being returned to the MPR 6101. The instruction bus may choose between a 0, 1 or carry flip flop input to carry in for those operations that are dependent upon carry-in.

Figure 34:
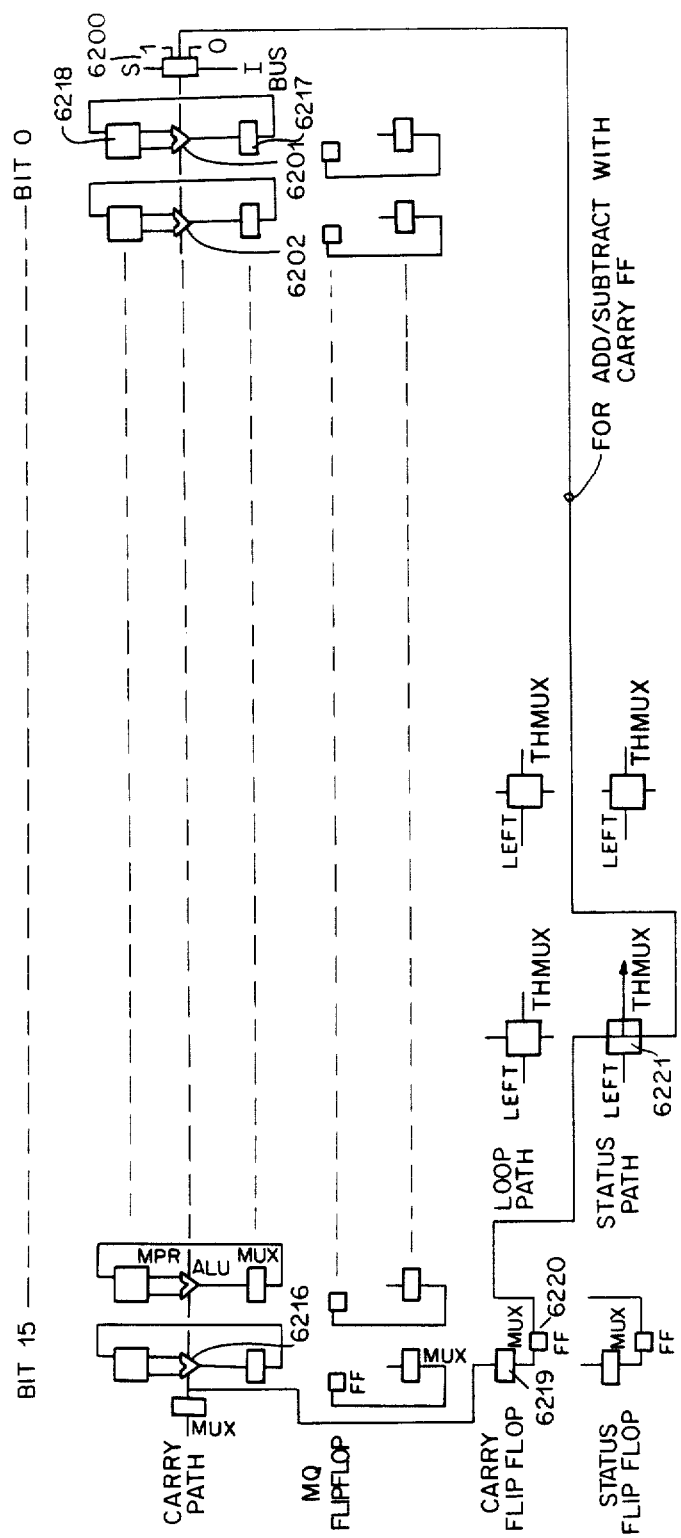
FIG. 34 is a block diagram showing the short Boolean instructions data paths.

FIG. 34 shows the 16 Boolean instructions path usage short. The carry input to the bit 0 of ALU 6201 is chosen by the selector 6200 under the control of the instruction bus. The operation defined by the ALU operation which is the same as the instruction bus is passed through the ALU D bus MUX as 6217 and written into the MPR 6218 which also provides the inputs to the ALU as 6201. The carry-out for the most significant ALU 6216 is passed through the carry input multiplexer 6219 and loaded into the carry flip flop 6220. The output of the carry flip flop is passed through the status path multiplexer 6221 where it is available at the right pin for testability and is also passed into the carry input MUX or selector 6200.

Figure 35:
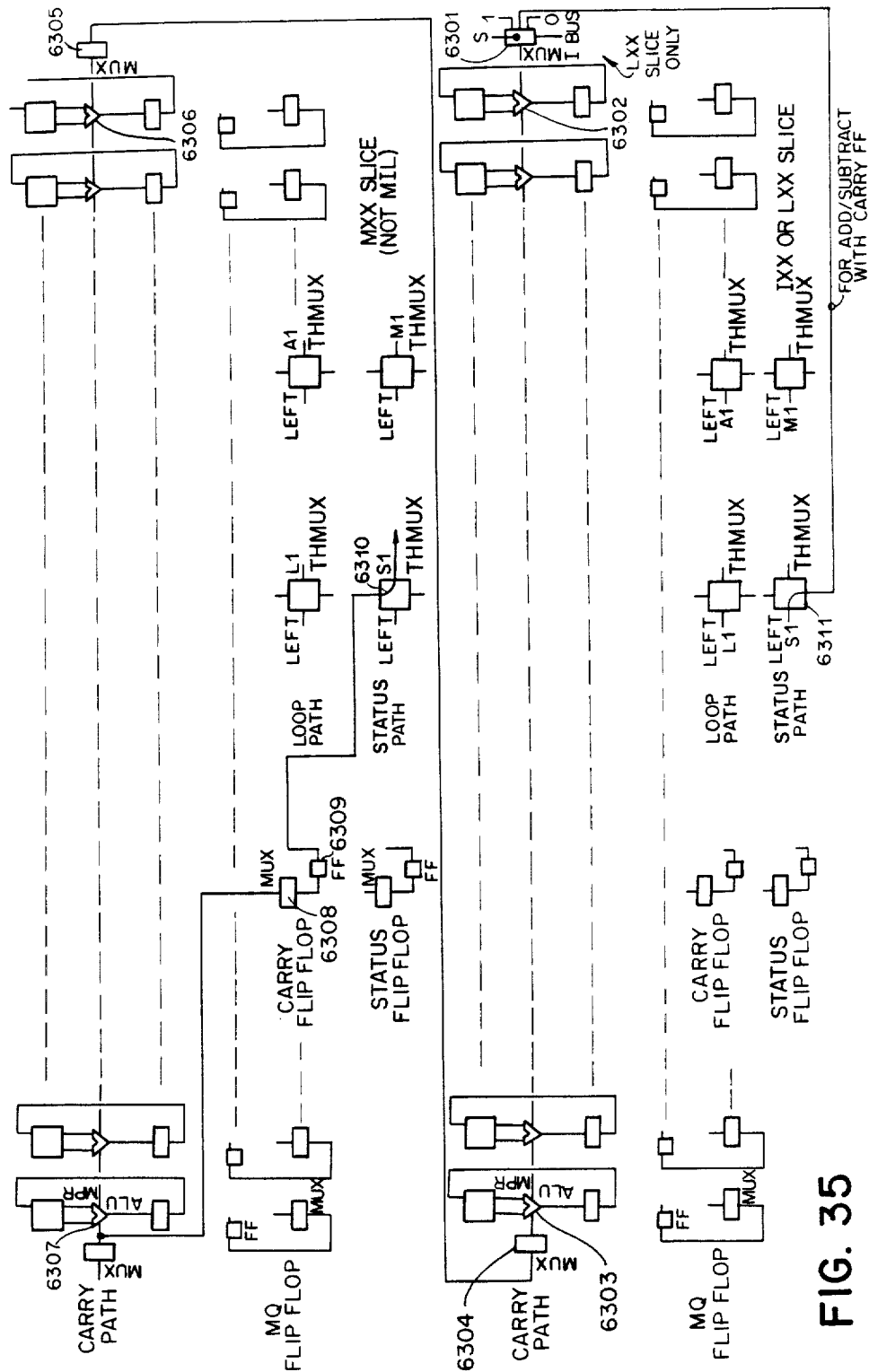
FIG. 35 is a block diagram showing the long Boolean instructions.

FIG. 35 shows the path usage for the 16 Boolean instructions long. A multiplicity of slices may be connected together. The S multiplexer 6301 which would be operational in any of the least significant slices provides a 0, 1 or the carry flip flop into the least significant ALU as 6302. The carry out of the most significant bit slice as from ALU 6303 is passed through the carry left multiplexer 6304 where it continues unto the carry right multiplexer 6305 of the next slice where its input to the least significant bit of the carry-in in that slice 6306. In the most significant slice, the output from the ALU 6307 is passed to the carry input multiplexer 6308 where it is input to the carry flip flop 6309 in the most significant slice. The output from the carry flip flop 6309 is input to the status path multiplexer 6310 where it is fed via the status right connection to the next slice at which point it becomes a loop left connection and multiplexer 6311 whose output provides the carry flip flop into the S multiplexer 6301.

Figure 36:
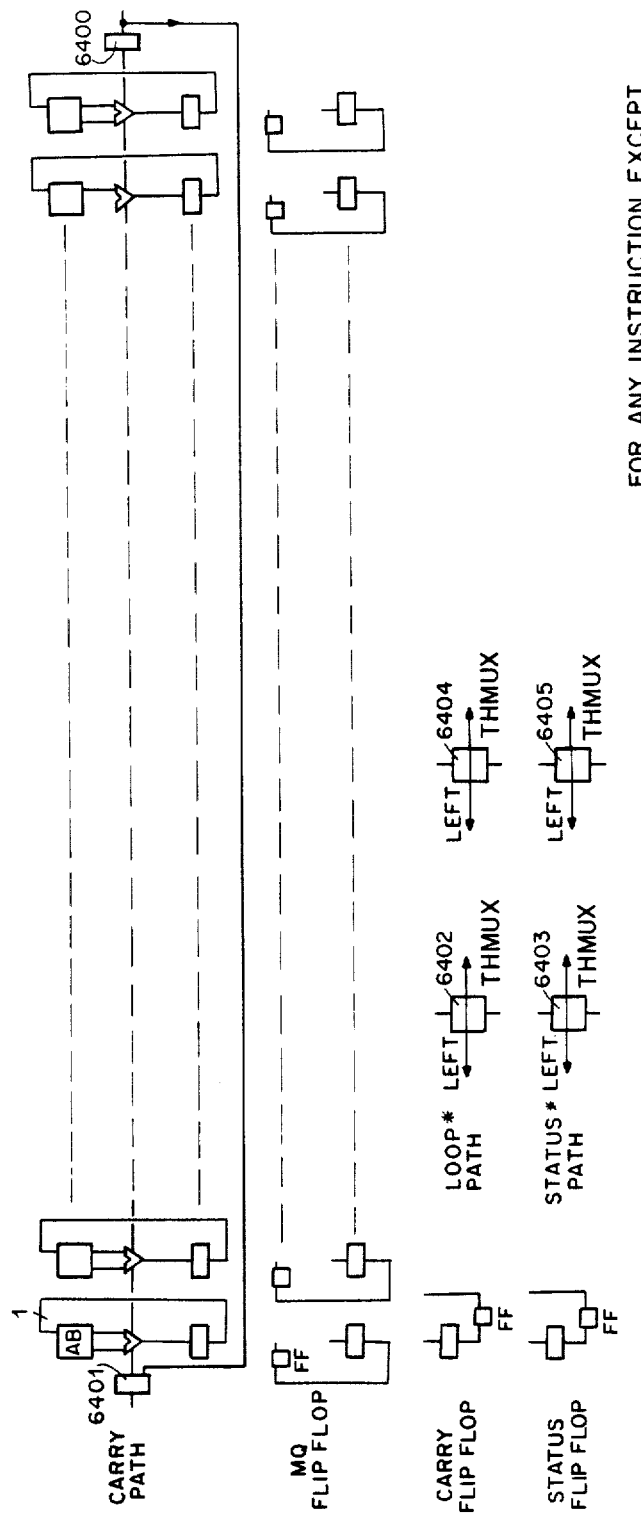
FIG. 36 is a block diagram showing inactive slice operation.

FIG. 36 shows the pass usage and inactive slices. The carry that comes into the carry right multiplexer 6400 goes directly to the carry out multiplexer 6401 bypassing the entire ALU. The loop path multiplexer 6402 as well as the status MQ and ALU multiplexers as 6403, 6404 and 6405 operate in a bidirectional mode wherein data passes either left or right or right to left across them independent of any operation of the cell. The path can also be passed from right to left and the enable path is bypassed from left to right for the zero path. The cell therefore becomes invisible to the flow of information across it.

Referring to FIG. 37, there is shown a list of the shift and rotate instructions. These instructions fall into the arithmetic or logic shift and rotate groups as do exchange and quadruple shifts. The process is construed as having that aggregate word size defined by the configuration bits and slices that it contains.

FIG. 38 shows the single word shift instruction path overview for right shifts. That is to say bit N goes towards N-1. In all cases, the contents of the MPR location addressed by the Read/Write Address is operated upon by the shift logic and loaded into the location in the MPR specified by the Read/Write Address. Thus, both a move and a shift may be obtained in a single operation for the right shifts which provide both arithmetic or logic shifts and rotates. The bit shift out of the least significant location of the operand is transferred via the loop path to the S multiplexer 7101.

Depending upon the I bus for the serial in select lines, the S multiplexer 7101 may provide either the most significant bit of the operand back into the most significant bit for a sign extend operation. Alternatively, the carry flip flop may be installed as a link operation between a collection of shifts. For a rotate, the least significant bit is fed back into the most significant bit. In addition a logic 0 may be shifted in for a logic shift. For a left shift, wherein bit N is moved to bit N+1, the most significant bit is entered into the carry flip flop 7105 and is moved via loop path to the S multiplexer 7103. Under control of the instruction bus, either a logic 0, a logic 1, or the bit shifted out of the top may be shifted into the least significant bit stored back into the multiport RAM 7104.

In the various MIL slices only, the carry flip flop is also available at the input to the S multiplexer 7103. For words longer than 16 bits, if one desired to place the carry flip flop into the least significant bit, one would have to perform a shift followed by an add placing a carry into the least significant bit and the add operation would in fact move the carry flip flop in the most significant slice into the least significant slice. But in the MIL slices, the carry flip flop is readily available.

Figure 39:
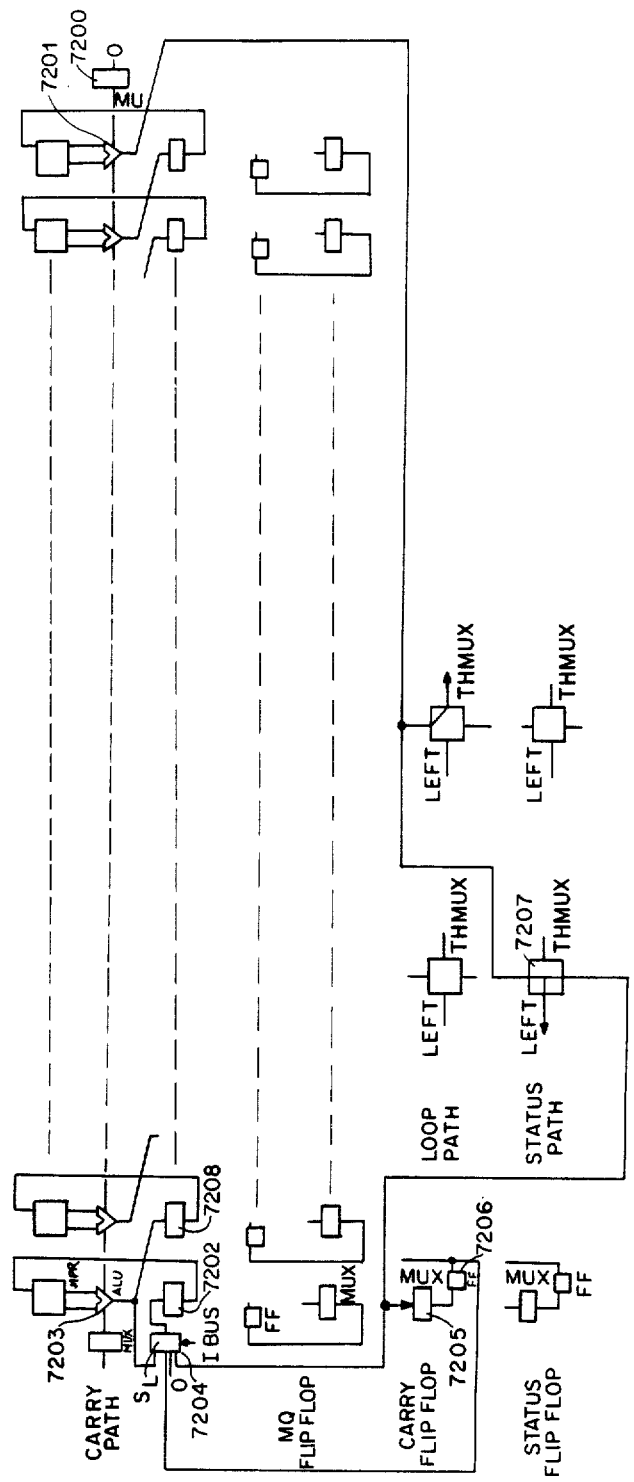
FIG. 39 is a block diagram showing arithmetic or logical shift or rotate right (short) data paths.

Referring to FIG. 39, there is shown the arithmetical logic shift or rotate right short. The ALU operation is A+CIN and carry in is forced to zero by multiplexer 7200. The ALU D bus multiplexer 7202 chooses the input 1 bit to the left so that the output of ALU 7203 which is bit 15 is taken into the bit 14 ALU D bus multiplexer 7208. The most significant bit is shifted in from the S multiplexer 7204 under control of the I bus, which selects from between the bit 15 ALU 7203, and carry flip flop 7206, and the status path multiplexer 7207 which provides the bit shifted out of the least significant ALU 7201.

Figure 40:
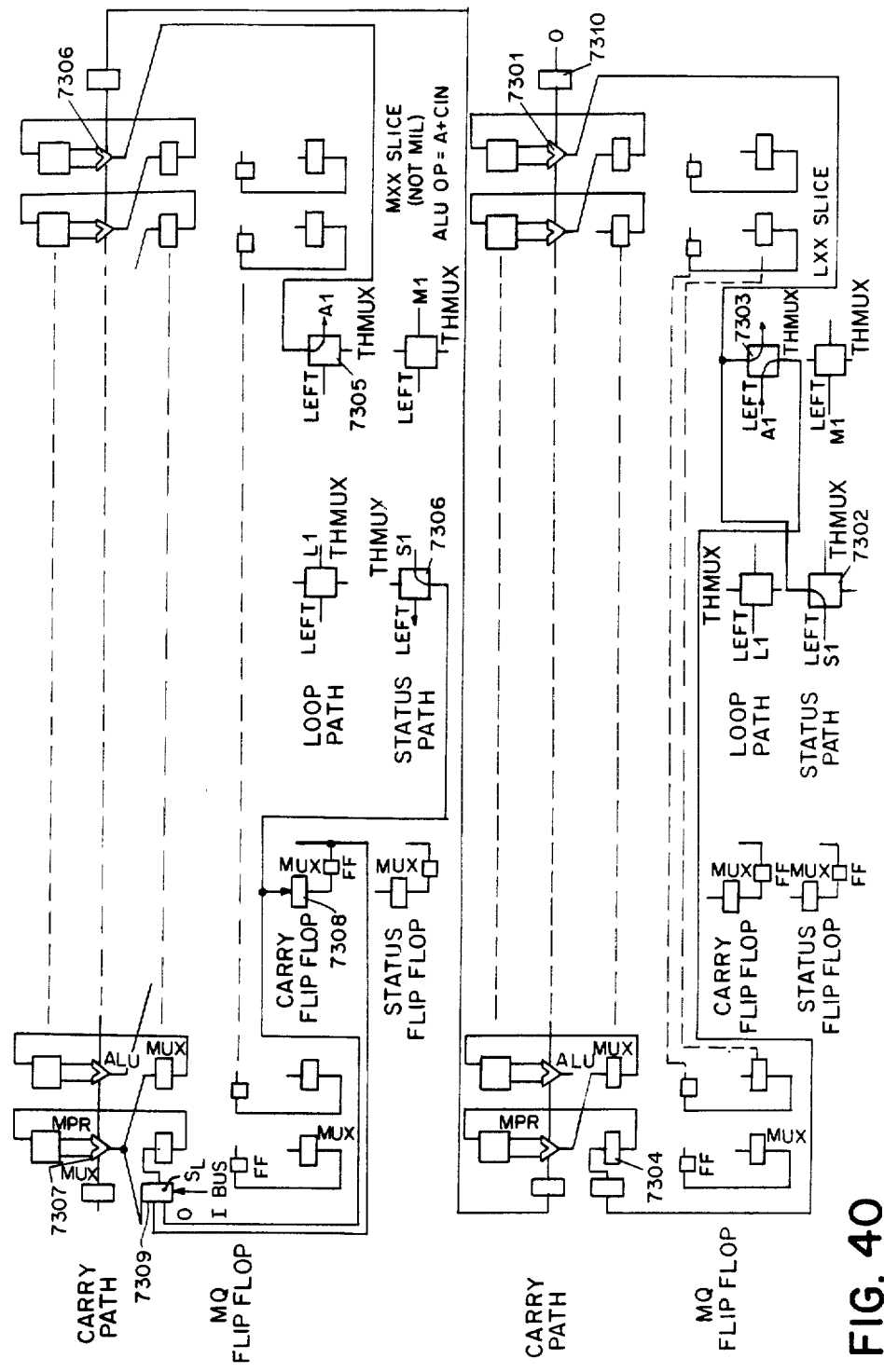
FIG. 40 is a block diagram showing arithmetic or logical shift or rotate right (long) data paths.

FIG. 40 shows the arithmetical logical shift or rotate right long. The operation is exactly the same as for the short operation except that the ALU path is tied together between the various slices. In the case of a 32 bit word, ALU bit 16 which is 7306 is tied via the ALU path multiplexer 7305 to pass a signal to the lesser significant slice, ALU path multiplexer 7303 which passes a signal into the bit 15 position at 7304. Likewise, the bit shifted out of the bit 0 ALU 7301 is passed through the status path multiplexer 7302 where it is received by the next most significant slice status path multiplexer 7306 and is passed to the carry flip flop input multiplexer 7308 and onto the S multiplexer 7309. Since the ALU operation is again A+CIN, a zero is forced into the least significant carry input through multiplexer 7310.

Figure 41:
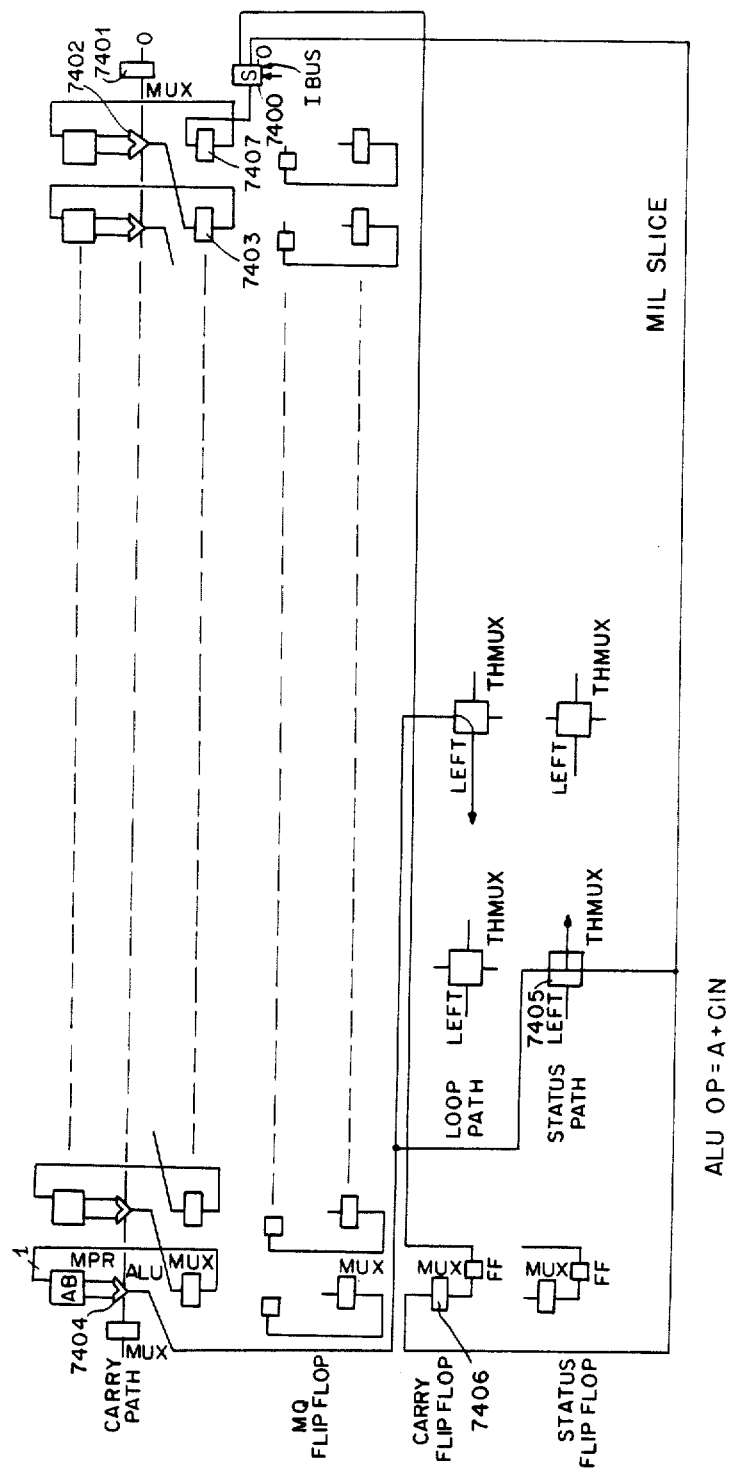
FIG. 41 is a block diagram showing logical shift or rotate left (short) data paths.

FIG. 41 shows the logical shift or rotate left short. The operation is the reverse of the logical shift or rotate right short. The output of the ALU bit 0 as 7402 is connected to the bit 1 ALU D bus multiplexer 7403 to provide the 1-bit shift left. The output from ALU bit 15 as 7404 is connected to the status path multiplexer 7405 whose output is taken into the carry flip flop input multiplexer 7406 and returned to the S multiplexer 7400 which is under control of the I bus from which is passed into the bit 0 ALU D bus multiplexer 7407.

Figure 42:
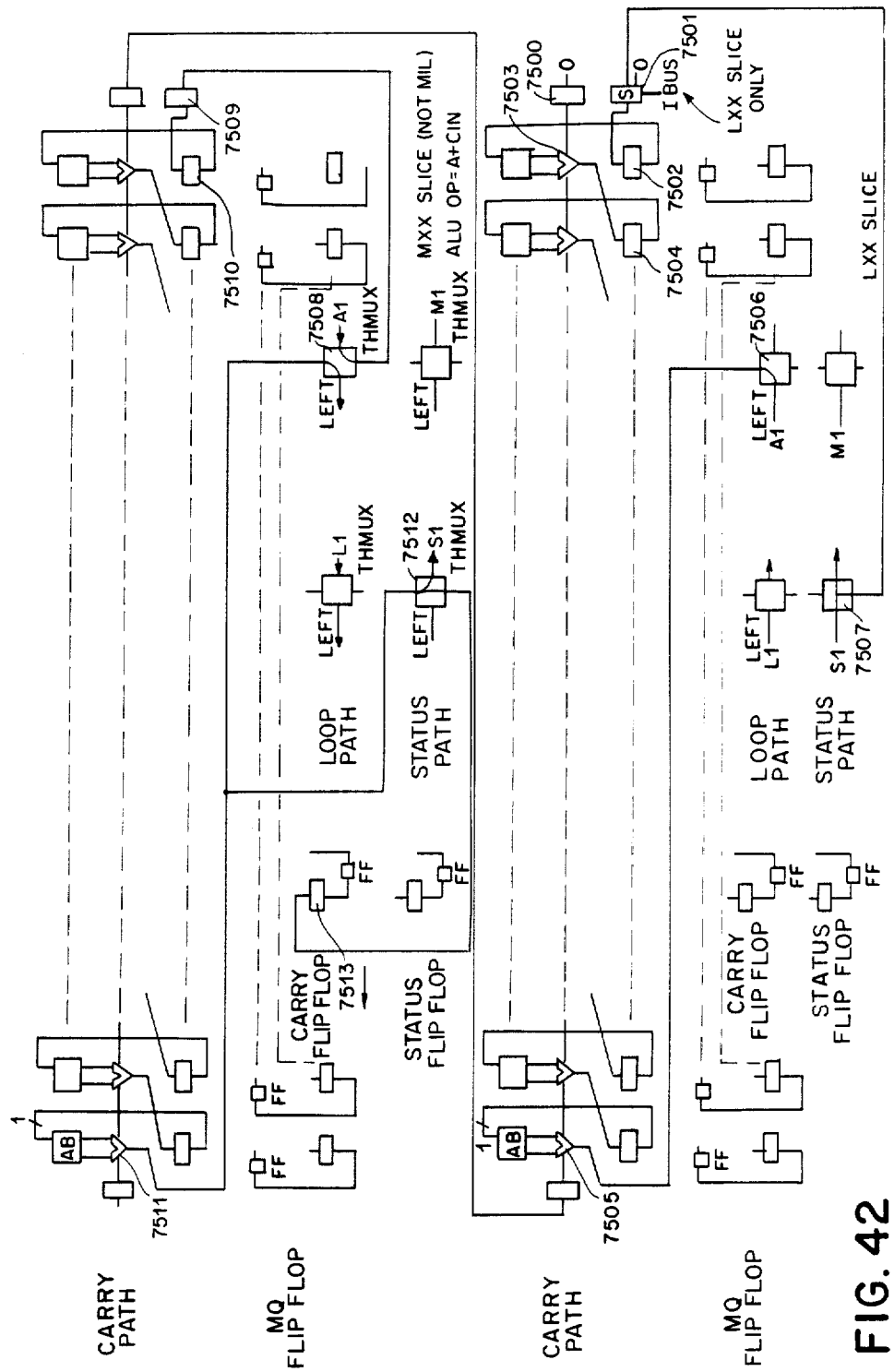
FIG. 42 is a block diagram showing logical shift or rotate left (long) data paths.

FIG. 42 shows the logical shift or rotate left (long), which shows the operation for two slices. An arbitrarily long word may be obtained by simply passing the ALU msb signal from 7511 through the status path multiplexer and onto the next slice to the right, with the last slice connecting the output of status path multiplexer 7507 into the selector 7501 for use with the bit 0 ALU D bus multiplexer 7502. The ALU operation is again A+CIN, so the 0 is forced into the least significant bit of the carry chain through multiplexer 7500 and into the bit 0 ALU 7503. The ALU outputs are shifted 1 bit to the left as from ALU 7503 to ALU D bus multiplexer 7504.

The ALU connections across slices are handled by the ALU multiplexer as from ALU 7505 to multiplexer 7506 where it is fed into the next multiplexer at 7508 and then is inputted to the ALU D bus multiplexer 7510 through multiplexer 7509. The most significant ALU output 7511 is fed to the most significant carry flip flop through multiplexer 7513.

FIG. 43 shows a double word shift instruction path overview for the double arithmetic or logic shift or rotate right. An operand is moved from the MPR shifted one bit to the right. The least significant bit coming out of the MPR is transferred via the loop path to the most significant bit of the MQ register 7601. The least significant bit of the MQ register is transferred via the status path to the selector multiplexer 7602 which is under control of the I bus. The S multiplexer may pass logic zero. The most significant bit of the MPR, the carry flip flop 7603, or the MQ least significant bit into the most significant bit of the MPR 7600. The double logical shift rotate left works in an analogous fashion in that the most significant bit from the MPR 7604 is transferred to the most significant carry flip flop 7607 and via the loop path to the S multiplexer 7606 which is under control of the I bus.

Any of the logic zero, logic 1 or the output of the loop path may be connected into the MQ least significant bit at 7605. The most significant bit from the MQ is transferred via the status path to the least significant bit of the MPR 7604. The ALU operation is again A+CIN where CIN is forced to zero, so a combination of shift and move may be obtained in the MPR, although no such flexibility exists on MQ. The location chosen in the MPR must be different from the MQ. Notice that in both the left and right shift cases, the contents of the MPR are put in a more significant position than are the contents of the MQ register. This is consistent with the usage of the locations in the MPR and MQ for multiply wherein the least significant product comes from the MQ and the most significant products come from the MPR.

Figure 44:
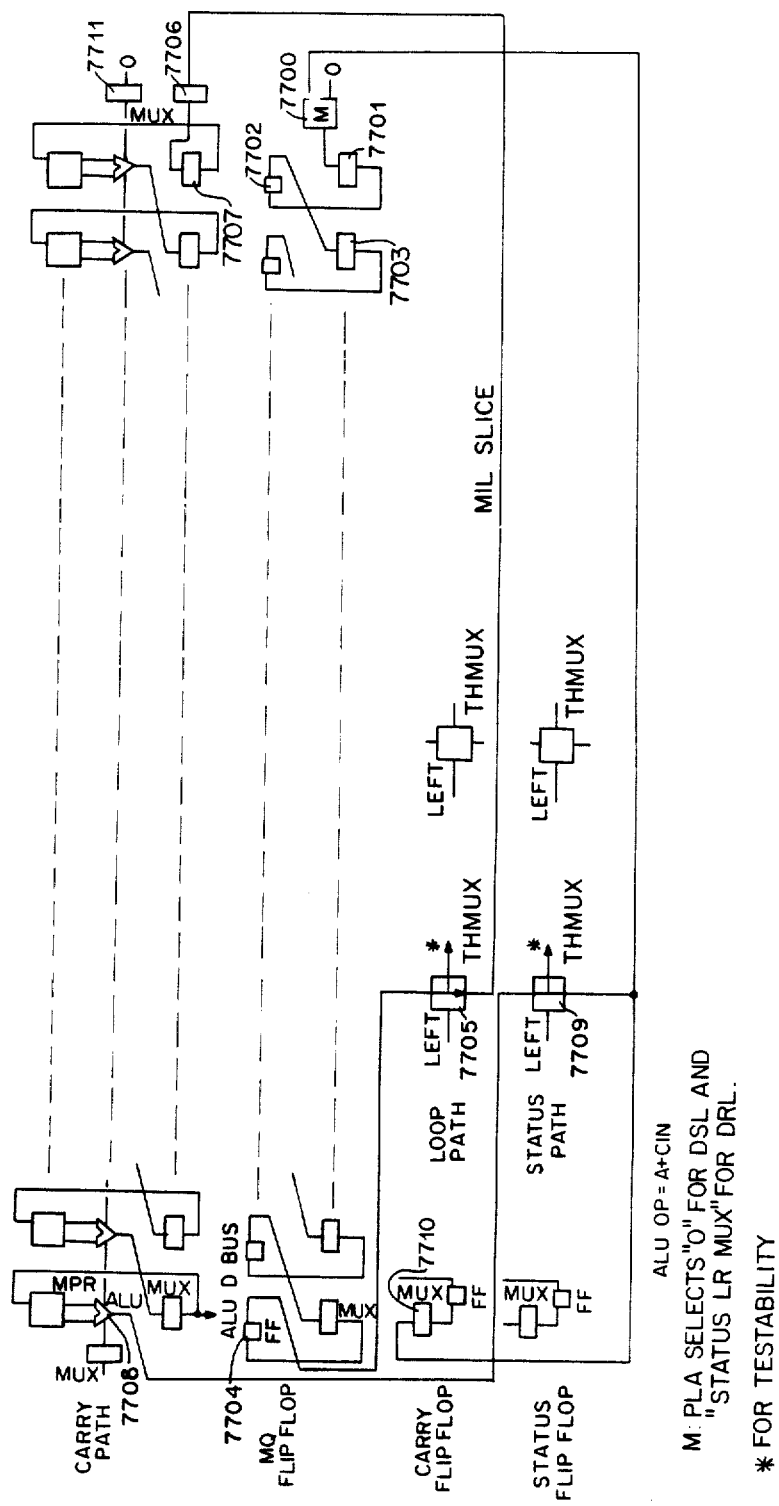
FIG. 44 is a block diagram showing double logical shift or rotate left (short) data paths.

FIG. 44 shows both the double logical shift left and double rotate left short. ALU carry-in and zero is forced by multiplexer 7711. The input to the bit 0 MQ at 7702 is provided through multiplexer 7700 under control of the PLA bus which selects 0, for shift, or the output of the status path multiplexer 7709 for data. Data from MQ bit 0 at 7702 is passed to the MQ bit 1 multiplexer 7703 and likewise for all shifting of the MQ 1 bit to the left. The most significant MQ bit 7704 passed to the loop path multiplexer at 7705 where it is connected to the multiplexer 7706 which is input to the bit 0 ALU-D multiplexer 7707. The most significant bit coming out of the ALU 7708 is passed through the status path multiplexer 7709 where it is passed through the carry flip flop input multiplexer 7710 to the carry flip flop and also to multiplexer 7700.

Figure 45:
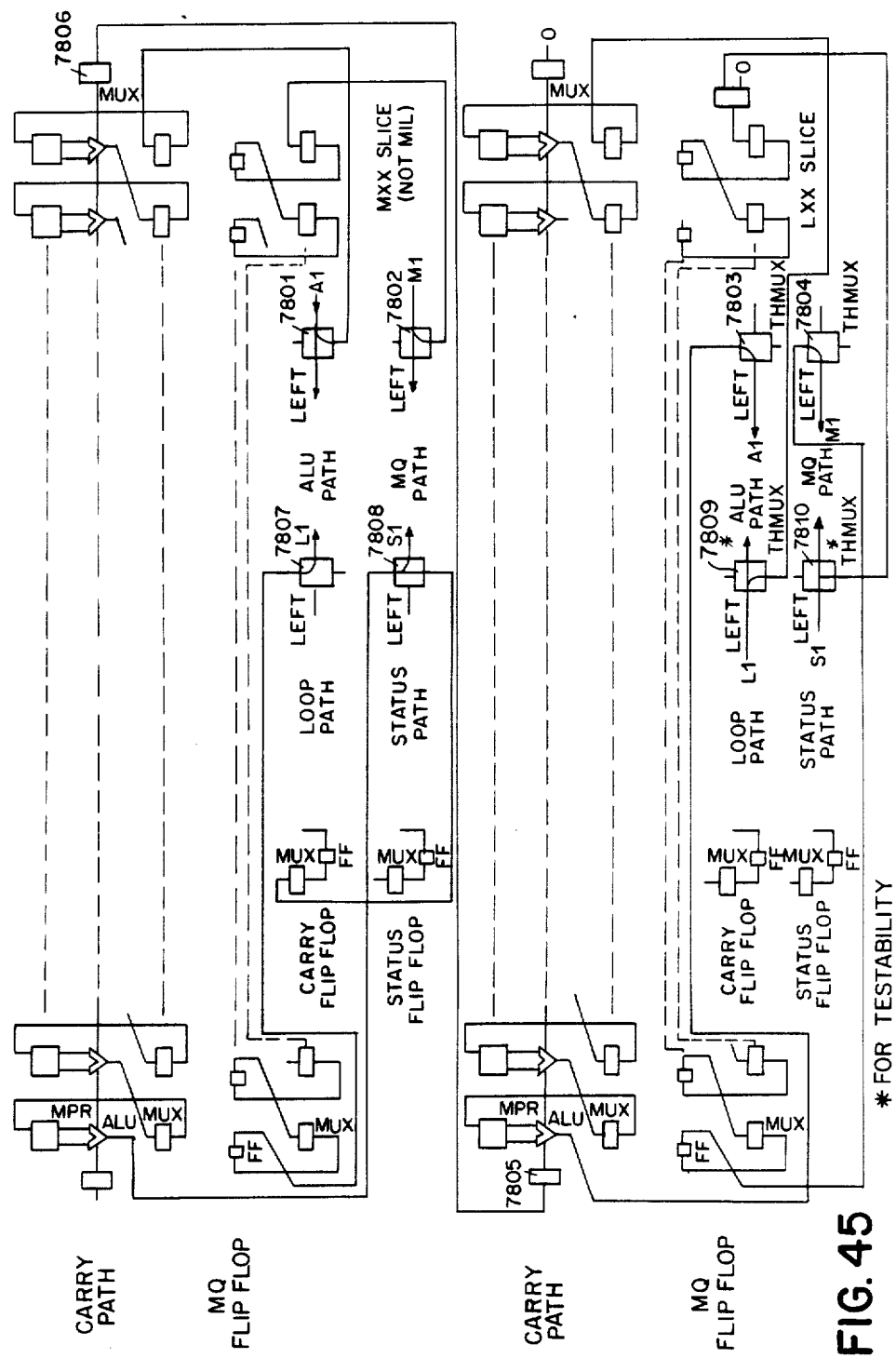
FIG. 45 is a block diagram showing double logical shift or rotate left (long) data paths.

FIG. 45 shows both the double logical shift left and double rotate left long where the operation is analogous to the short operation except the data is passed through multiple slices using the ALU path and MQ path multiplexers at 7801, 7802, 7803, and 7804. In addition, the carry path is completed through the carry out multiplexer 7805 and the carry path multiplexer 7806, although in fact logic zero would be present on the multiplexers. In addition, the left edge of the most significant slice is connected onto the right edge with the least significant slice via multiplexer 7807, 7809, 7808, and 7810.

Figure 46:
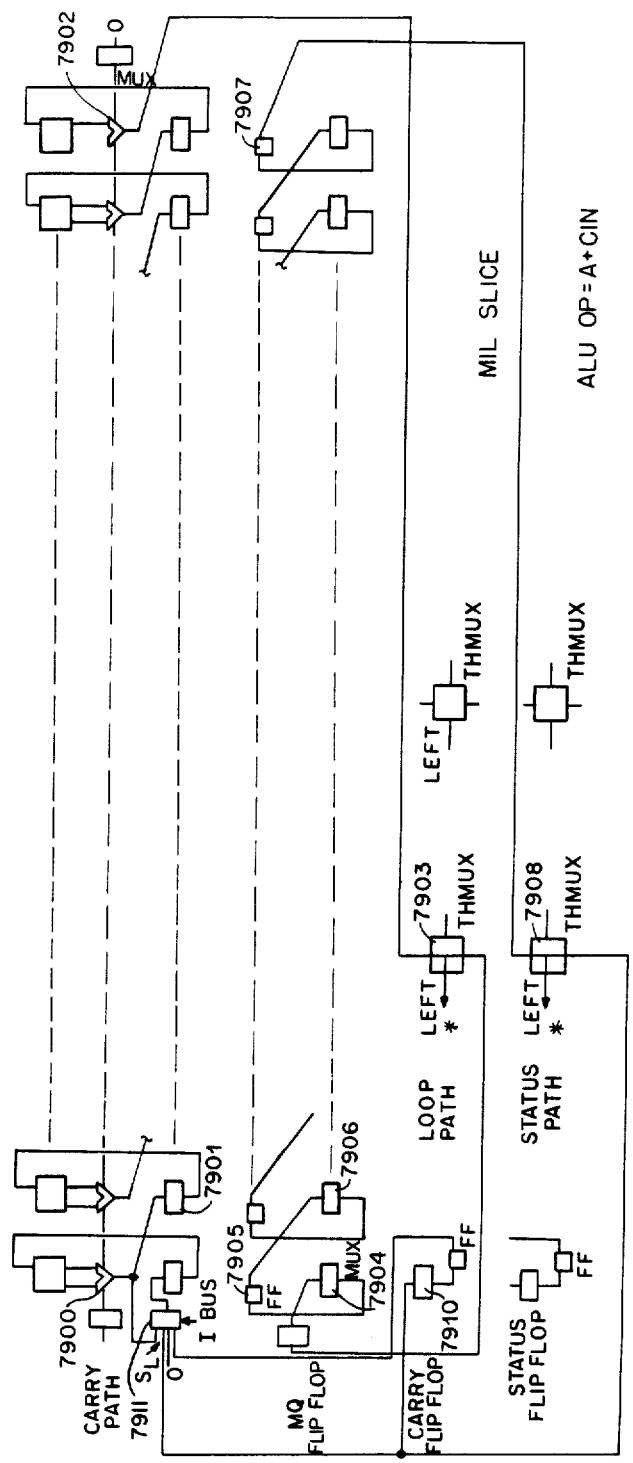
FIG. 46 is a block diagram showing double arithmetic or logical shift or rotate right (short) data paths.

FIG. 46 shows the double arithmetic logical shift or rotate right short. The most significant bit of the ALU at 7900 is moved 1 bit to the right to the ALU D bus bit 14 multiplexer 7901. Likewise, the least significant bit of the ALU 7902 is connected to the loop path multiplexer at 7903 where it is passed onto the most significant bit MQ multiplexer at 7904 and onto the bit 15 MQ at 7905. The most significant bit of MQ is moved onto the bit 14, MQ input multiplexer 7906. Likewise, the least significant bit of MQ 7907 is passed onto the status path multiplexer 7908 which is connected to the carry flip flop multiplexer 7910 and onto the S multiplexer 7911 under control of the I bus.

The S multiplexer provides for the choice of rotate, arithmetic shift, logic shift or logical shift with carry.

Figure 47:
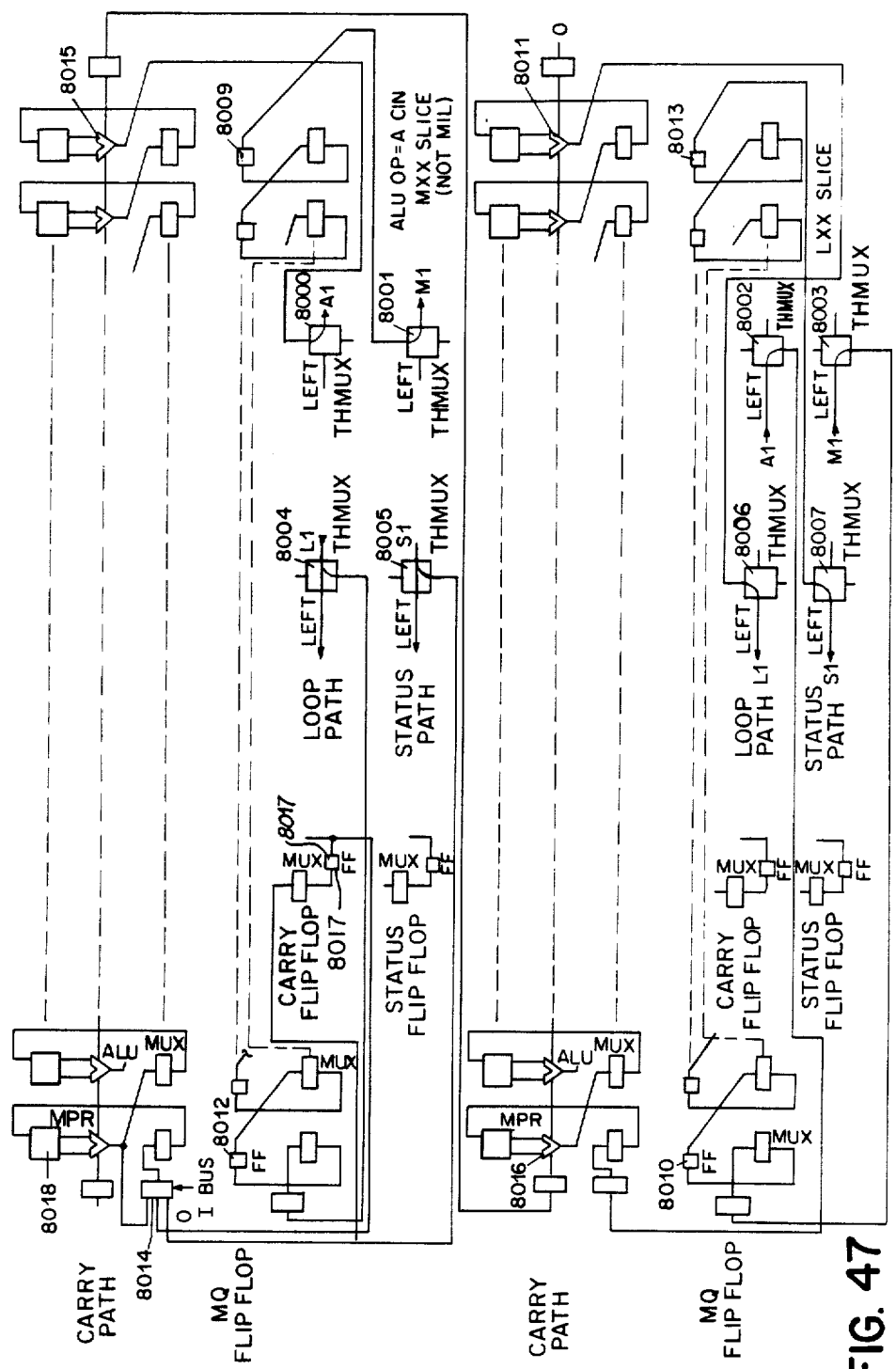
FIG. 47 is a block diagram showing double arithmetic or logical shift or rotate right (long) data paths.

FIG. 47 shows the double arithmetic logical shift or rotate right long. The right side of the most significant slice as the ALU bit 16 at 8015 and the MQ bit 16 at 8009 are connected through the ALU and MQ path multiplexers at 8000 and 8001 to the left edge of the next lesser significant slice as ALU at 8016 and the MQ bit 15 at 8010 through their respective multiplexers at 8002 and 8003. The outer edges from the most significant bit of the most significant slice to the least significant bit of the least significant slice are connected together by the loop path and status path multiplexers at 8006 and 8007, as connected to 8004 and 8005. The bit 0 MQ as 8013 passes through the status path multiplexer at 8007 up to the multiplexer at 8005 and on into the carry flip flop at 8017 and into the S multiplexer 8014. The S multiplexer again is under control of the I bus to provide input to the most significant bit of the multiport RAM at 8018.

Figure 48:
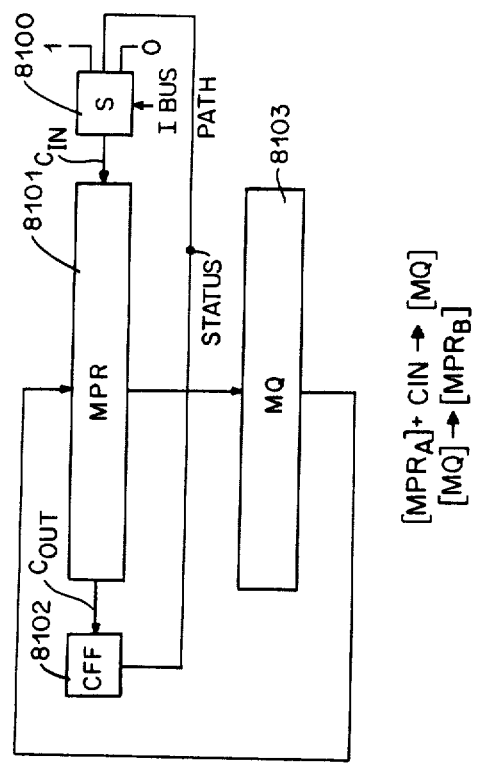
FIG. 48 is block diagram showing exchange instruction path overview.

FIG. 48 shows the exchange instruction path overview. This instruction moves the contents of MPR into MQ and the contents of MQ back into the MPR. The location readout of the MPR 8101 may have 0, 1, or the carry flip flop 8102 added via the S multiplexer 8100 under control of the I bus. This sum is moved into MQ at 8103 and the contents of MQ at 8103 is then loaded into the MPR 8101. This operation is particularly useful for floating point where mantissas must be swapped prior to denormalization.

Figure 49:
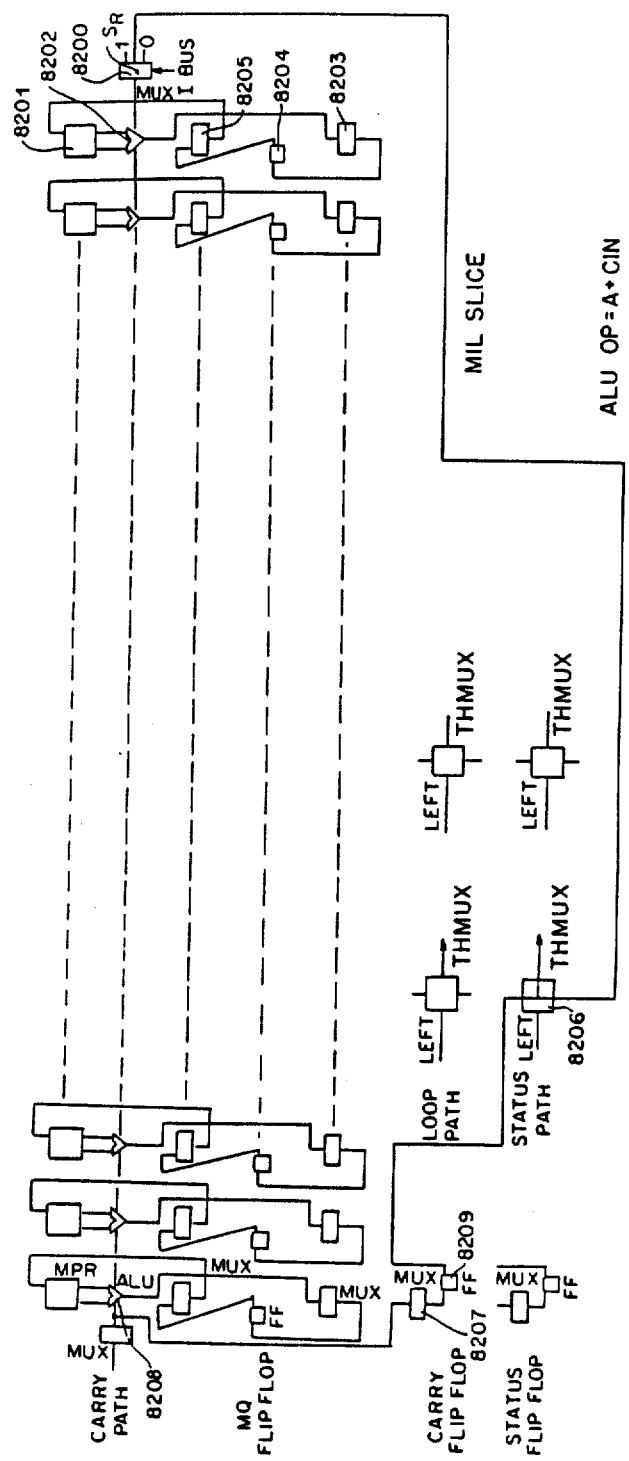
FIG. 49 is a block diagram showing exchange (short) data paths.

FIG. 49 shows the exchange short operation as would be accommodated by a processor. The input to the least significant bit of the ALU at 8202 is provided by the S multiplexer at 8200 which provides the logic zero, the logic 1 or the output of the carry flip flop 8209 via the status path multiplexer 8206.

The bit 0 MPR location 8201 is passed through the bit 0 MQ multiplexer 8203 into MQ bit 0 at 8204. The MQ bit 0 is passed through the ALU D bus bit 0 multiplexer 8205 and into the MPR bit 0 at 8201. The carry from the most significant bit of the ALU of 8208 is passed through the carry multiplexer 8207 and into the carrier flip flop at 8209.

Figure 50:
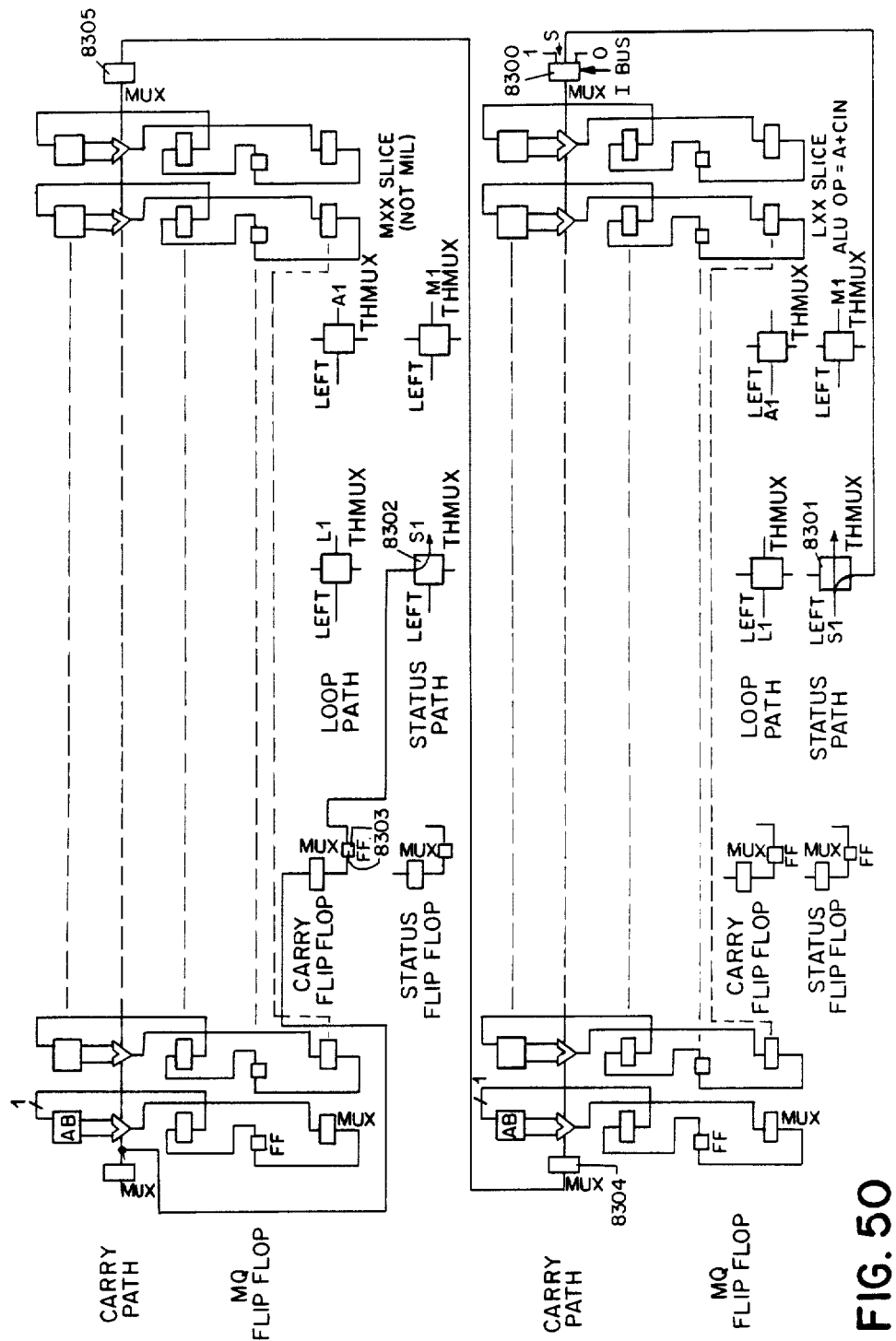
FIG. 50 is a block diagram showing exchange (long) data paths.

FIG. 50 shows the operation of the exchange long instruction. The only difference from the operation of the short instruction of FIG. 49 is that the carry path between slices is completed by the carry multiplexers 8304 and 8305 and that the most significant carry bit flip flop 8303 is passed via the status path comprising 8302 and 8301 multiplexers into the S multiplexer in the least significant slice at 8300.

Figure 51:
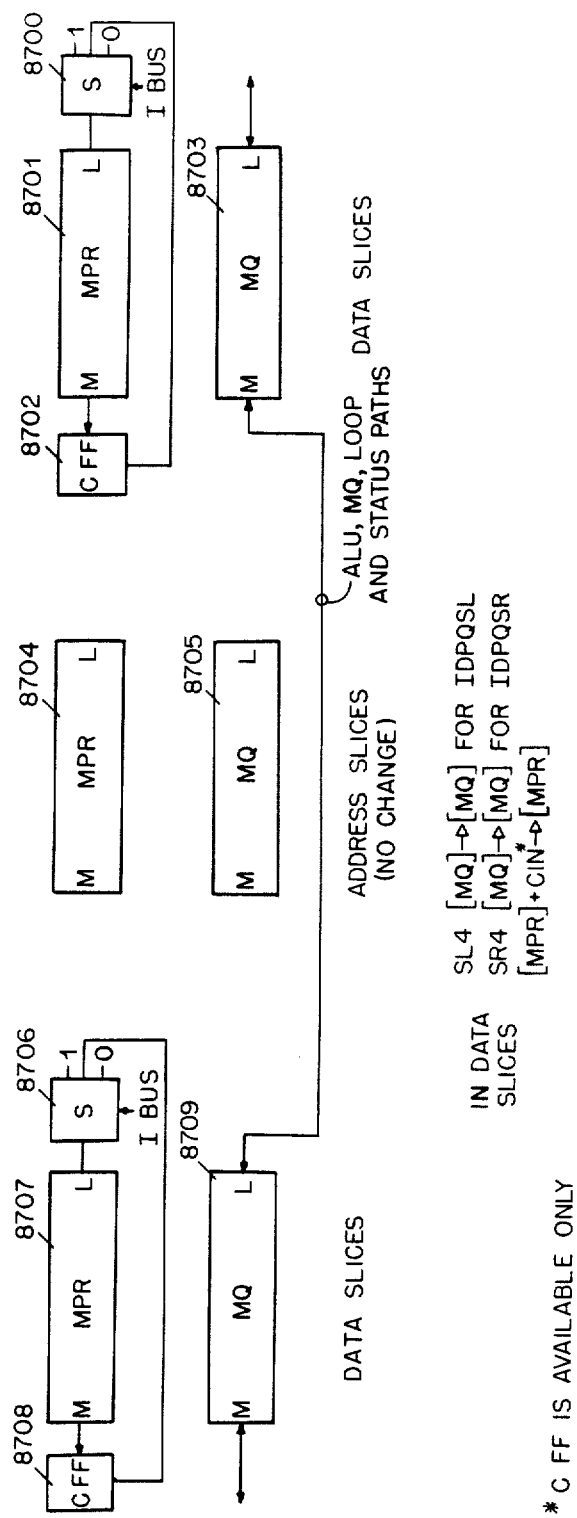
FIG. 51 is a block diagram showing interdata processor quadruple shift left and shift right path overview.

FIG. 51 is the interdata processor quadruple shift left and right path overview. These instructions move data four bits at a time between data processors skipping over address processors. Note that if a data processor is disabled by the processor enable bit in the processor status word, data may still be read from that processor but may not be stored in it. The shift mechanism is between the MQ registers leaving the location and the MPR free to provide simple move or increment operations. The data processor shown in the Figure being comprised of elements 8700, 8701, 8702 and 8703 performs a move from an operation with the carry in selector 8700 under control of the I bus providing a choice of 0, 1, or for an MIL slice, the carry flip flop. The data is shipped from the MQ register past the address slices which are unchanged by the instructions into the next data processor into the MQ as shown by 8709.

Since all active data processors participate in this operation, then in four steps 16 bits may be transferred between all data processors. Processor N passes data to the processor N+1 for a quadruple shift left or to processor N−1 for a quadruple shift right.

Figure 52:
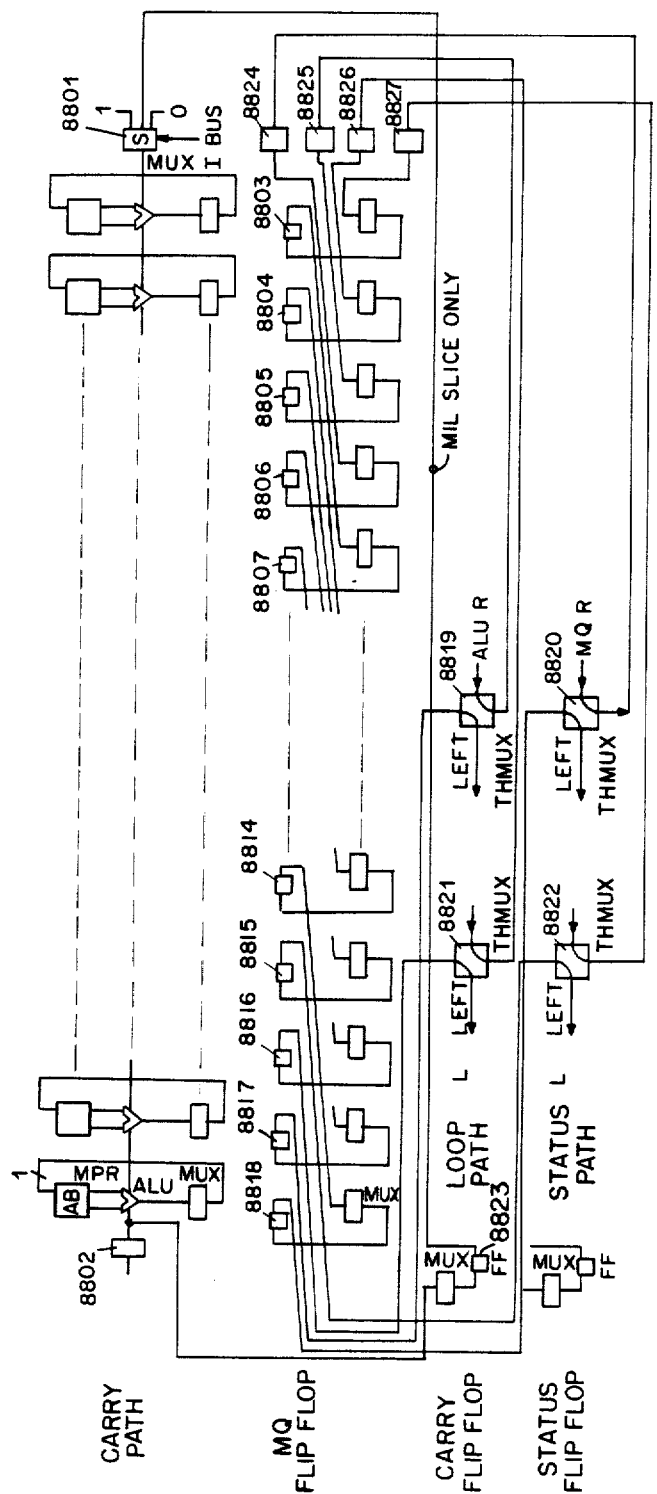
FIG. 52 is a block diagram showing interdata processor quadruple shift left data paths.

FIG. 52 shows the interdata processor quadruple shift left operation where the S multiplexer 8801 pertains only to a least significant slice. Otherwise the carry path would be continuous from the carry left multiplexer 8802 into the carry in multiplexer 8801 of the next higher significant slice. The four least significant bits of MQ as 8803, 8804, 8805 and 8806 are shifted to the left to the next four most significant bits of MQ as 8807 to 8810. The four most significant bits of MQ as 8815 to 8818 pass through the four multiplexers as 8819 to 8822 onto the next slice to the left. In address or inactive slice the data would simply pass through the respective multiplexers and onto the next data slice. At that point, the signals would be injected from the multiplexers into the MQ input multiplexers as 8824 through 8827 and loaded into the four least significant MQ bits as 8803 to 8806. In a MIL slice the carry flip flop 8803 would be made available to the select 8801 for input into the ALU carry in path.

Figure 53:
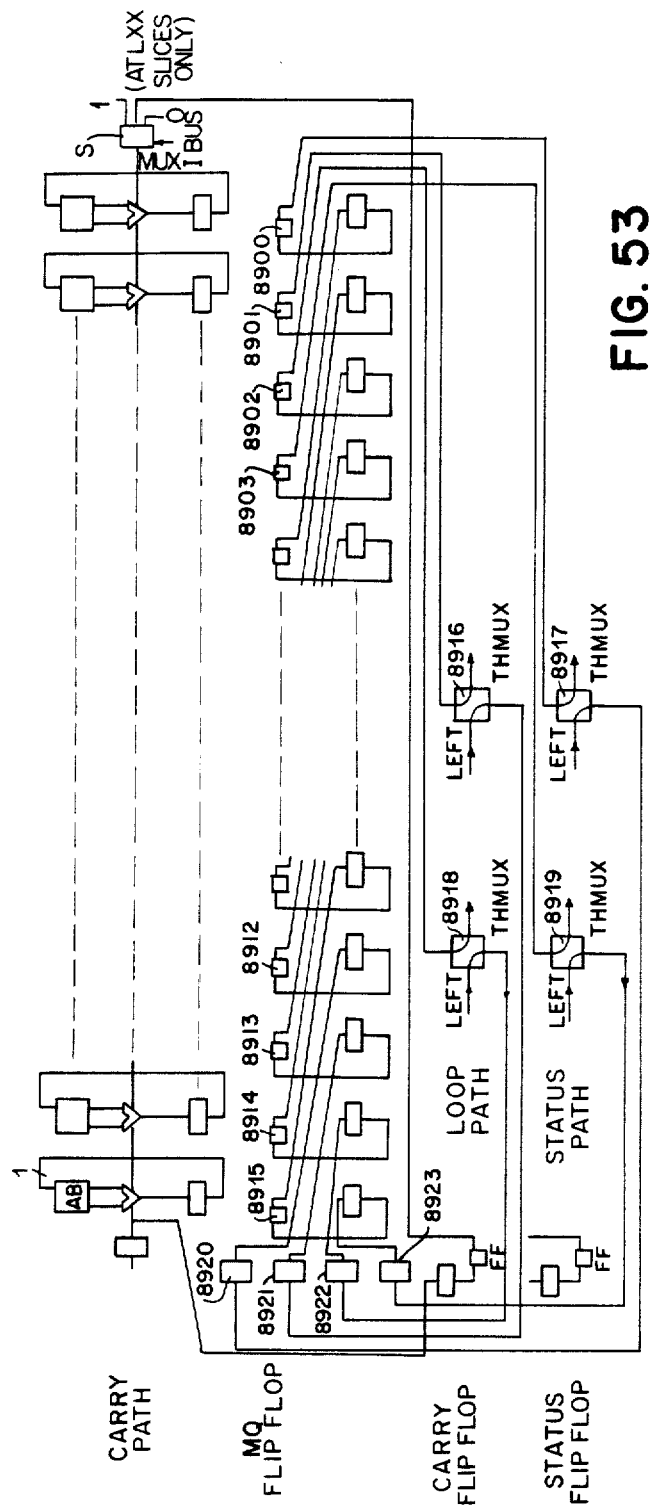
FIG. 53 is a block diagram showing interdata processor quadruple shift right data paths.

FIG. 53 shows the interdata processor quadruple shift right which works in analogous fashion except that the information flow is from left to right in which case the four least significant bits of MQ 8900 to 8903 pass through the multiplexers 8916 to 8919 to the right. The multiplexers of all address or inactive slices would simply pass the data from left to right onto the most significant slice of the next data processor wherein the data would be injected from the multiplexers into the MQ input multiplexers 8920 to 8923 and be injected into the four most significant bits of MQ 8912 to MQ 8915.

Figure 54:
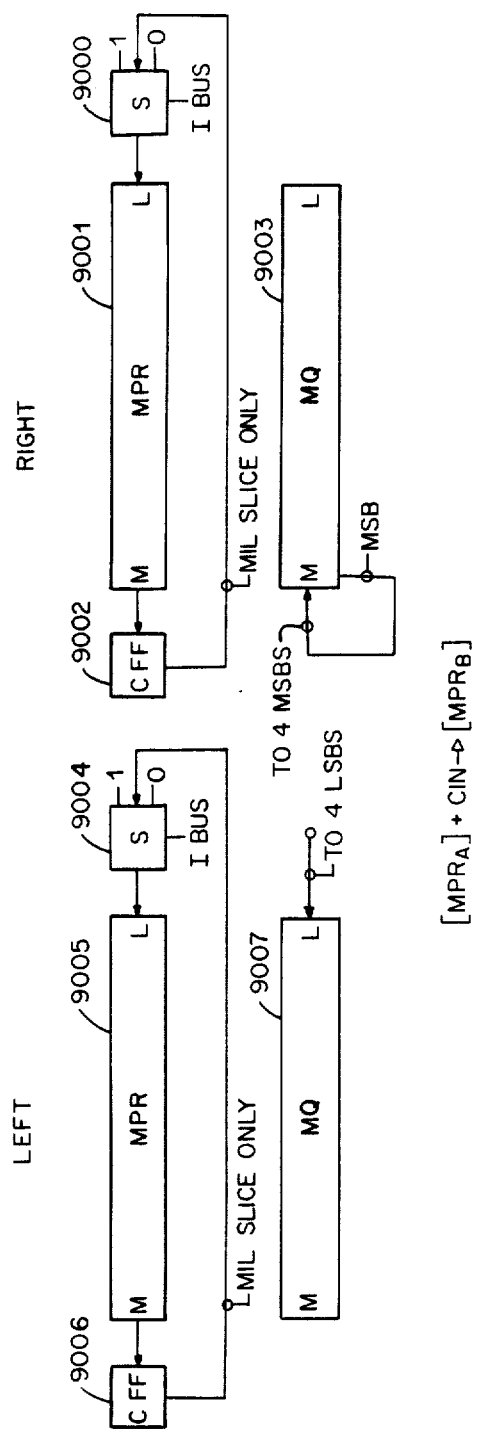
FIG. 54 is a block diagram showing quadruple shift path overview.

The quadruple shift left operation is shown in FIG. 54. The operation is very similar to the inter data processor quadruple shift left except that the shifting is restricted to within the processor and the 4 bits that are shifted in are either a zero in the case for a quadruple shift left or the sign bit for a quadruple shift right. For the left shift, the selector 9004, under control of the I bus, supplies a zero or a one, or in the case of the MIL slice the carry flip flop into the least significant bit of the carry of the ALU which provides and ADD operation. The ADD operation is completely independent of the shift operation and allows for adding or moving to be performed concurrently with the shift operation. The MQ register 9007 supplies the 4 bit left shift with zeros being fed into the four least significant bits.

For the right shift, the MPR performs an add or move operation exactly analogous to the left shift operation, with the selector 9000 providing the carry input to the ALU whose result is stored in a multiport RAM, the output being passed to the carry flip flop 9002 which may be fed back to the selector S 9000. Concurrently with the operation being performed by the MPR, the MQ path is shifting to the right where the most significant bit of MQ is fed into the four most significant bits of MQ for the sign extend operation. In the event that a logical shift operation is desired, one would have to mask out the most significant bits of MQ with a later AND instruction.

Figure 55:
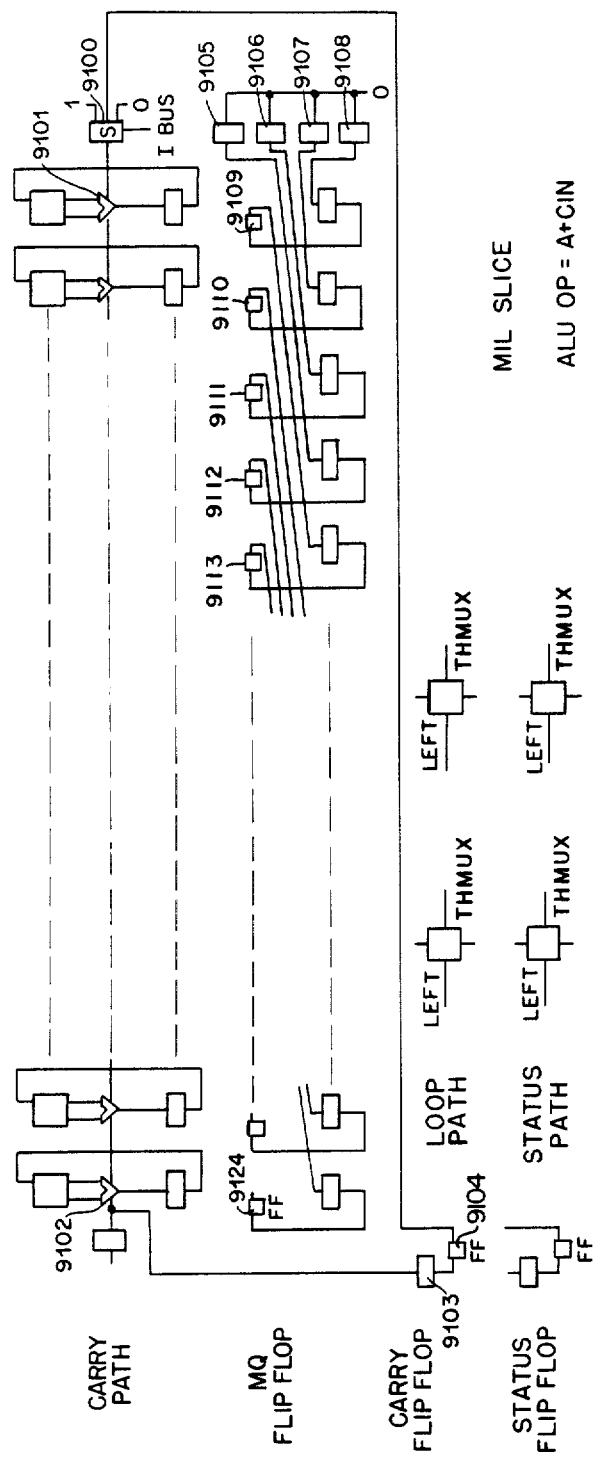
FIG. 55 is a block diagram showing quadruple shift left (short) data paths.

FIG. 55 shows the detailed path operations for the quadruple shift left (short) instruction. Selector 9100, under the control of the I bus, supplies carry into the least significant bit of the ALU 9101. The carry out of the most significant bit of the ALU 9102, is loaded to the carry input multiplexer 9103 and carry flip flop 9104 which is sent ot the S multiplexer 9100 in the MIL slice. Concurrent with the ALU and MPR operation is the 4 bit left shift performed by MQ. The four least significant bits of MQ, 9109 to 9112, are shifted into the four next most significant bits of MQ, 9113 to 9116, and four least significant bits of MQ, 9109 to 9112, are loaded through multiplexers 9105 to 9108 with logical zero.

Figure 56:
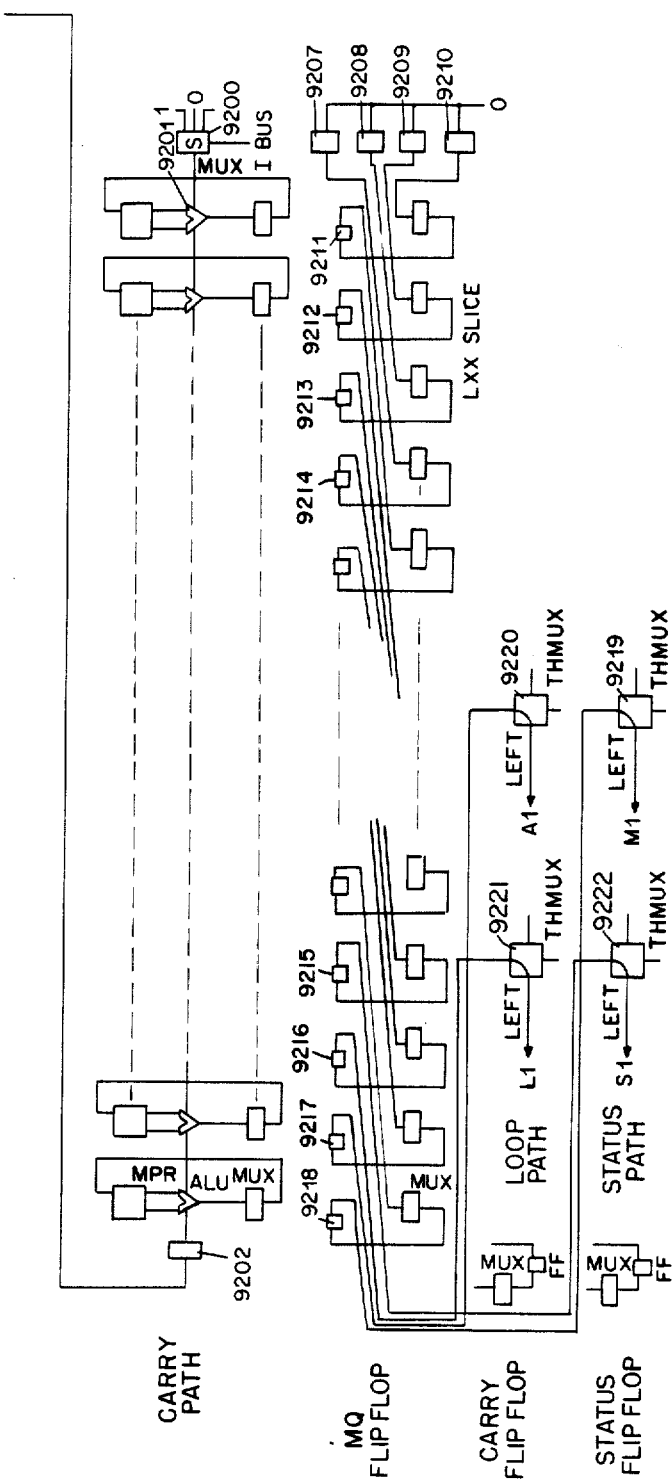
FIG. 56 (consisting of 2 sheets) is a block diagram showing quadruple shift left (long) data paths.
Figure 56:
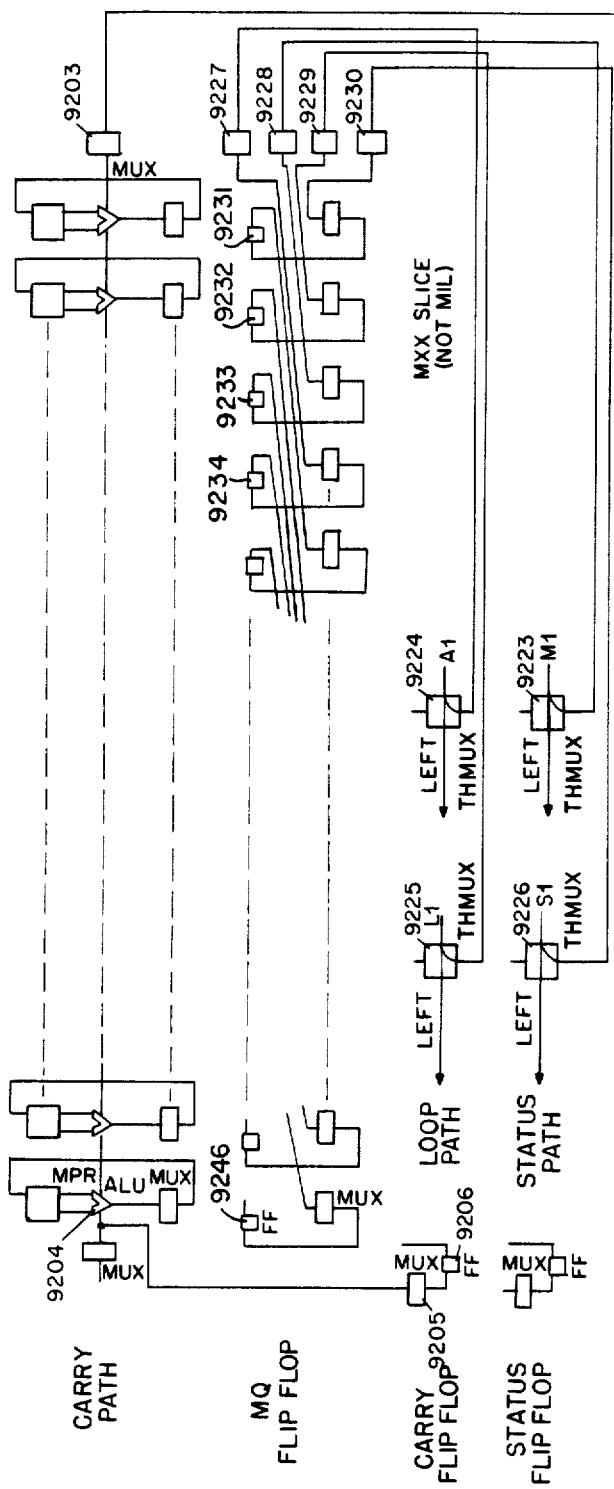

FIG. 56 shows the quadruple shift left (long) path operation which is exactly the same as the previous figures except that any word length may be supported in which case the four arithmetic paths complete the connections between adjacent cells. In addition the carry out of the less significant slice is passed through the multiplexer 9202 on the carry path to the carry input multiplexer 9203 on the next most signficant slice. The carry out of the most significant slice is the ALU at 9204 is loaded into the carry flip flop 9206. The four least significant bits of MQ, 9211 to 9214, are loaded with zeros by the multiplexers 9207 to 9210. The four most significant bits of MQ in the less significant slice as MQ bits 9215 to 9218 are passed through the path multiplexers as 9219 to 9222, which inputs to the next most significant slice as 9223 to 9226, where they are injected through the MQ multiplexers as 9227 to 9230 to the four least significant bits of MQ in that slice as 9231 to 9234.

Figure 57:
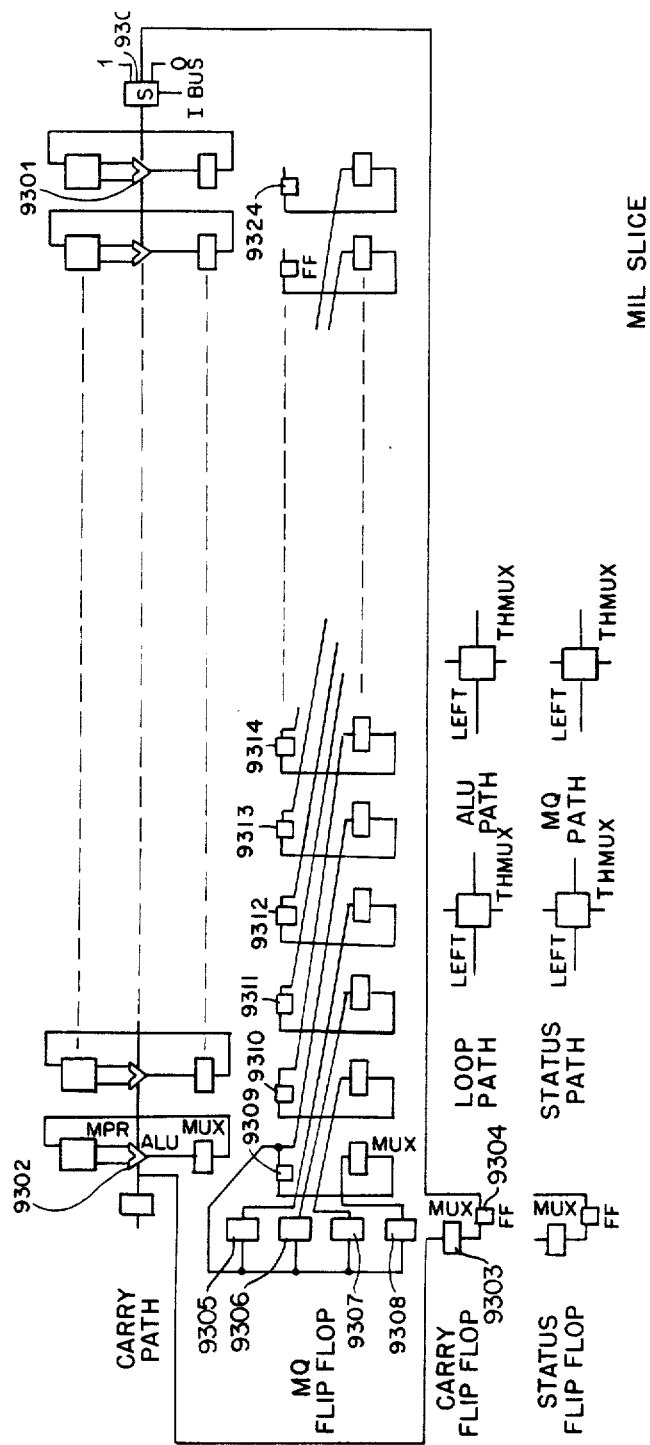
FIG. 57 is a block diagram showing quadruple arithmetic shift right (short) data paths.

FIG. 57 shows the quadruple arithmetic shift right path operation. The ALU and MPR operation are the same in the previous example. The MQ path however shifts from left to right wherein the four most significant bits of MQ 9309 to 9312 are passed to the four lesser significant bits of MQ as 9313 to 9316. The input to the four most significant bits of MQ 9309 to 9312 is provided by the multiplexers 9305 to 9308 which receive the output of the most significant MQ bit 9309 to effect an arithmetic shift operation. The ouptut of the most significant ALU 9302 is passed to carry flip flop 9304 which is supplied as an input to the selector multiplexer 9300 to make it available to least significant ALU carry in at 9301. This connection is available only in the MIL slice since no path is available for longer words.

FIG. 58 shows a quadruple arithmetic shift right long path operation, which is analogous to the previous example except that the MQ connection between adjacent slices is provided by path logic. In this case the four least significant MQ bits 9415 to 9418 of a higher significant slice are passed through the path multiplexers 94019 to 9422, where they are received by the path multiplexers of the next lesser significant slice 9423 to 9426 whose output passes through the MQ multiplexers 9427 to 9430 for presentation to the four most significant bits of the MQ in that slice 9431 to 9434. The S multiplexer 9400 only has available logic zero and logic 1 as inputs for the ALU operation. The ALU operation is formed across slices through the carry out multiplexer 9402 in the lesser significant slice connecting to the carry in multiplexer 9403 of the next most significant slice. The carry flip flop 9406 in the more significant slice is not available to the S multiplexer 9400 since the status path is consumed by the MQ connection between status path multiplexers 9422 and 9426.

Figure 59:
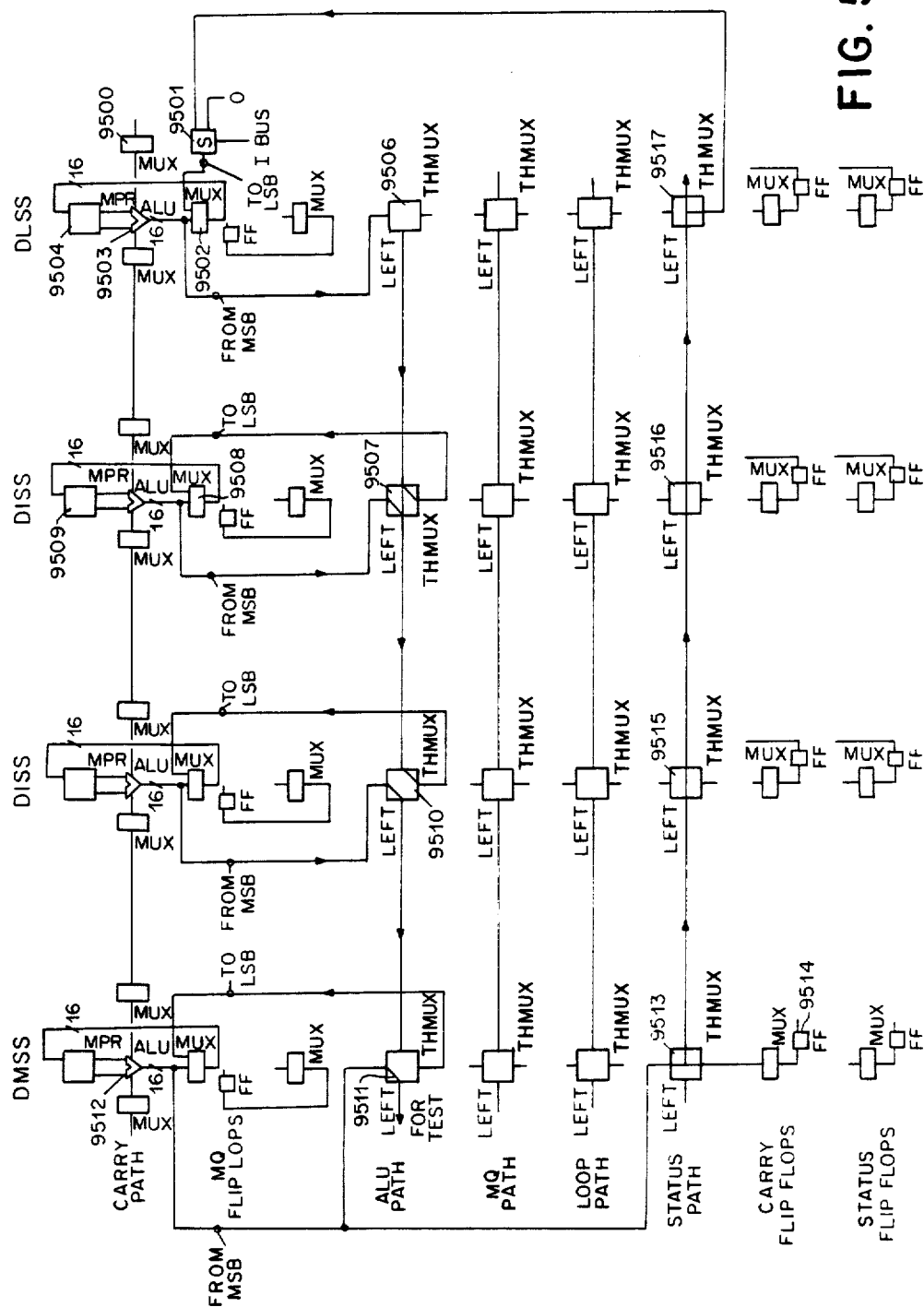
FIG. 59 is a block diagram showing rotate left for a 64-bit word.

FIG. 59 shows a rotate left for a 64 bit word. This single example will be given of how to form very long word sizes since the principle applies to any of the instructions. The principle is that some connections flow simply between the adjacent cells whereas some other signals pass over cells in order to drive the left of the left most cell to the right of the right most cell. The least significant slice as an MPR 9504 and ALU 9503 shifts bits one to the left as in the previous examples. Note that in this figure the slices are 16 bits whereas in the other figures one bit at a time has been shown.

The bit from the most significant bit of the ALU 9503 is passed through the ALU path horizontal multiplexer 9506 where it is received by the next multiplexer to its left 9507 and is injected into the least significant bit of the MPR 9508 through multiplexer 9509. The most significant bit is passed on to the next intermediate significant slice, and from there on to the most significant slice previously explained. In the most significant slice multiplexer 9511 passes the data outside of the word for test purposes as well as looping it into the slice. The most significant bit of the ALU 9512 must be moved to the right. This operation is performed by a multiplexer 9513. Multiplexers 9515 and 9516 pass straight through as does 9517 for test purposes, which also picks it off for presentation to S multiplexer 9501. The S multiplexer under control of the I bus supplies logic zero with the most significant bit to multiplexer 9502 for storage in a multiport RAM 9504 in the least significant slice.

In addition the most significant bit from the most significant slice consisting of ALU 9512 is passed on to the carry flip flop 9514 in the most significant slice. This is useful for testing the bit coming out of the most significant slice as well as for linking with other shift instructions.

Figure 60:
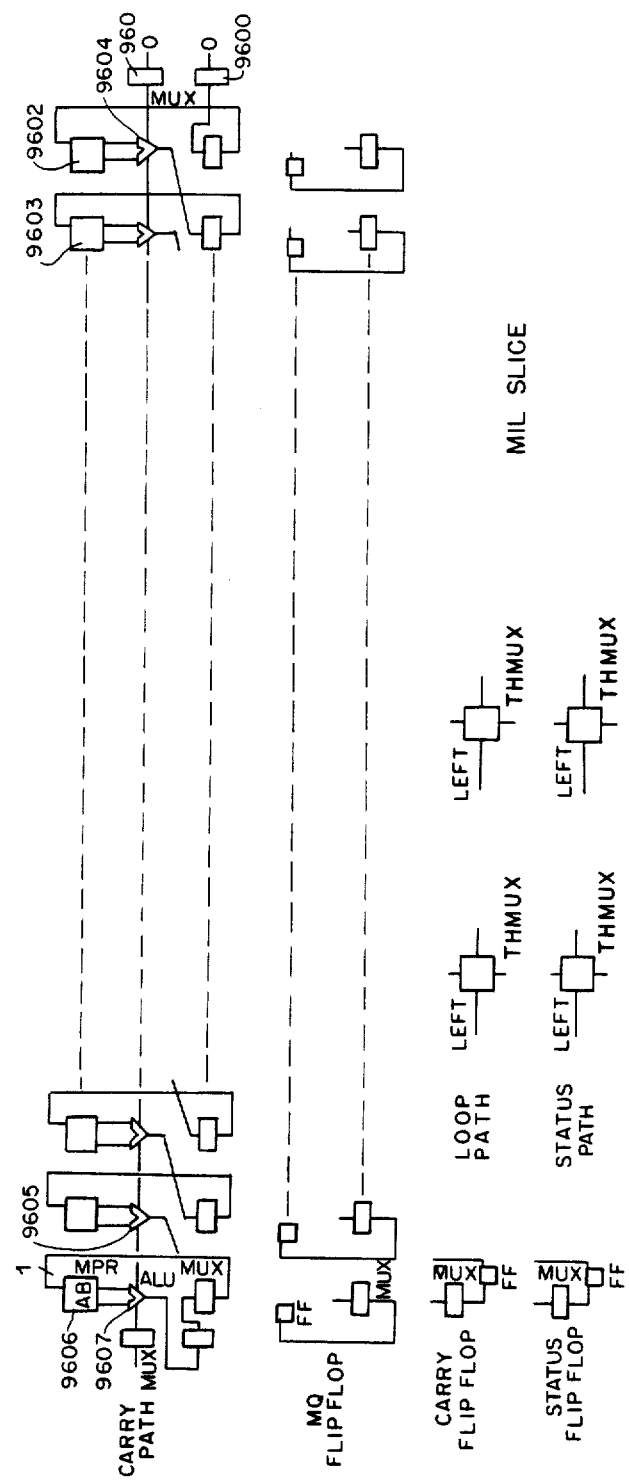
FIG. 60 is a block diagram showing arithmetic shift left (short) data paths.

FIG. 60 shows the arithmetic shift left short path operation. A zero is forced into the least significant bit of the multiport RAM 9602 via multiplexer 9600. A zero into the least significant bit of the carry path is forced through multiplexer 9601. The output of each ALU as 9604 is moved via the ALU multiplexers 1 bit to the left being received by 9603. The second most significant bit of the ALU 9605 is discarded and overflow is checked for in the event that the value of the ALU bit 9605 differs from the most significant ALU bit at 9607. The contents of the most significant bit of the multiport RAM 9606 is returned to itself providing an arithmetic shift through which the sign bit is maintained.

Figure 61:
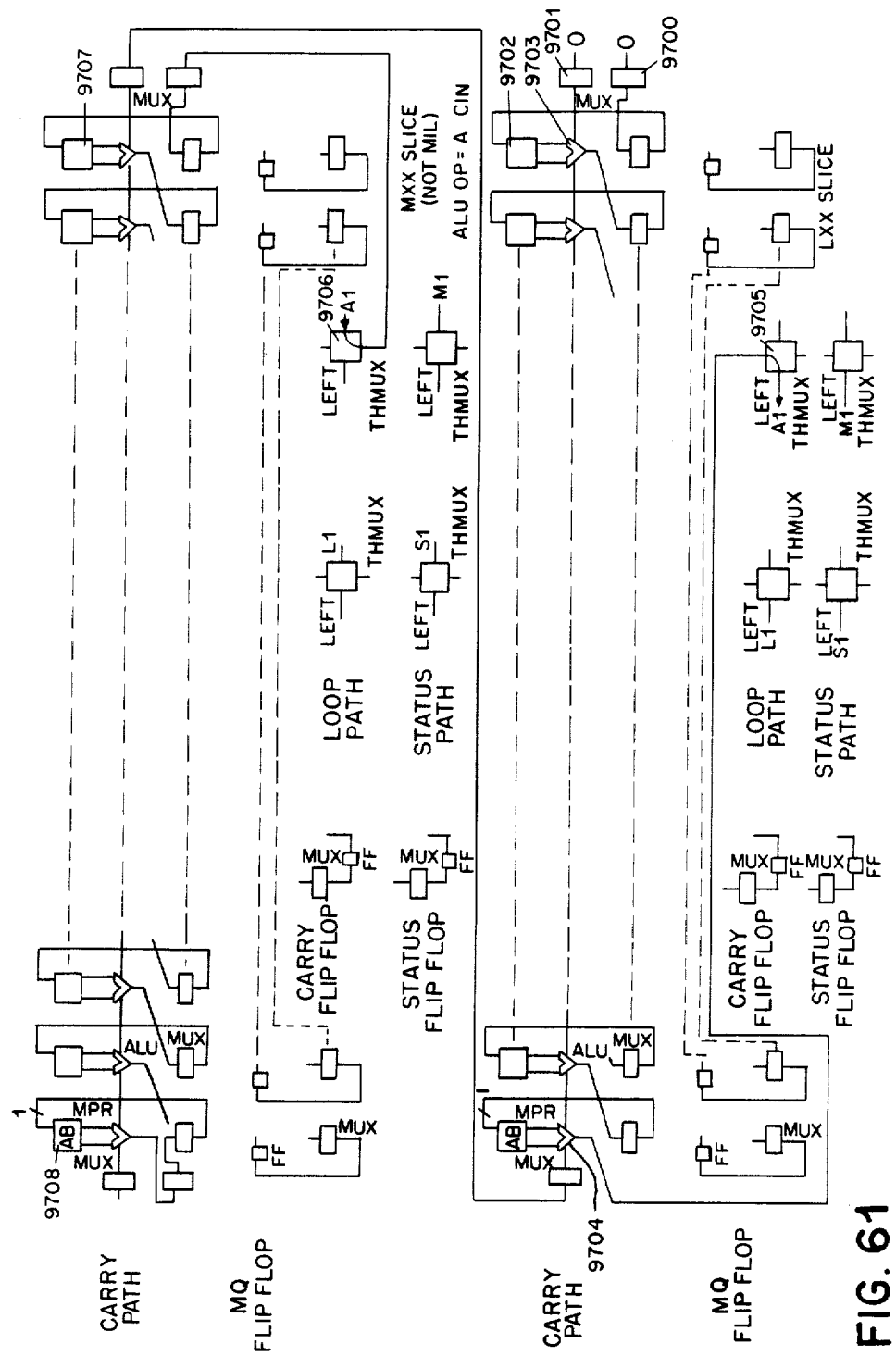
FIG. 61 is a block diagram showing arithmetic shift left (long) data paths.

FIG. 61 shows the arithmetic shift left long path operation which is analogous to FIG. 60 except that a multiplicity of slice operations is demonstrated. In this case zeros are forced into the least significant bit of the multiport RAM 9702 and the least significant carry input of the ALU 9703. The output of the most significant bit of the 9704 in the significant slice is passed on the ALU multiplexer 9705 where it is received by the next most significant ALU multiplexer 9706 passed into the multiport RAM cell 9707. The sign bit in the most significant slice as in multiport RAM 9708 is again maintained.

Figure 62:
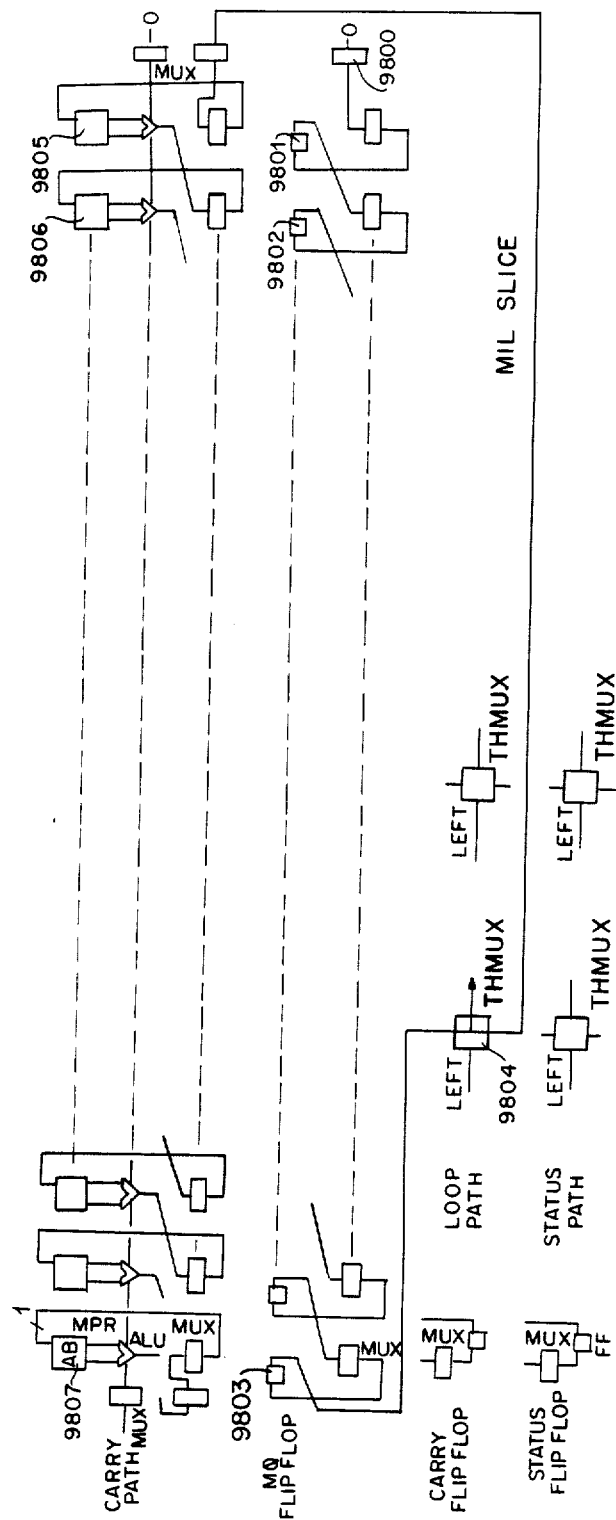
FIG. 62 is a block diagram showing double arithmetic shift left (short) data paths.

FIG. 62 shows the double arithmetic shift left short path operation. In this case, the contents of the MQ register as 9801 and 9802 is shifted 1 bit to the left and input to the MPR via the ALU path. A zero is forced into the least significant bit of MQ via multiplexer 9800. The most significant bit of MQ 9803 is passed through the loop multiplexer 9804 and input to the least significant bit of the MPR 9805. The bit in the least significant bit of MPR of 9805 is shifted to the next most significant bit as MPR 9806. Likewise, the most significant bit of the MPR 9807 is maintained to facilitate the arithmetic shift and an overflow condition is detected.

Figure 63:
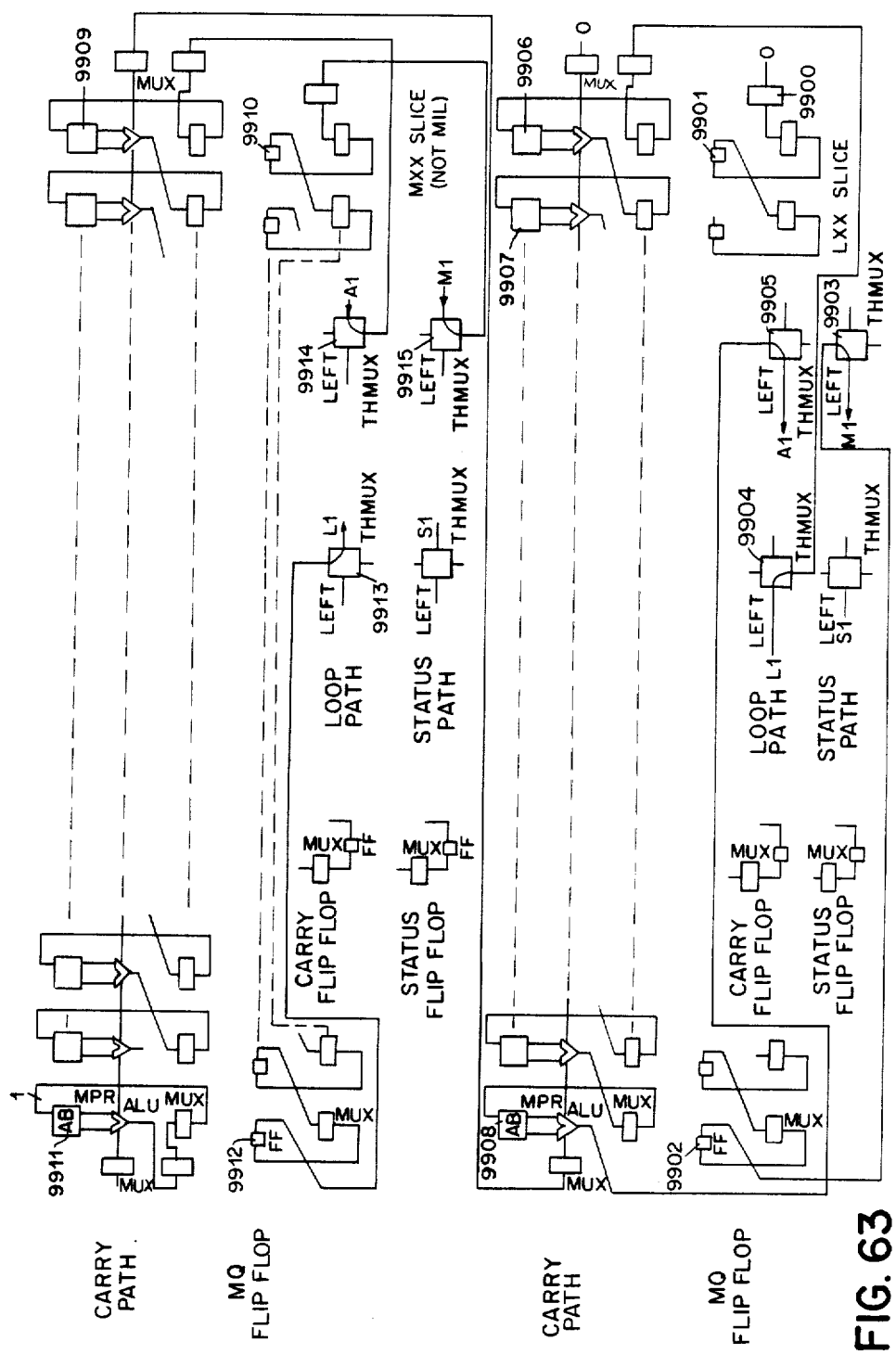
FIG. 63 is a block diagram showing double arithmetic left (long) data paths.

FIG. 63 shows the double arithmetic shift left long path operation which is analogous to FIG. 62 except that a multiplicity of slices is shown. In this case the MQ register state as MQ bits 9901 and 9902 is passed through the MQ path multiplexer 9903 which is received by multiplexer 9915 and injected into the least significant bit of MQ 9910 in the next most significant slice. The most significant bit of MQ is 9912 is passed through the loop multiplexer 9913 and is received by the loop multiplexer 9904 in the least significant slice and passed to the least significant bit of the MPR 9906. This bit from the most significant bit of MQ will pass through the loop multiplexers in all intermediate significant slices. The output of the ALU and the most significant bit in the lesser significant slice is passed through the ALU multiplexer 9905 to the ALU multiplexer 9914 in the next most significant slice where it is injected into the MPR 9906 in that bit. The most significant bit of the MPR 9911 is again maintained to facilitate the arithmetic shift operation.

FIG. 64 lists the iterative fixed point instructions which implement multiply and divide operations. Multiply is implemented as a sequence of add and shift operations and divide or is implemented as a sequence of nonrestoring divide steps. These algorithms require one clock cycle per bit for any word size. The operations are classified as a first, intermediate and last sequence where the intermediate operation is performed according to the number of bits in the word minus one. The first operation initializes the pipeline so that lengthy propagation delays in the control path which modifies the operation performed by the ALU is performed in parallel with the ALU computation rather than in series with the ALU operation, maximizing the clock rate. The last operation generally handles the sign bit.

Figure 65:
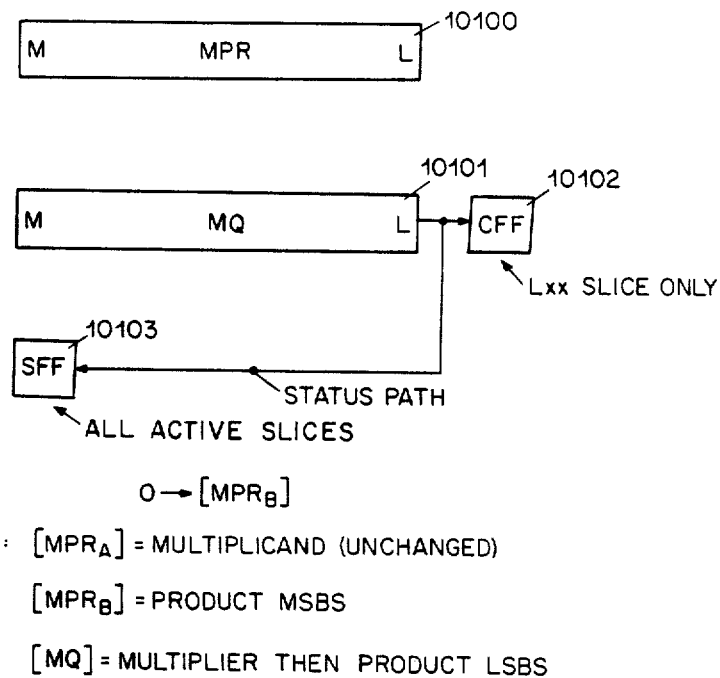
FIG. 65 is a block diagram showing a fixed multiply first path overview.

FIG. 65 shows the fixed multiply first path overview. In all cases, the MPR location A, as addressed by the Read Address, contains a multiplicand, which is unchanged throughout the process. The MPR location B, as addressed by the Read/Write Address, contains the partial product, becoming the product MSBS at the end of the sequence. The MQ register contains initially the multiplier and then the product LSBS. The algorithm is well known and is described in detail in the *ADVANCED MICRO DEVICES BIPOLAR MICROPROCESSOR LOGIC AND INTERFACE DATA BOOK*, 1983, pages 6-59 to 6-62.

FIG. 65 also shows the fixed multiply first operation. The MPR 10,001 B location is cleared since it will be accumulating in the product. The MQ however, 10,101 is unchanged. The least significant bit is copied into the carry flip flop 10,102 and the least significant slice only. It is also passed via the status path to the status flip flop at 10,103 in all active slices. It is significant that the status flip flop is copied in all active slices since all slices of the word must cooperate to either add or pass the partial product in order to perform the add and shift algorithm.

Figure 66:
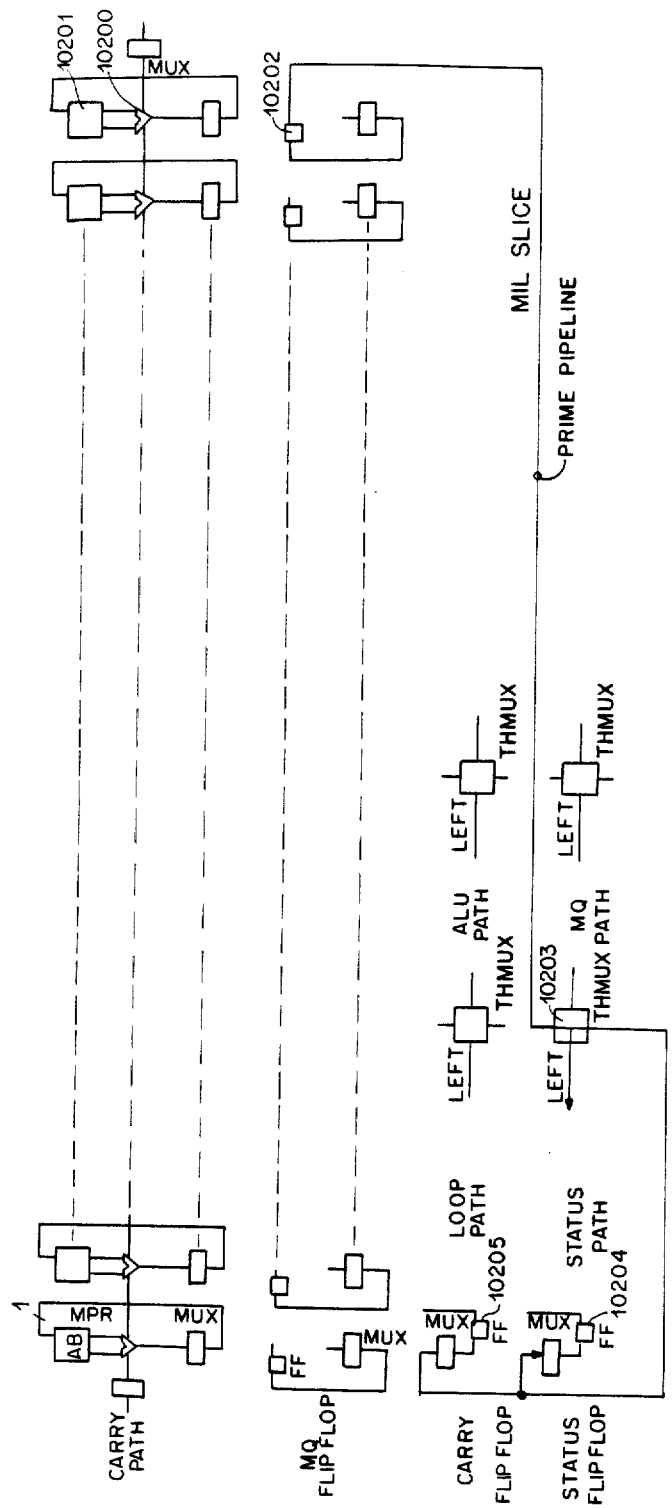
FIG. 66 is a block diagram showing a fixed multiply first (short) data paths.

FIG. 66 shows the fixed multiply first short path operation in detail. The ALU output is forced to zero and is written into the Read/Write location of multiport RAM 10,201. The least significant bit of MQ at 10,202 is connected through the status path multiplexer 10,203 where it is copied into the status flip flop 10,204 and the carry flip flop 10,205 for use in subsequent cycles.

It is significant to the multiply and divide operations that the operation of the ALU depend upon the status bit. The instruction PLA as 2004 in FIG. 15 represents two sets of four outputs since there are two possible ALU operations and the status flip flop chooses one of those two ALU operations in order to provide the add or pass operation for multiply. Since the ALU cannot begin operation until its operation code is specified, it is essential that he operation be specified at the very beginning of the clock cycle and this is possible because of the pipeline structure of the status flip flop.

Figure 67:
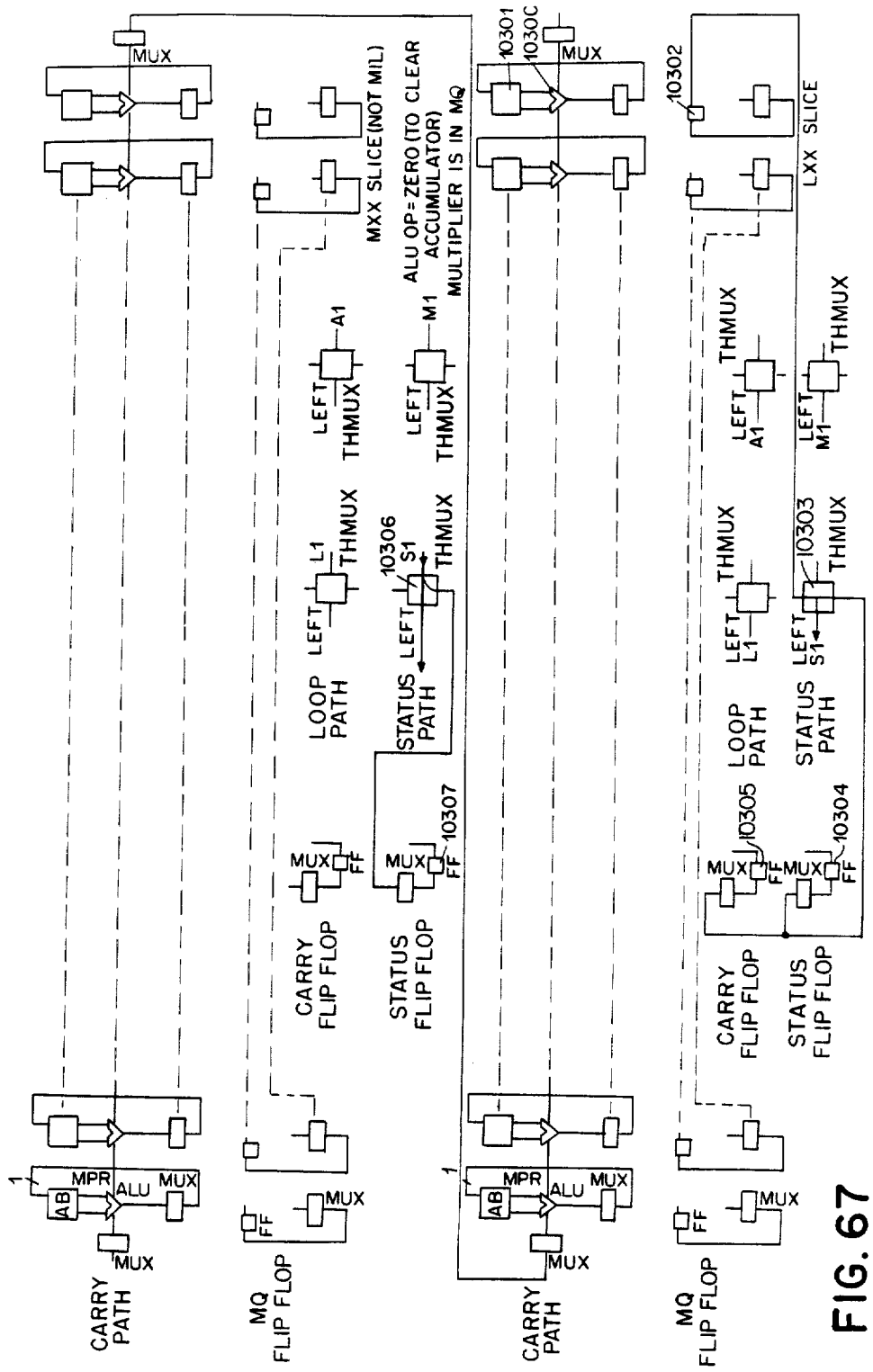
FIG. 67 is a block diagram showing a fixed multiply first (long) data paths.

FIG. 67 shows the fixed multiply first long path operation in detail. The operation is analogous to the previous figure except that the least significant bit of MQ as 10,302 must be passed through the status multiplexer 10,303 on to the next most significant slice status multiplexer 10,306 where it is loaded in the status flip flop 10,307 as well as in the carry in flip flop 10,305 and status flip flop 304 of the least significant slice.

Figure 68:
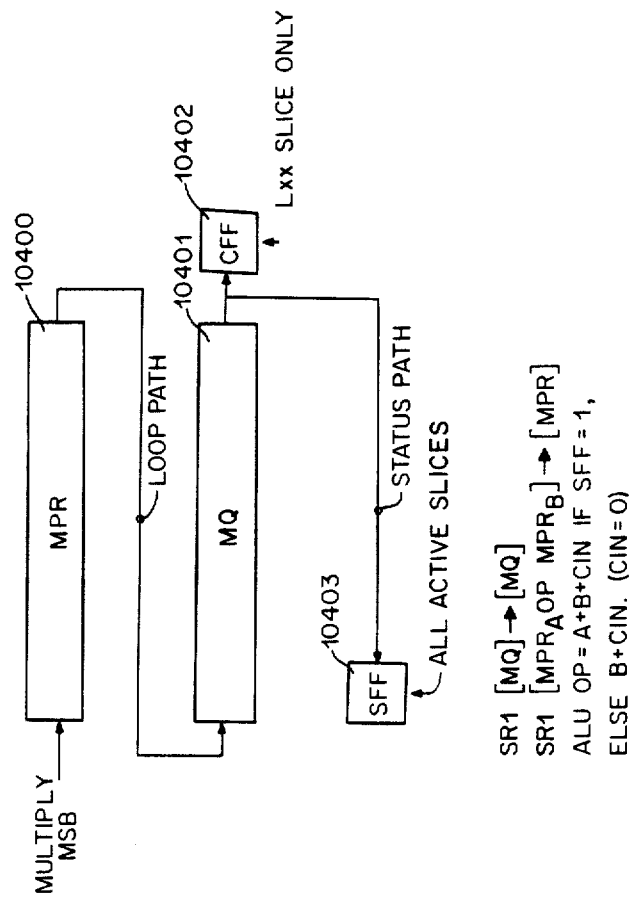
FIG. 68 is a block diagram showing a fixed multiply path overview.

FIG. 68 shows the fixed multiply intermediate path overview. The ALU will either pass the partial product or add the partial product to the multiplicand which is stored in the multiport RAM. The ALU output will be shifted one bit to the right with the least significant bit going into MQ at which time the multiplier in MQ will be shifted one bit to the right. The bit being shifted out of the MQ 10,401 is saved in the carry flip flop 10,402 in the least significant slice and passed via the status path to the status flip flops in all active slices as status flip flop 10,403. The most significant bit into the multiport RAM is the multiply MSB as defined in FIG. 28. The carry flip flop 10,402 and the least significant slice is saved for use during the fixed multiply last instruction. The fixed multipler intermediate instruction forces a zero into the ALU carry in.

Figure 69:
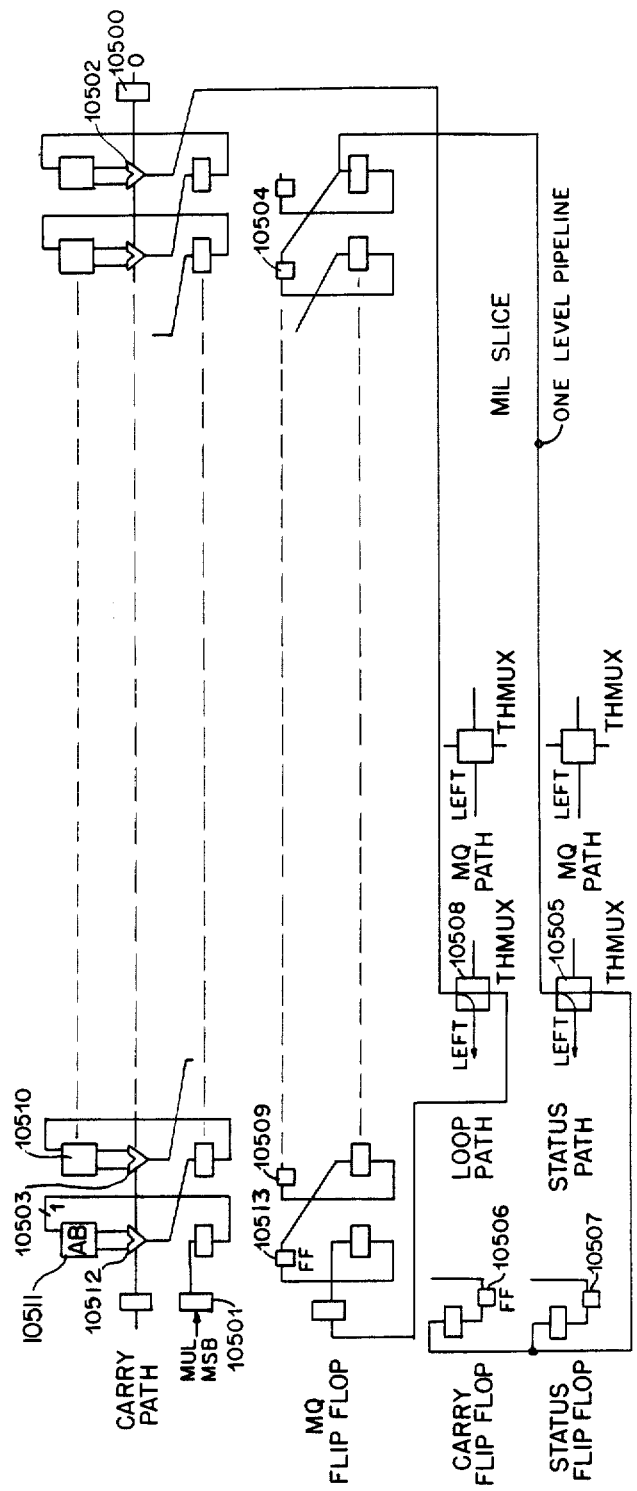
FIG. 69 is a block diagram showing a fixed multiply intermediate (short) data paths.

FIG. 69 shows fixed multiply intermediate short. The second least significant bit of MQ as 10,504 is passed through the status path multiplexer 10,505 and is stored in the status flip flop 10,507 and the carry flip flop 10,506. The most significant bit of MQ 10,513 is shifted to the right to the next least significant bit 10,509. The most significant bit of the ALU 10,512 is shifted 1 bit to the right for storage at the second most significant bit in the MPR 10,510. The output from the least significant bit of the ALU 10,502 is passed through the loop path multiplexer 10,508 and entered into the most significant bit of MQ 10,513. A zero is forced into the ALU carry path through multiplexer 10,500.

Figure 70:
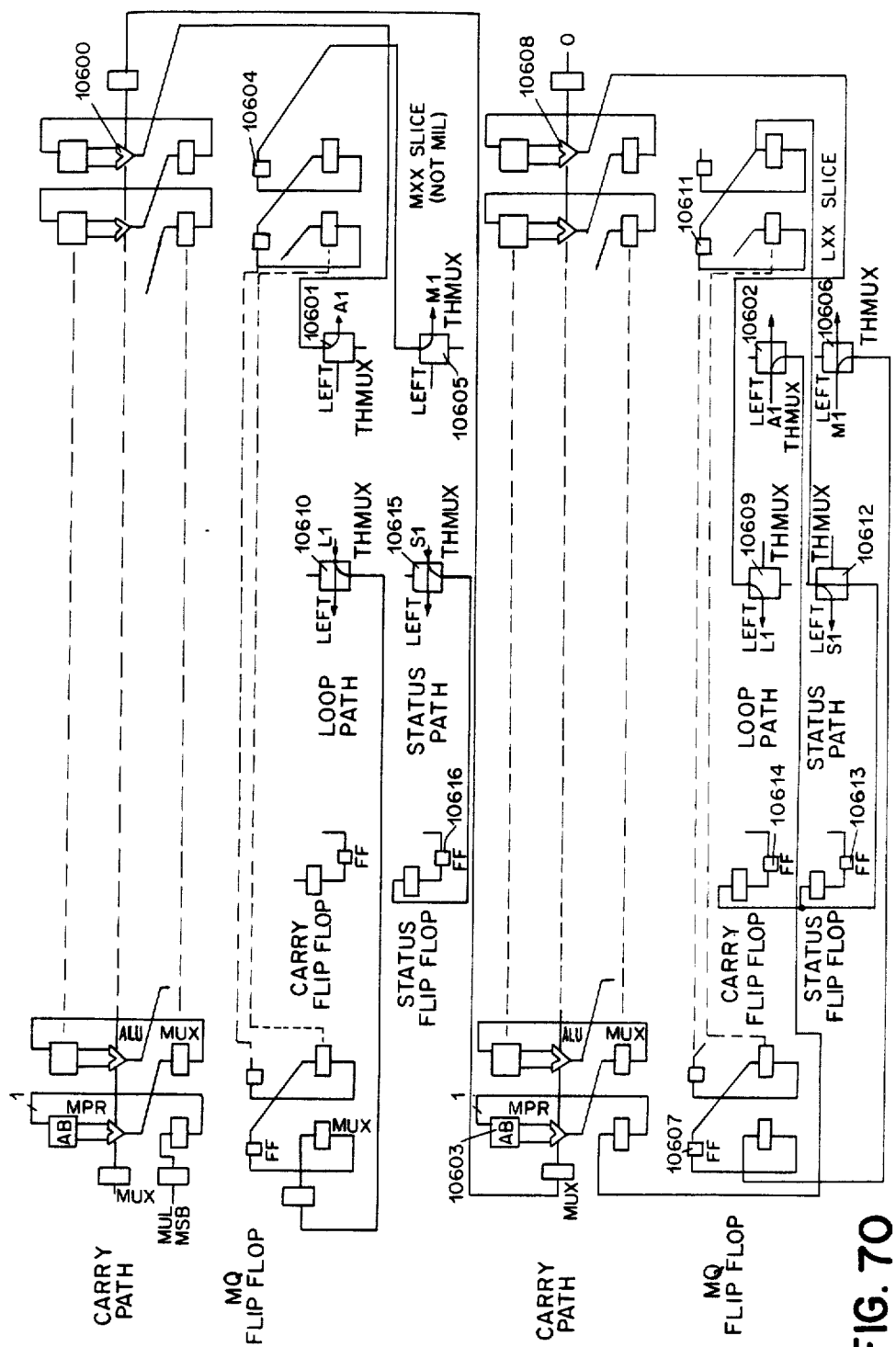
FIG. 70 is a block diagram showing a fixed multiply intermediate (long) data paths.

FIG. 70 shows fixed multiply intermediate long which is the same as for the previous example except that an arbitrary word size may be supported by connecting adjacent slices through the path multiplexers. In this case, the output of the least significant bit of the ALU 10,600 in the more significant slice is passed through the ALU multiplexer 10,601 to the next less significant slice which is received by the ALU multiplexer 10,602 and entered into the most significant bit of the multiport RAM slice 10,603. Likewise, the least significant bit of MQ in the more significant slice as 10,604 is passed through MQ multiplexer 10,605 to the next slice to the right which is received by the MQ multiplexer 10,606 where it is entered into the most significant bit of MQ and that slice 10,607. A zero is forced into the least significant bit of ALU carry path 10,608. The least significant bit of MQ 10,611 is passed through the status path multipexer 10,612 to the status flip flop and carry flip flop in that slice 10,613 and 10,614 and passed on to all more significant slices as through status multiplexer 10,615 for storage in status flip flop 10,616.

Figure 71:
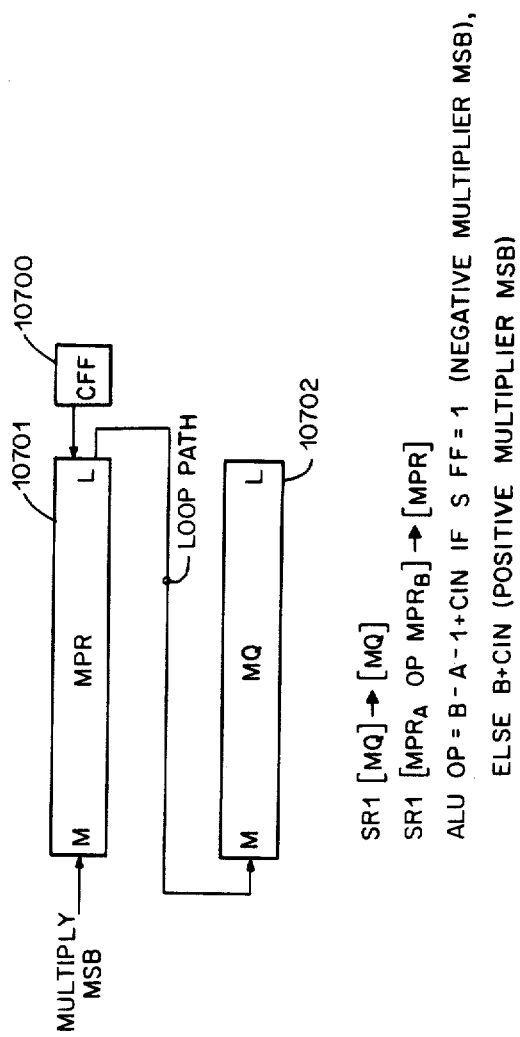
FIG. 71 is a block diagram showing a fixed multiply last path overview.

FIG. 71 shows fixed multiply last path overview. In twos complement arithmetic, the most significant bit is defined as negative weight and a fixed multiply last instruction would be used to produce the last bit of the product. For unsigned arithmetic the fixed multiply intermediate instruction would be used. For the fixed multiply last, the carry flip flop 10,700 would be input to the ALU for the MPR version 10,701. The ALU output of the MPR is again shifted right by 1 bit for entry into the MQ 10,702. If the multiplier was negative, in which case the status flip flop was true, the ALU would substract a partial product rather than add it in as in the case of fixed multiply intermediate. As a consequence, the carry in is significant which is why it was produced by the fixed multiply intermediate instruction.

Figure 72:
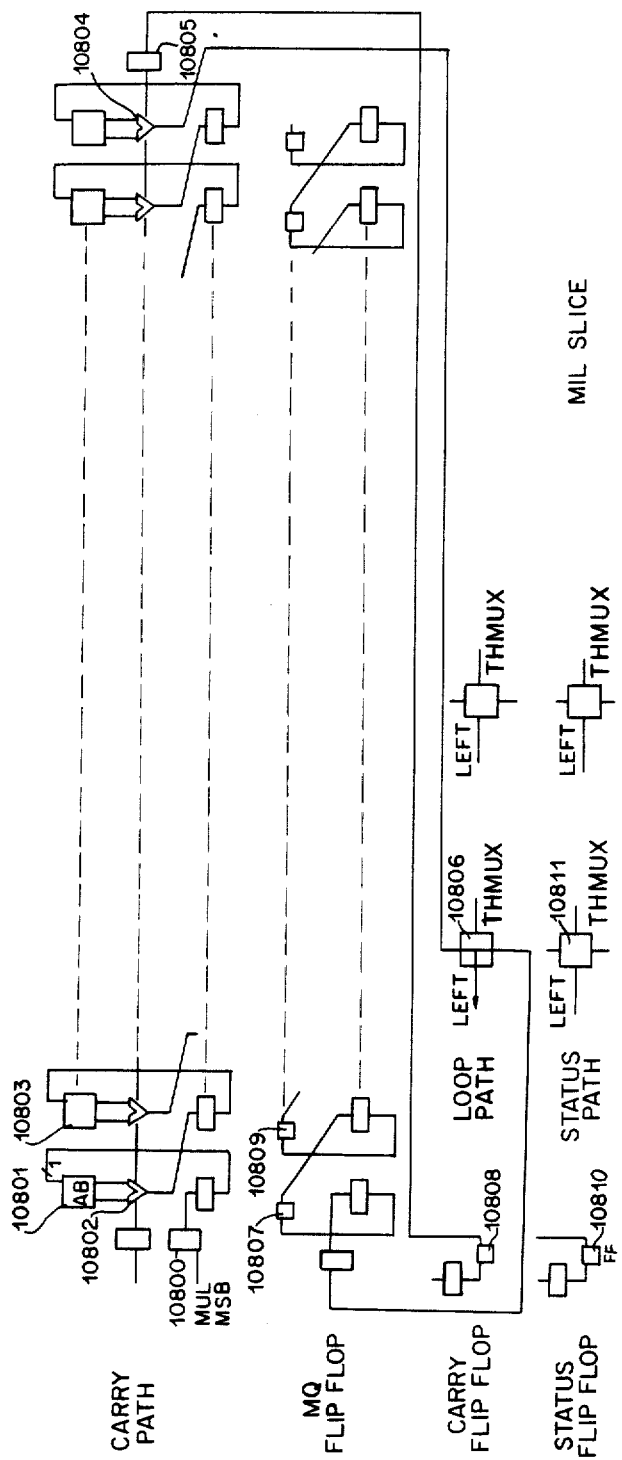
FIG. 72 is a block diagram showing a fixed multiply last (short) data paths.

FIG. 72 shows the fixed multipler last short path operation. The operation is exactly the same as for fixed multiply intermediate except that the carry flip flop 10,808 is passed through the carry in multiplexer 10,805 for use by the least significant bit of ALU to be used by all bits of ALU as is the least significant bit 10,804. Since this is the last cycle, it is no longer necessary to use the status pass multiplexer 10,811 to load the status flip flop 10,810.

Figure 73:
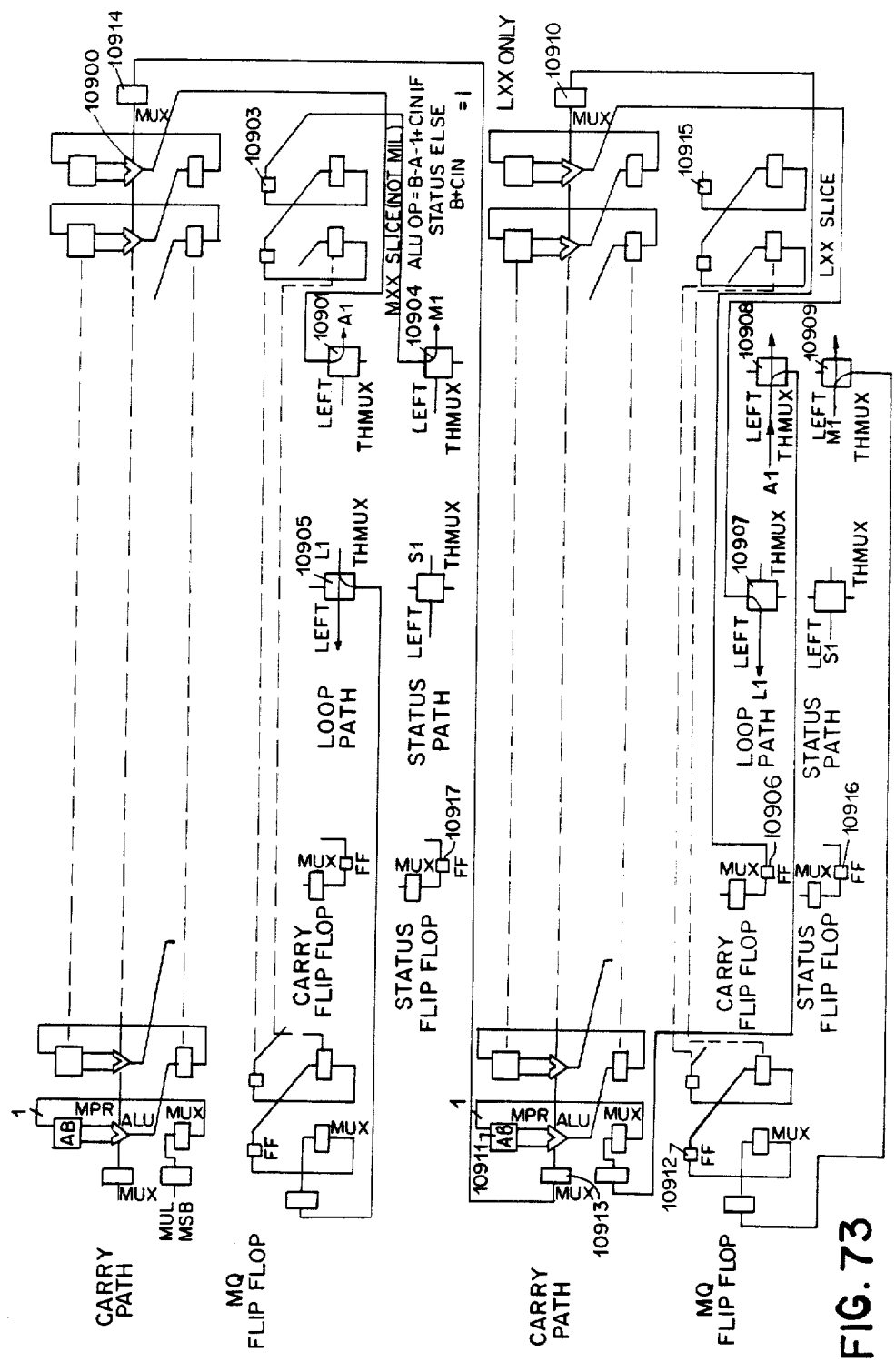
FIG. 73 is a block diagram showing a fixed multiply last (long) data paths.

FIG. 73 shows the fix multiply last long instruction which is analogous to the short operation except that the connection between adjacent slices is provided by the arithmetic path. In this case the least significant bit of the ALU 10,900 in the more significant slice is passed through the ALU multiplexers 10,901 and passed on to the next less significant slice where it is received by the ALU path multiplexer 10,908 and passed into the least significant of the multiport RAM 10,911. Likewise the least significant bit 10,903 and the more significant slice is passed through the MQ multiplexers 10,904 on the next less significant slice and received by the MQ multiplexer 10,909 for entry into the more significant bit of MQ 10,912 in that slice.

The carry flip flop 10,936 as the least significant slice is passed into the chain change through carry input multiplexer 10,910. In addition the carry path is completed between bits and slices through carry multiplexers 10,913 and 10,914. The least significant bit of MQ 10,915 is lost because it was captured during the previous cycle by the status flip flop as 10,916 and 10,917.

Figure 74:
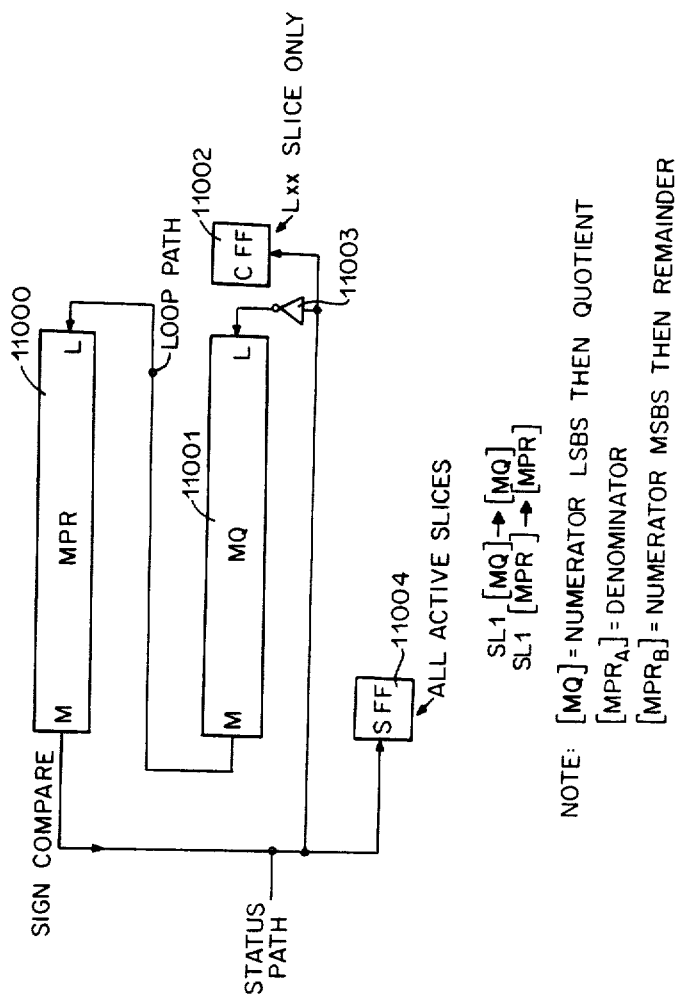
FIG. 74 is a block diagram showing a fixed divide first path overview.

FIG. 74 shows the fixed divide first path overview. The algorithm implemented is a non-restoring divide and is well known in the art and is described in *ADVANCE MICRO DEVICES BIPOLAR DATA BOOK*, 1983, pages 6–60 to 6–65. The MQ is loaded with the numerator LSB which will be shifted into the MPR. Also the MQ will hold a quotient, the sign compare output from the most significant slice of the multiport RAM as 11,000 as defined in FIG. 30 and is passed through the status path to all status flip flops as 11,004 to carry flip flop 11,002 in the least significant bit of MQ 11,001 to inverter 11,003.

Figure 75:
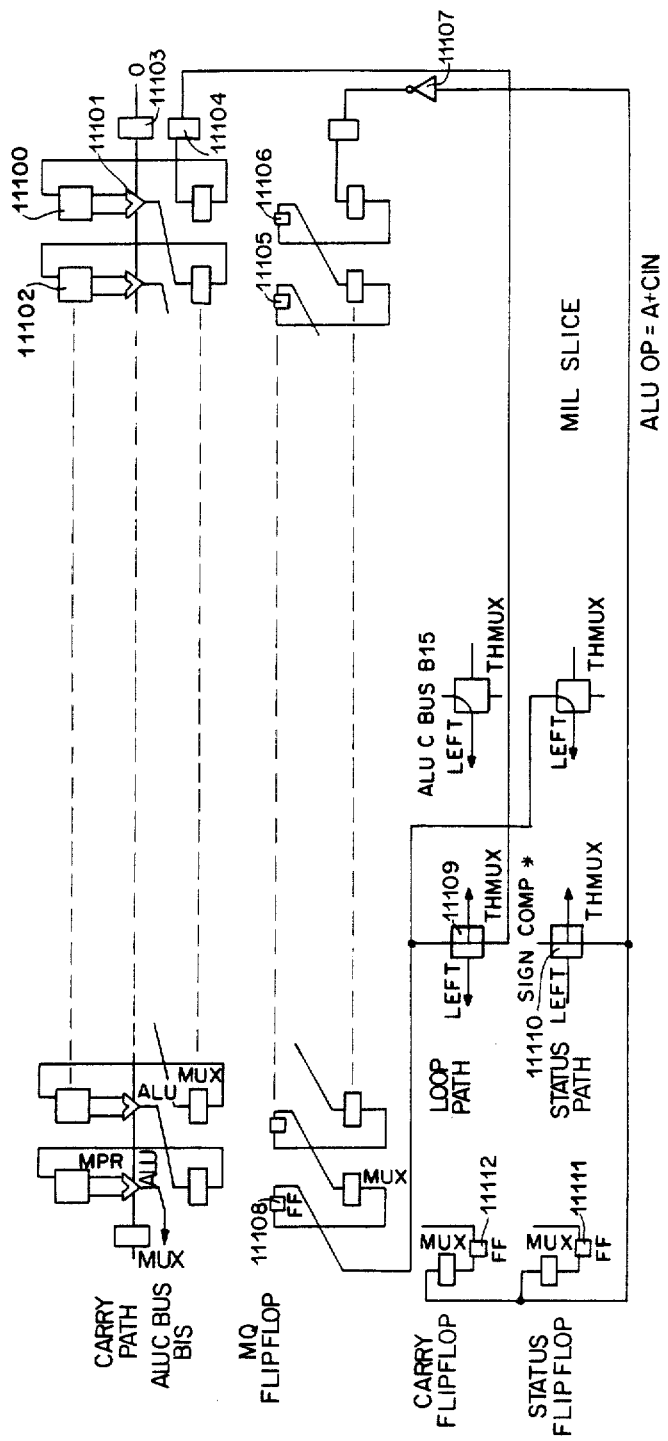
FIG. 75 is a block diagram showing a fixed divide first (short) data paths.

FIG. 75 shows the fixed divide first short operation in detail. The ALU operation is A+CIN where the carry in of zero is forced by multiplexer of 11,103 so that the content of the MPR is shifted by one bit as MPR 11,100 is passed through the ALU 11,101 and to the next most significant bit of the MPR as 11,102. The most significant bit of MQ 11,108 is passed through the loop multiplexer 11,109 where it is entered through multiplexer 11,104 into the least significant bit of MPR 11,100. Sign compare is entered into status multiplexer 11,110 where it is passed to the status flip flop 11,111 and the carry flip flop 11,112 and is passed through inverter 11,107 into the least significant bit of MQ 11,106. In addition MQ is shifted left 1 bit as MQ bit 11,106 is loaded into MQ 11,105. Note that in the AMD Data Book sign compare is defined slightly differently from the way it is defined in these figures. The Data Book defines sign compare at the output of a one bit delay, whereas these figures define it as the input to the 1 bit delay, although the logical operation to compute the sign compare is the same.

Figure 76:
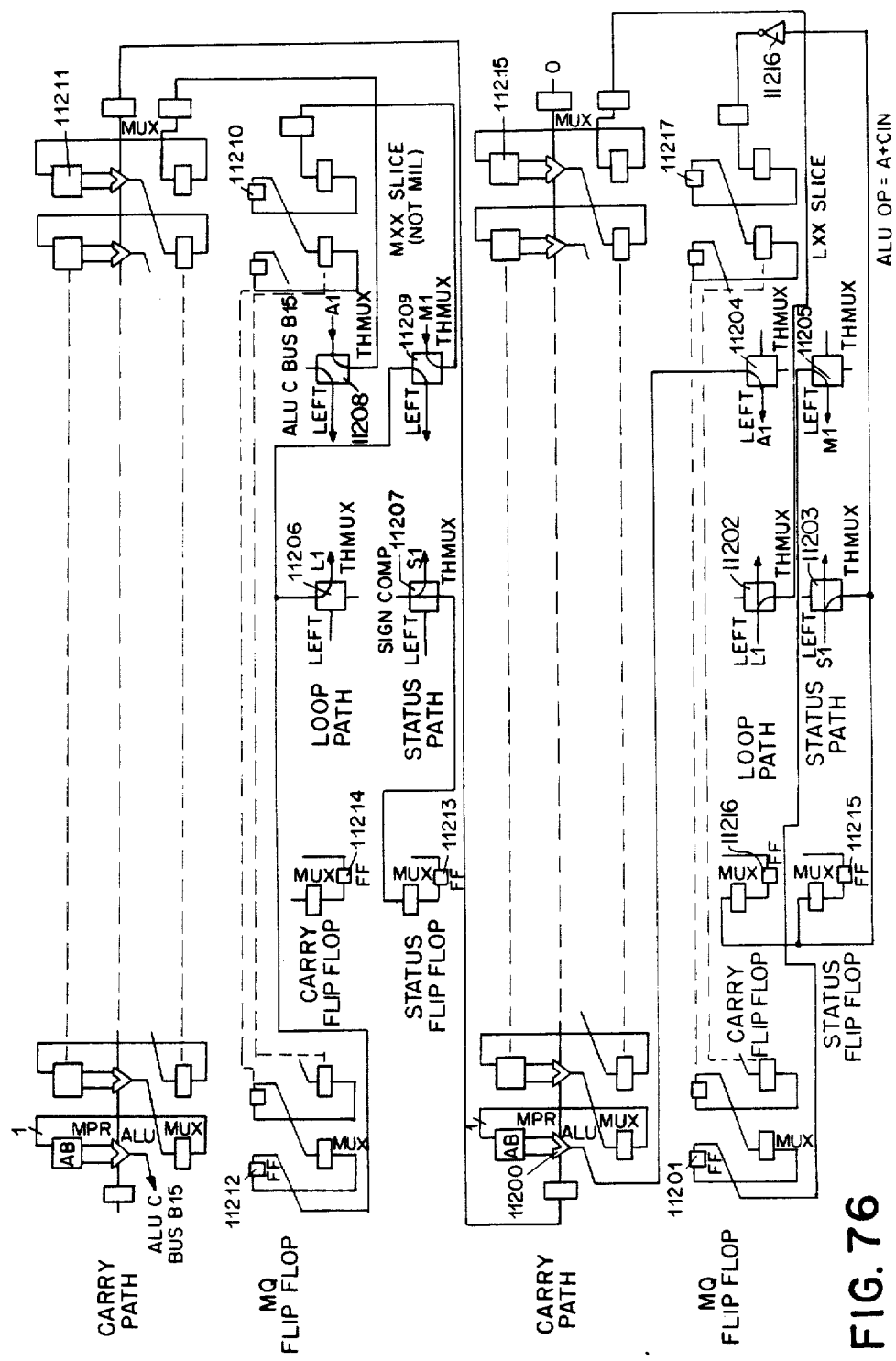
FIG. 76 is a block diagram showing a fixed divide first (long) data paths.

FIG. 76 shows fixed divide first long operation which may be performed for any word size. The differences from the operation of the single slice are as follows. The most significant ALU bit is 11,200 in the lesser significant slice is passed through the ALU multiplexer 11,204 where it is received by the ALU multiplex 11,208 in the next most significant slice and is stored in the least significant bit of the MPR 11,211 in that slice. Likewise, the output of the most significant bit of MQ is 11,201 is passed through the MQ multiplexer 11,205 to the next most significant slice where it is received by MQ multiplexer as 11,209 entered into the least significant bit of MQ 11,210. The most significant bit of MQ 11,212 is passed to the right through loop multiplex 11,206 where it is received by the next least significant slice as loop multiplex 11,202 for entry into the least significant bit of the MPR as 11,215.

Since the loop must be closed between the most significant bit of MQ and the least significant bit of the MPR, then the loop path would simply transverse all intermediate significant slices being unmodified by them. Likewise the sign compare is entered into the status multiplexers and stored in all status flip flops as 11,213 and 11,215 is passed through all intermediate signficant slices without being modified until received by the least significant slice as 11,203 where it passes through an inverter 11,216 for storage in the least significant bit of MQ 11,217.

Connections between adjacent slices as from ALU bit 11,200 to multiplex 11,204 is passed on to the next bit of ALU for multiplexer 11,208 stored in the MPR bit 11,211. Likewise the MQ is shifted as through MQ bit 11,201 through multiplex 11,205 being received by the next MQ multiplexers 11,209 for entry into the MQ LSB as 11,210. The MQ multiplexer 11,209 shows the operation at the most significant slice wherein the right hand side is passed on to the left hand side for testability purposes.

Figure 77:
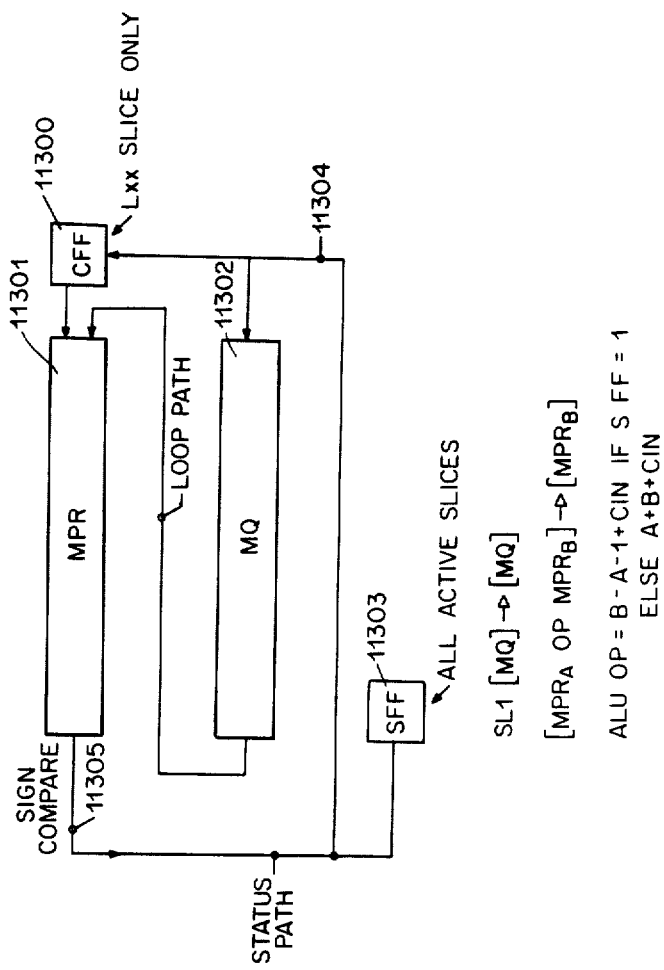
FIG. 77 is a block diagram showing a fixed divide intermediate path overview.

FIG. 77 shows the fixed divide intermediate path overview. This step is executed for N−1 cycles where N is the word length. The carry flip flop 11,300 in the least significant slice is used by the MPR carry in. The sign compare output 11,305 is passed through the status path to all status flip flops in a word as 11,303 and is entered as the least significant bit of the quotient into MQ 11,302 and stored into the carry flip flop 11,300. The ALU operation will be either an add or substract depending on the status flip flop which reflects the sign compare at the most significant bit. The ALU will either subtract the denominator from the partial remainder if the partial remainder is positive, otherwise the denominator will be added to the partial remainder if the sign of the partial numerator is negative.

Figure 78:
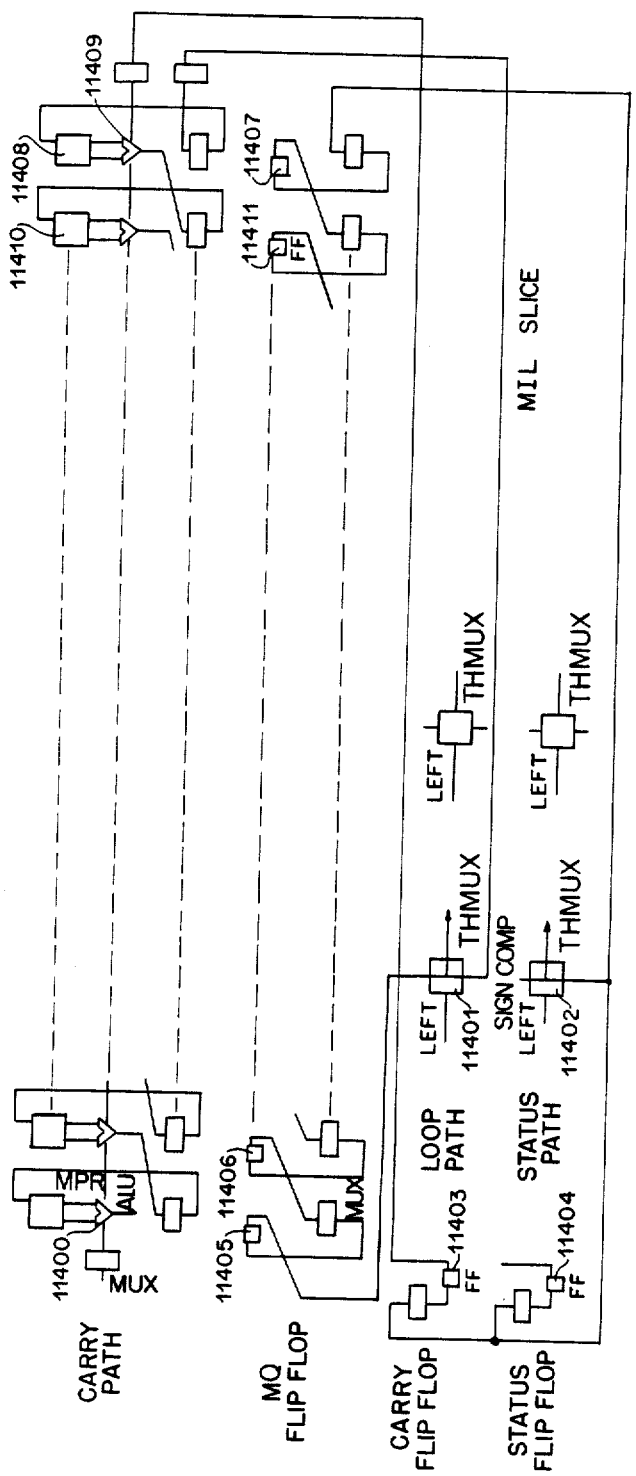
FIG. 78 is a block diagram showing a fixed divide intermediate (short) data paths.

FIG. 78 shows the fixed divide intermediate short. The output of the most significant bit of ALU 11,400 goes no where directly but is captured in the sign compare output which passes through the status multiplexer 11,402 into the status flip flop 11,404 and carry flip flop 11,403 as well as the least significant bit of MQ 11,407. The output for the least significant bit of 11,409 is shifted 1 bit ot the left and stores in the next most significant bit of the MPR 11,410. Likewise the least significant bit of MQ 11,407 is shifted 1 bit to the left and stored in the next most significant bit of MQ 11,411. The most significant bit of MQ 11,405 is passed to the loop multiplexer 11,401 into the least significant bit of the MPR 11,408.

Figure 79:
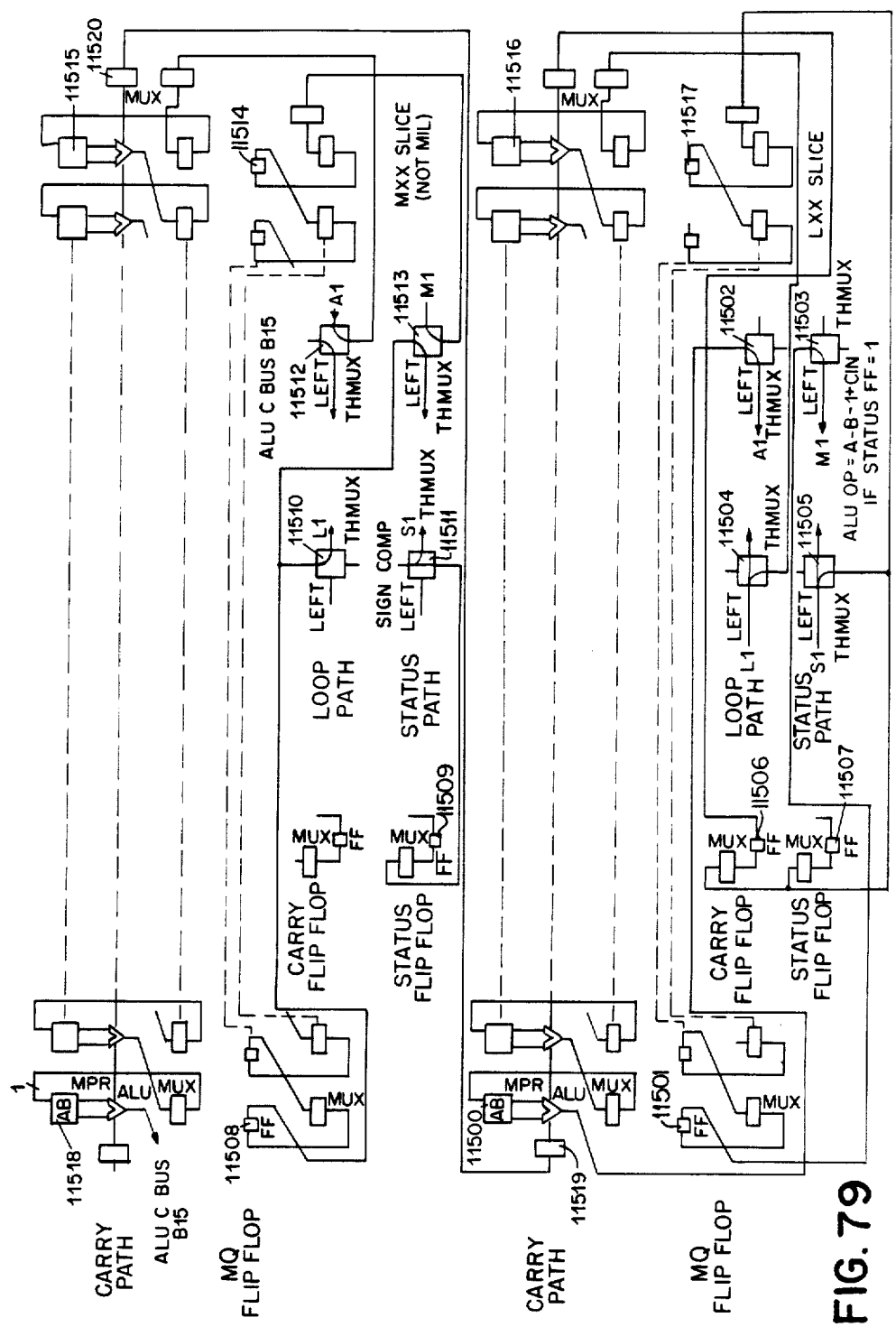
FIG. 79 is a block diagram showing a fixed divide intermediate (long) data paths.

FIG. 79 shows fixed divide intermediate long which again demonstrates how adjacent slices are connected to each other and demonstrates how the most significant bit of MQ 11,508 is passed to the loop multiplexer 11,510. It would pass through all intermediate slice loop paths eventually arriving at loop path of the least significant slice 11,504 where it is passed onto the least significant bit MPR 11,516. Likewise, the sign compare output from the most significant bit of MPR 11,518 is passed through the status multiplexer 11,511 where it is stored in all status flip flop 11,509 and 11,507 and in the least significant slice in the carry flip flop 11,506 and entered into the least significant bit of MQ 11,517.

Connections between the inner edges of adjacent slices as from the ALU 11,500 to the next most significant bit of the MPR 11,515 is accomplished through the carry multiplexers 11,519 and 11,520. Similarly, the most significant bit of MQ 11,501 and lesser significant slice is passed through the MQ path multiplexer 11,503 into the next most significant path multiplexer as 11,513 for entry into the least significant bit of MQ of that slice 11,514.

In addition the output of the ALU multiplexer 11,500 at the lesser significant slice is passed through the ALU 11,502 on to the next most significant slice where it is received by the ALU multiplexer 11,512 for entry into the least significant bit of the MPR 11,515. At the most significant slice, the ALU path multiplexer passes the ALU C bus B15 signal on to the left for testability purposes and the MQ multiplexer 11,513 does likewise for MQ flip flop 11,508.

Figure 80:
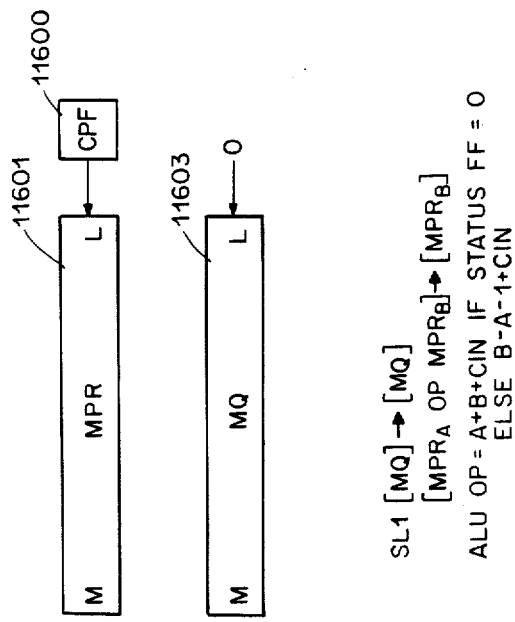
FIG. 80 is block diagram showing a fixed divide last path overview.

FIG. 80 shows the fixed divide last path overview. This step fixes the sign of the remainder which is held in the MPR and closes the 1 bit gap in the MQ. The MPR 11,601 with carry input from the carry flip flop 11,600 performs an addition if the status flip flop is false, or a subtraction if the status flip flop is true. MQ shifts left by one bit, entering a zero into the 1sb.

Figure 81:
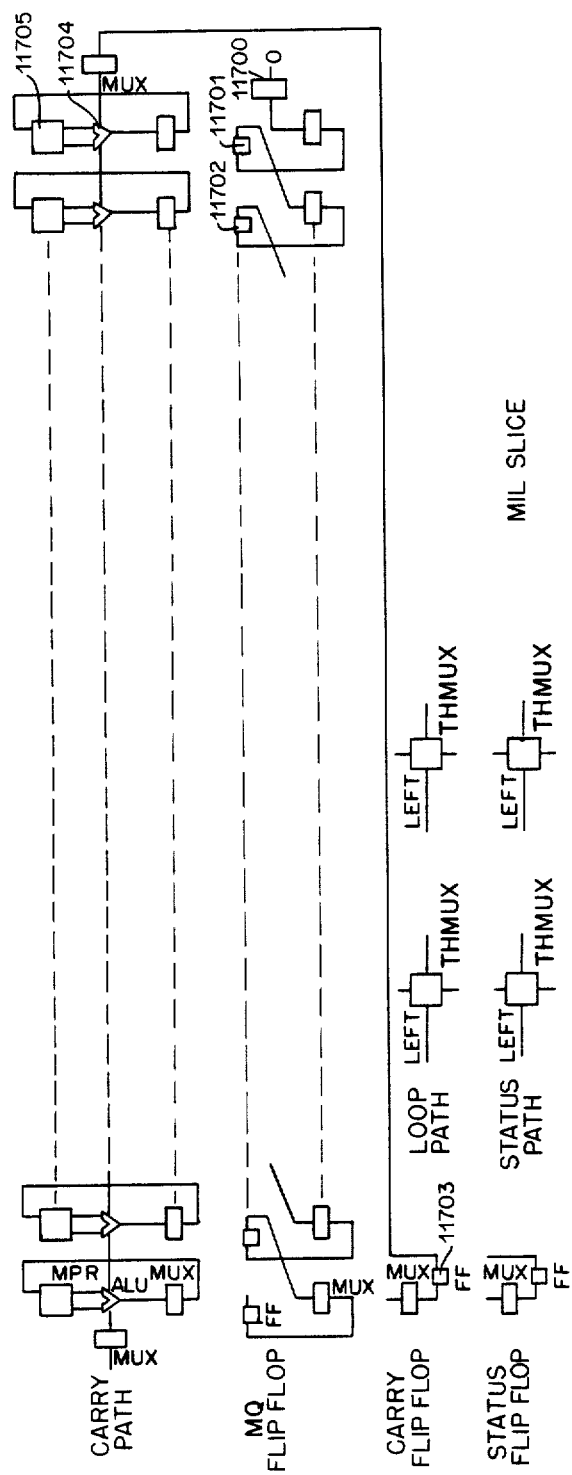
FIG. 81 is a block diagram showing a fixed divide last (short) data path.

FIG. 81 shows the path operation for the Fixed Divide Last (short) operation for the MIL slice. The carry flip flop 11,703 is passed to the 1sb of the ALU 11,704, whose result is stored in the 1sb of the MPR 11,705. A zero is passed through multiplexer 11,700 for storage in the 1sb of MQ 11,701 whose output is shifted one bit to the left to MQ flip flop 11,702.

Figure 82:
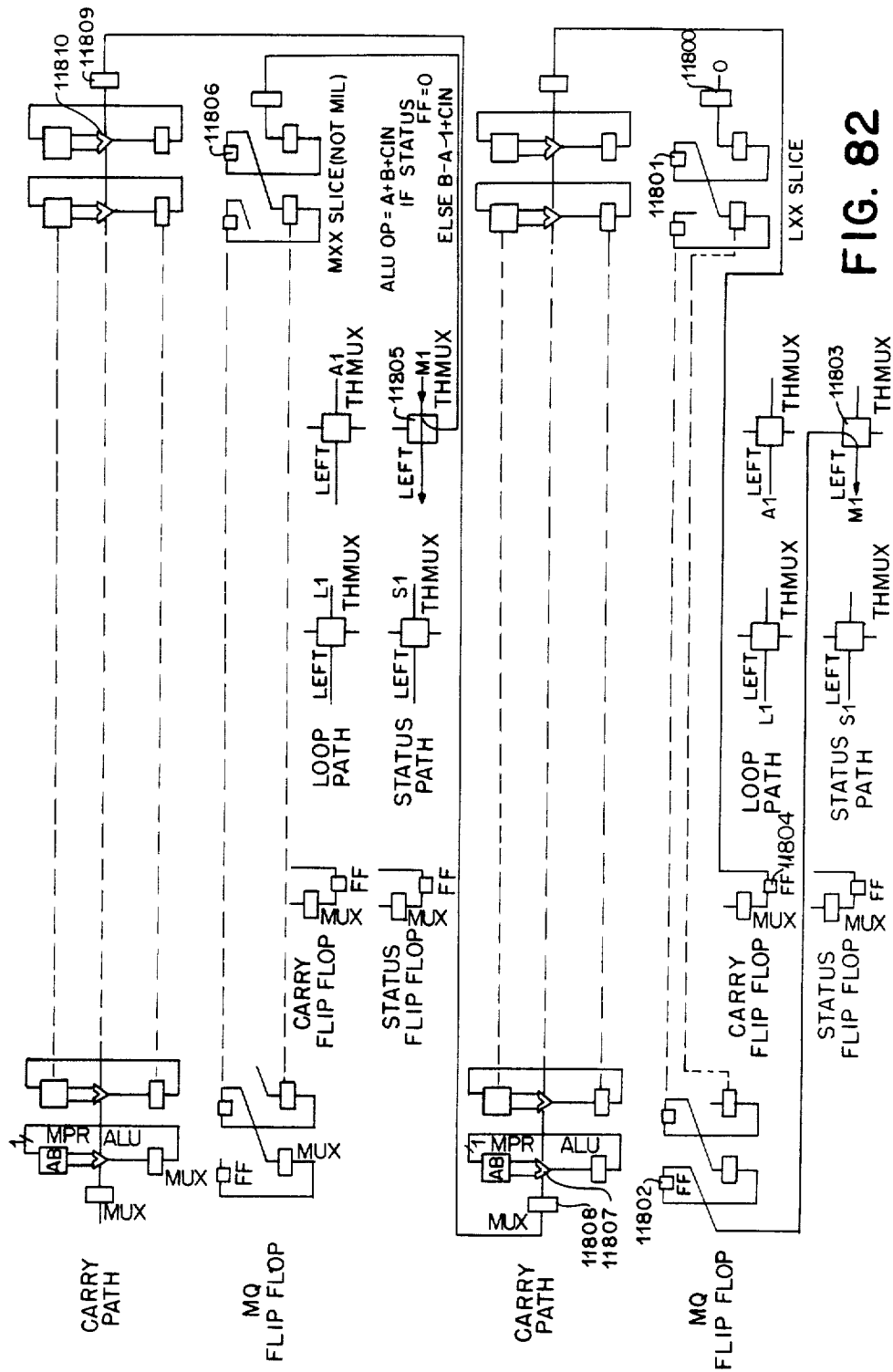
FIG. 82 is a block diagram showing a fixed divide last (long) data path.

FIG. 82 shows the path operation for Fixed Divide Last (long). The msb of MQ 11,802 in the least significant slice is passed through the MQ path multiplexer 11,803 where it is received by the next most significant bit multiplexer 11,805 for entry into the least significant bit 11,806 of MQ in that slice.

In the most significant slice, the MQ multiplexer 11,805 would pass the right onto the left for testability. In addition the carry path is continuous between adjacent bits of the ALU as 11,807 and 11,810 through the carry-path multiplexers 11,808 and 11,809.

Figure 83:
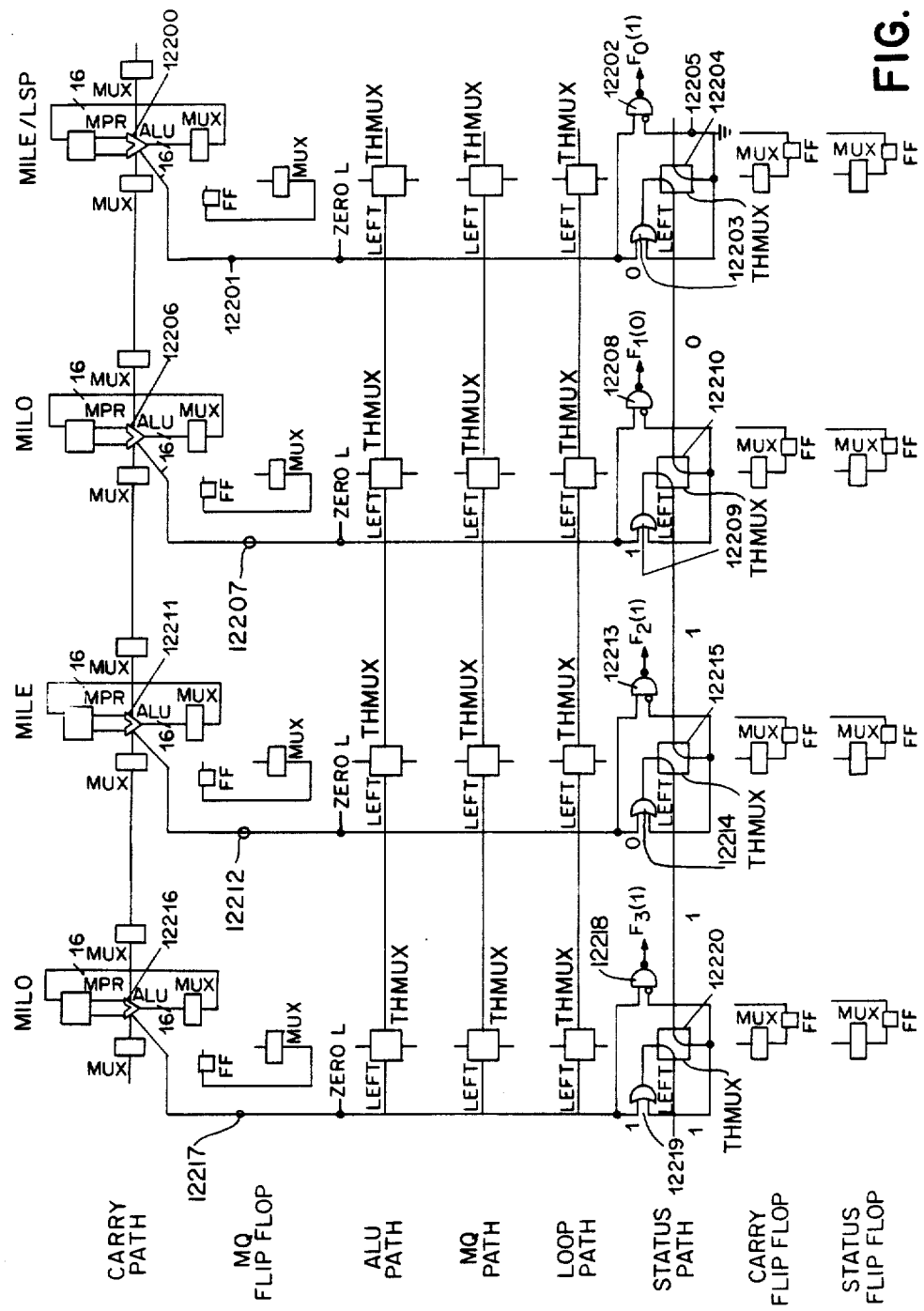
FIG. 83 is a block diagram showing a find path usage.

FIG. 83 shows the find path usage. Four slices are shown, each configured as a 16-bit processor by setting the configuration masks to the MIL state. In addition, the right most processor associated with the ALU 12,200 is set to the LSP or least significant processor state while the other three processors are set to the IMSP or intermediate most significant processor state. Each of the processors perform some arithmetic or Boolean operation and the status flip flops are loaded. Then the PUSH/IF instructon is executed, loading the VIE register. Based upon the VIE register, the zero left line of each processor will be true if the processor is enabled or flase if the processor is not enabled. This example assumes that any two of the processors are still active, namely, the processors associated with the ALU 12,206 and ALU 12,216.

The find operation is a serial processor across processors beginning with the least significant processor. In this case OR gate 12,203 and NAND gate with inverting input 12,202 receives a zero rather than the status right connection. Since the zero left lie in this processor is not asserted, a zero is produced at the output of OR gate 12,203 and this is passed to multiplexer 12,210 in the next processor. NAND gate 12,208 produces a one at the output since the zero left signal at 12,207 is true and the status right input is false. OR gate 12,209 passes on the true condition of the processors at the left being received by OR gates 12,214 and 12,219. NAND gate 12,213 thus produces a false at the output since the incoming status line is true, as does NAND gate 12,218 since its incoming status line is also true. Therefore, zeros are produced at NAND gates 12,202, 12,213 and 12,218 and a single true is produced at 12,208.

These states are pushed by the FIND operation into the VIE register in the system portion of the multiport RAM. At that point, only the processor where the first one was found will remain enabled.

FIG. 85 lists the special instructions used in the array chip. These instructons are used to initialize and test the chip (RECON and CONFIG) and to control the Vector IF/ELSE mechanism. The detailed operation of the Vector IF/ELSE instruction is explained in FIG. 86.

Figure 84:
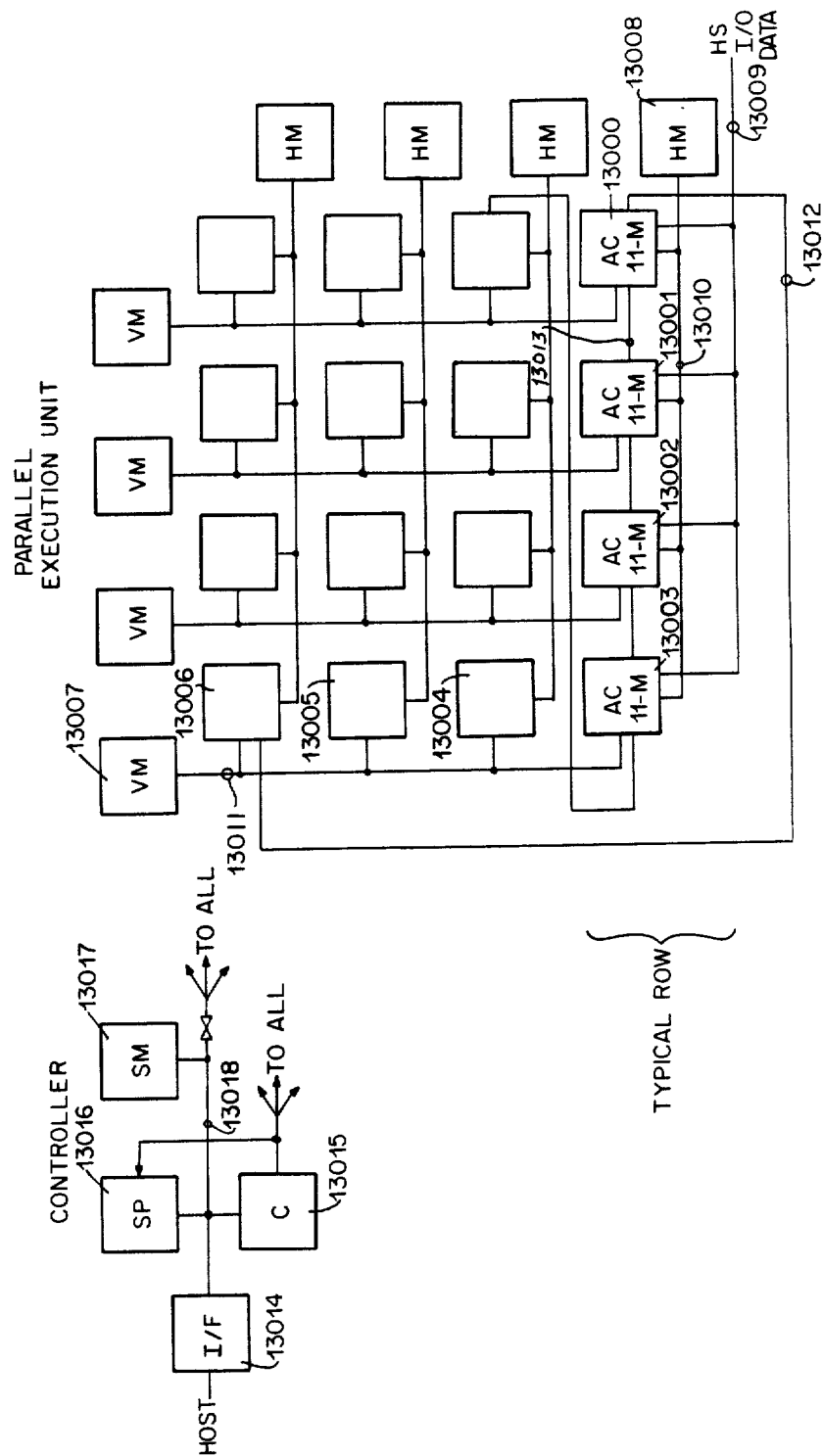
FIG. 84 is a block diagram showing a cellular processor array with a controller.

FIG. 84 shows a cellular processor array with controller. The key elements of this processor array are the 4 by 4 matrix of array chips, numbers 13,000 to 13,006 which shows a row as 13,000 through 13,003 and a column as 13,003 through 13,006. The array chips in a column are connected by a vertical bus as 13,011 to a vertical memory as 13,007. The cells in these array chips share this vertical memory on a time division multiplex basis, first between the chips and then between the cells within a given chip. Likewise a row, as 13,000 through 13,003 shares the horizontal memory as 13,008 again on a time division multiplex basis, first between the chips of the row and then between the cells within a chip. The X bus would typically be connected to the horizontal memory and the Y bus is typically connected to the vertical memory. Connections between adjacent chips are made by the left/right connections as 13,013 and the right side or lower right array chip 13,000 is connected by 13,012 to chip 13,006 which is the upper left most chip in the array.

A high speed I/O bus 13,009 is provided to each row communicating parallel with the chips in that row as 13,000 through 13,003. This array of chips, horizontal memories and vertical memories is under control of the controller and comprised principally of the C block 13,015 which broadcasts micro-instructions to all of the array chips. These micro-instructions are broadcast from the I bus. The controller receives macro-level instructions from the system memory 13,017 and the system memory bus 13,018 may be broadcast to all array chips on the array chip C bus. The controller communicates with the host via the interface 13,014. The host provides program storage as well as operator interface.

Typical usage of this system would be for example an image processing program that is loaded from the host via the interface via the common bus 13,018 into the system's memory 13,017. From there the controller 13,015 fetches instructions and commands high speed I/O devices such as a TV camera to load information into the array chips via the high speed I/O bus as 13,009. When the data is emplaced in the memories of the array chip, the image would be compressed or features might be recognized. At that point the processed data would be transmitted out the high speed I/O bus to a display device as a monitor.

What is claimed is:

1. In a cellular array of a type employing a plurality of processors arranged in a matrix of rows and columns wherein each processor in said matrix can communicate with other processors to the left and right and up and down in horizontal and vertical directions of the matrix to perform arithmetic operations, an improvement therewith comprising:

a plurality N of said processors each configured to operate on words J bits wide, said plurality of N processors being arranged in one row, wherein N is a positive integer greater than two;

a corresponding plurality N of separate memory means, wherein each said separate memory means has an address input and a data output, and is associated with and coupled to a respective one of said plurality of N processors, and wherein each said separate memory means stores and outputs data words J bits wide through its data output to its associated processor in response to an address provided through its address input;

address decoder means coupled to the address inputs of said plurality of N memory means, said address decoder means being operable to receive a global address provided thereto and to globally address said address inputs in parallel such that said memory means output data words in parallel to their associated processors;

an external bus interface accommodating data words at least 2J bits wide, and an external memory coupled to said external bus interface having a number of addressable word locations larger than that of said memory means;

a common bus accommodating data words at least 2J bits wide which is coupled to each of said plurality of N processors, to said external bus interface, and to said address decoder means for said plurality of N separate memory means; and a number P of at least two of said plurality of N processors being selected as an address generator for said one row of processors, said selected address-generating P processors each contributing data words J bits wide which are combined together to output a global address on said common bus P×J bits wide, and the other N-P processors of said plurality of N processors being selected to operate in parallel so as to process data output from said memory means of a combined width of (N-P)×J bits;

wherein said P processors selected as said address generator to generate said global address on said common bus are used to address said memory means in parallel through said address decoder means and cause said memory means simultaneously to provide data of combined width of (N-P)×J bits to their associated (N-P) processors in said one row, as well as to address a larger capacity of external memory of up to $2^{P\times J}$ word locations through said address $P\times J$ bits wide provided on said common bus to said external bus interface.

2. The cellular array according to claim 1, wherein each said separate memory means is a Dynamic Random Access Memory (DRAM).

3. The cellular array according to claim 1, wherein said at least two processors used as said address generator are adjacent in said row.

4. The cellular array according to claim 1, wherein each processor includes logic means for storing therein address data for determining which processors in said row are used as said address generator.

5. The cellular array according to claim 4, wherein any two of said plurality of processors in said row can be used as said address generator with other processors in said row operative to perform arithmetic operations.

6. The cellular array according to claim 4, wherein said logic means includes a multiport RAM.

7. The cellular array according to claim 1, further including external bus interface means coupled to said bus for transferring external data to said address generating processors.

8. The cellular array according to claim 1, wherein said address decoder means includes a row decoder coupled to each of said address inputs of said plurality of N separate memory means to address a selected row memory location in each of said separate memory means by employing a first subset number of bits of said address $P\times J$ bits wide provided on said common bus.

9. The cellular array according to claim 8, wherein said address decoder means further includes a column decoder coupled to each of said address inputs of said plurality of separate memory means to address a selected column memory location in each of said separate memory means by employing a second subset number of bits of said address $P\times J$ bits wide provided on said common bus.

10. The cellular array according to claim 1, wherein each of the processors of said one row includes bypass means for disabling said processor in order to bypass said processor from operation in said one row of processors if it is determined to be defective.

11. The cellular array according to claim 1, wherein each of the processors in said one row operates on words 16 bits wide, each of said memory means correspondingly stores and outputs words 16 bits wide to their associated processors, and said common bus accommodates 32 bits of data.

12. The cellular array according to claim 11, wherein said one row includes 20 processors, and two of the 20 processors in said one row are selected as the address generator to generate an address 32 bits wide, 16 of the 20 processors are selected to operate on data of a combined total width of 256 bits, and two of the 20 processors are selected to be bypassed from operation.

* * * * *

UNITED STATES PATENT AND TRADEMARK OFFICE
CERTIFICATE OF CORRECTION

PATENT NO. : 4,835,729
DATED : May 30, 1989
INVENTOR(S) : Steven G. Morton

It is certified that error appears in the above-identified patent and that said Letters Patent is hereby corrected as shown below:

On the title page containing the ABSTRACT, first column, information in item [73] should read:

"Assignee: ITT Corporation, New York, N.Y."

Signed and Sealed this

Twenty-first Day of January, 1992

Attest:

HARRY F. MANBECK, JR.

*Attesting Officer*  *Commissioner of Patents and Trademarks*